(12) United States Patent
Kim et al.

(10) Patent No.: US 9,960,039 B2
(45) Date of Patent: May 1, 2018

(54) METHOD OF FORMING PATTERN AND METHOD OF MANUFACTURING INTEGRATED CIRCUIT DEVICE BY USING THE SAME

(71) Applicant: SAMSUNG ELECTRONICS CO., LTD., Suwon-si, Gyeonggi-do (KR)

(72) Inventors: Dae-Ik Kim, Hwaseong-si (KR);
Eun-Jung Kim, Daegu (KR);
Yoo-Sang Hwang, Suwon-si (KR);
Bong-Soo Kim, Yongin-si (KR);
Je-Min Park, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 9 days.

(21) Appl. No.: 15/291,780

(22) Filed: Oct. 12, 2016

(65) Prior Publication Data
US 2017/0186613 A1    Jun. 29, 2017

(30) Foreign Application Priority Data
Dec. 24, 2015  (KR) .......................... 10-2015-0186780

(51) Int. Cl.
*H01L 21/302* (2006.01)
*H01L 21/033* (2006.01)
(Continued)

(52) U.S. Cl.
CPC ...... *H01L 21/0337* (2013.01); *H01L 21/0332* (2013.01); *H01L 21/0338* (2013.01);
(Continued)

(58) Field of Classification Search
CPC .......... H01L 21/0337; H01L 21/31144; H01L 21/76816; H01L 21/0332; H01L 21/0338; H01L 21/32139; H01L 21/3086
See application file for complete search history.

(56) References Cited

U.S. PATENT DOCUMENTS 8,012,881 B1   9/2011  Lee et al.
8,445,379 B2 *  5/2013  Park ................... H01L 21/0337
                                          257/E21.035
(Continued)

FOREIGN PATENT DOCUMENTS

| KR | 1020100134418 | 12/2010 |
|----|---------------|---------|
| KR | 1020120120666 | 11/2012 |
| KR | 1020120122707 | 11/2012 |

*Primary Examiner* — Savitr Mulpuri
(74) *Attorney, Agent, or Firm* — Volentine & Whitt, PLLC

(57) ABSTRACT

A method of forming a pattern includes forming a first level pattern layer on a feature layer on a substrate. The first level pattern layer includes a plurality of first line patterns and a plurality of first space burying patterns. The first line patterns extend parallel to one another in a first direction and the first space burying patterns extend parallel to one another in the first direction with first line patterns alternately disposed with first space burying patterns A portion of the plurality of first space burying patterns may be removed to form a second direction pattern space extending intermittently or continuously in the first level pattern layer. A second burying layer filling the second direction pattern space may be formed to form a network structure pattern. The feature layer may be etched with the network structure pattern as an etch mask to form a pattern of holes.

10 Claims, 150 Drawing Sheets

(51) Int. Cl.
  *H01L 21/311* (2006.01)
  *H01L 21/768* (2006.01)
  *H01L 21/308* (2006.01)
  *H01L 21/3213* (2006.01)

(52) U.S. Cl.
  CPC .... *H01L 21/3086* (2013.01); *H01L 21/31144* (2013.01); *H01L 21/32139* (2013.01); *H01L 21/76816* (2013.01)

(56) References Cited

U.S. PATENT DOCUMENTS

| | | | |
|---|---|---|---|
| 8,652,968 B2 | 2/2014 | Yu et al. | |
| 9,099,403 B2* | 8/2015 | Kim | H01L 21/0337 |
| 9,768,025 B2* | 9/2017 | Siew | H01L 21/0338 |
| 9,786,672 B2* | 10/2017 | Kim | H01L 27/10814 |
| 2007/0269916 A1 | 11/2007 | Kim et al. | |
| 2012/0009523 A1 | 1/2012 | Lee et al. | |
| 2015/0243518 A1 | 8/2015 | Devilliers | |

* cited by examiner

B – B'

C – C'

C - C'

B – B'

C – C'

B - B'

C – C'

B - B'

B − B'

C - C'

C - C'

B – B'

C – C'

B − B'

B – B'

B – B'

B – B'

B - B'

B - B'

B - B'

METHOD OF FORMING PATTERN AND METHOD OF MANUFACTURING INTEGRATED CIRCUIT DEVICE BY USING THE SAME

PRIORITY STATEMENT

This application claims the benefit of Korean Patent Application No. 10-2015-0186780, filed on Dec. 24, 2015, in the Korean Intellectual Property Office, the disclosure of which is hereby incorporated by reference in its entirety.

BACKGROUND

1. Field

The inventive concept relates to methods of forming patterns and to methods of manufacturing integrated circuit (IC) devices having patterns. The inventive concept also relates to a double patterning technique of forming patterns of a semiconductor device.

2. Description of the Related Art

The manufacturing of integrated circuits (ICs) entails the forming of various types of fine patterns, e.g., a series of openings or trenches in a layer, a series of conductive lines, etc. These patterns have what is referred to as critical dimensions (CD). A critical dimension (CD) is a dimension specified in the design process, such as the diameter of an opening, width of a line-shaped feature or pitch, i.e., an interval between adjacent ones of the features.

Pattern miniaturization is essential for manufacturing highly integrated semiconductor devices. To integrate a large number of devices within a narrow area, the sizes of the individual devices have to be as small as possible, and the pitch of the features and the width of a single feature also have to be small. However, with the rapidly reduced design rule of semiconductor devices and the limited resolution in photolithography processes, there is a limit to the critical dimension that can be attained in a pattern of a plurality of holes formed in a layer of the device. There have been various techniques developed aimed at forming a pattern of a plurality of holes with a small CD using a conventional photolithography processes but the resolution of conventional photolithography imposes a limit on scaling down a pattern of a plurality of holes. Thus, it remains difficult to manufacture highly integrated IC devices.

SUMMARY

According to an aspect of the inventive concept, a method of forming a pattern includes forming a first level pattern layer on a feature layer on a substrate, wherein the first level pattern layer has a plurality of first line patterns extending parallel to one another in a first direction and a plurality of first space burying patterns extending parallel to one another in the first direction, the first line patterns arranged alternately with the first space burying patterns, forming a second direction pattern space extending intermittently or continuously along a second direction intersecting the first direction in the first level pattern layer by removing a portion of the plurality of first space burying patterns from a second line pattern region extending along the second direction, forming a second burying film filling the second direction pattern space to thereby form a network structure pattern as a combination of the plurality of first line patterns and second burying film, removing a remaining portion of the plurality of first space burying patterns to expose a portion of the feature layer through the network structure pattern, and etching the feature layer with the network structure pattern as an etch mask to thereby form a feature pattern having a plurality of holes According to another aspect of the inventive concept, a method of forming a pattern includes forming a first level pattern layer on a feature layer on a substrate, wherein the first level pattern layer has a plurality of first line patterns extending parallel to one another in a first direction and a plurality of first space burying patterns extending parallel to one another in the first direction, the first line patterns being arranged alternately with the first space burying patterns, forming a second direction pattern space extending along a second direction intersecting the first direction by removing a portion of the plurality of first space burying patterns from a second line pattern region extending along the second direction, forming a second burying film filling the second direction pattern space to thereby form a network structure pattern as a combination of the plurality of first line patterns and the second burying film, and etching the feature layer with the network structure pattern as an etch mask.

According to still another aspect of the inventive concept, a method of manufacturing an integrated circuit device includes forming a mold layer on a substrate, forming a feature layer on the mold layer, forming a first level pattern layer on the feature layer, wherein the first level pattern layer has a plurality of first line patterns extending parallel to one another in a first direction and a plurality of first space burying patterns extending parallel to one another in the first direction, the first line patterns being arranged alternately with the first space burying patterns, forming a second direction pattern space along a second direction intersecting the first direction by removing a portion of the plurality of first space burying patterns from a second line pattern region extending along the second direction, forming a second burying film filling the second direction pattern space to thereby form a network structure pattern as a combination of the plurality of first line patterns and the second burying film, removing the plurality of first space burying patterns to expose the feature layer through the network structure pattern, etching the feature layer with the network structure pattern as an etch mask to form a pattern of features, etching the mold layer with the feature pattern as an etch mask to form a plurality of holes passing through the mold layer, and forming a plurality of electrodes in the plurality of holes.

According to still another aspect of the inventive concept, a method of manufacturing a semiconductor device includes forming a first level pattern layer on a feature layer, forming a 1-level mask, having the shape of a lattice and a substantially planar upper surface, from the first level pattern layer, and etching the feature layer using the 1-level mask as an etch mask to form an array of holes in the feature layer. The first pattern level layer has a first pattern of line features and a first pattern of space burying features. Each of the features extends linearly in a first direction so as to be parallel to one another, and the first space burying features are alternately disposed with the first line features along a second direction perpendicular to the first direction. The forming of the 1-level mask includes: selectively etching the first level pattern layer, wherein the selective etching comprises removing portions of the first space burying features along spaced apart parallel rows each extending lengthwise in a direction that is non-parallel to the first direction to thereby form spaces in the first level pattern layer, wherein each of the spaces extends through the first level pattern layer and exposes the feature layer, filling the spaces with second burying material having an etch selectivity with respect to the material of the first space burying features, and subsequently etching away portions of the first space burying features which had remained on the feature layer after the spaced apart rows of spaces were formed while leaving the spaces filled with the second burying material.

BRIEF DESCRIPTION OF THE DRAWINGS

These and/or other aspects will become apparent and more readily appreciated from the following description of examples of the inventive concept, taken in conjunction with the accompanying drawings in which:

FIGS. 5A to 17C are views for illustrating methods of forming patterns, according to examples of the inventive concept, wherein FIGS. 5A, 6A, . . . , and FIG. 17A sequentially illustrate plan views of methods of forming patterns, according to examples of the inventive concept.

FIGS. 18A to 30C are views for illustrating methods of forming patterns, according to examples of the inventive concept, wherein FIGS. 18A, 19A, . . . , and FIG. 30A sequentially illustrate plan views of methods of forming patterns, according to examples of the inventive concept.

FIGS. 31A to 46C are views for illustrating methods of forming patterns, according to examples of the inventive concept, wherein FIGS. 31A, 32A, . . . , and FIG. 46A sequentially illustrate plan views of methods of forming patterns, according to examples of the inventive concept.

DETAILED DESCRIPTION

Figure 1:
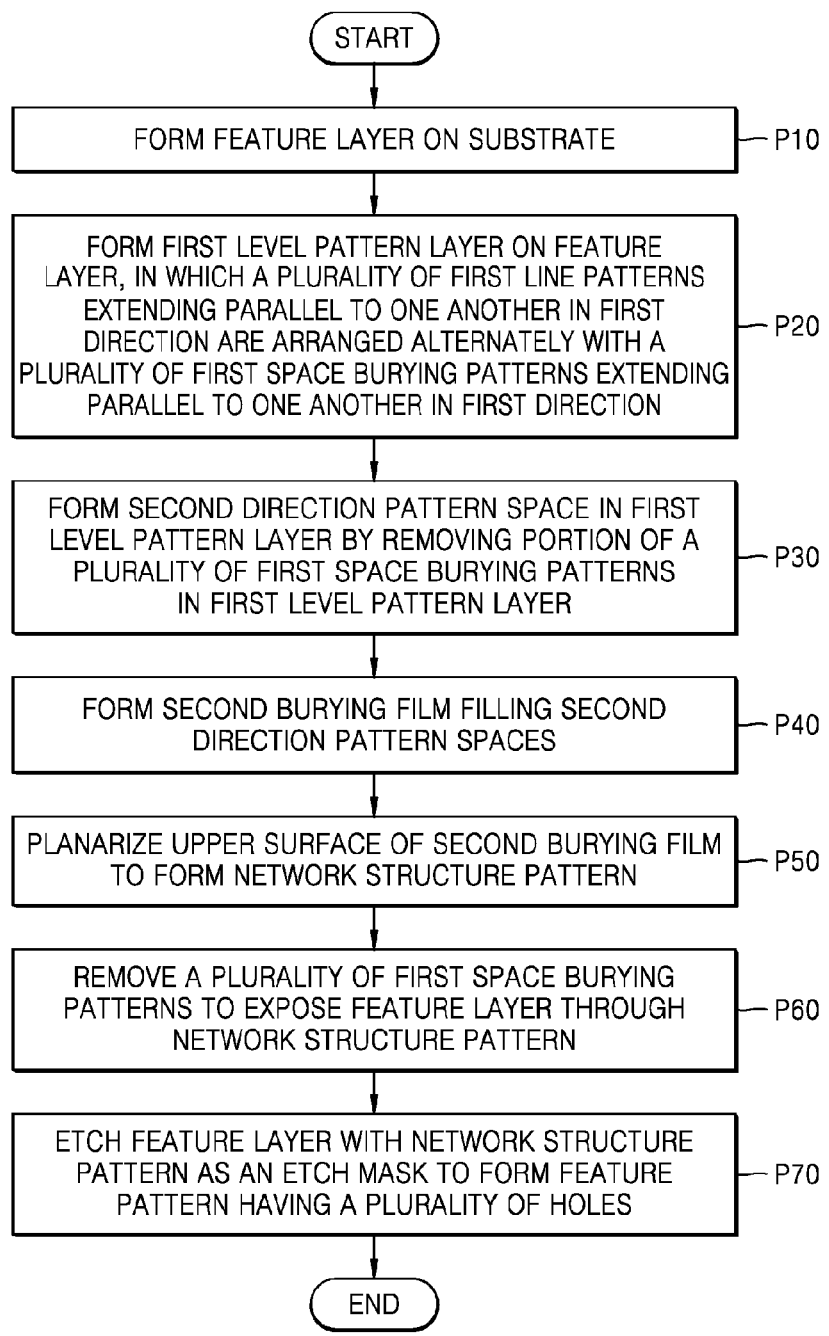
FIG. 1 is a flowchart of a method of forming a pattern, according to an example of the inventive concept.

Hereinafter, the inventive concept will be described more fully with reference to the accompanying drawings, in which examples of the inventive concept are shown. The inventive concept may, however, be embodied in many different forms and should not be construed as being limited to the examples set forth herein; rather these examples are provided so that this disclosure will be thorough and complete, and will fully convey the inventive concept to one of ordinary skill in the art. Throughout the drawings, the same elements are denoted by the same reference numerals and a repeated explanation thereof will not be given.

All terms including technical and scientific terms used herein have meanings which can be generally understood by those of ordinary skill in the art, if the terms are not particularly defined. For example, as used herein, the term "pattern" may refer to a series or of features collectively, i.e., a plurality of features, or an individual one of such features as the context and drawings, etc., will make clear. General terms defined by dictionaries should be understood to have meanings which can be contextually understood in the art and should not have ideally or excessively formal meanings, if the terms are not defined particularly herein by the inventive concept.

FIG. 1 is a flowchart of a method of forming a pattern, according to an example of the inventive concept. FIGS. 2A to 2F are perspective views of essential parts for sequentially illustrating processes in a method of forming a pattern, according to an example of the inventive concept.

Figure 2A:
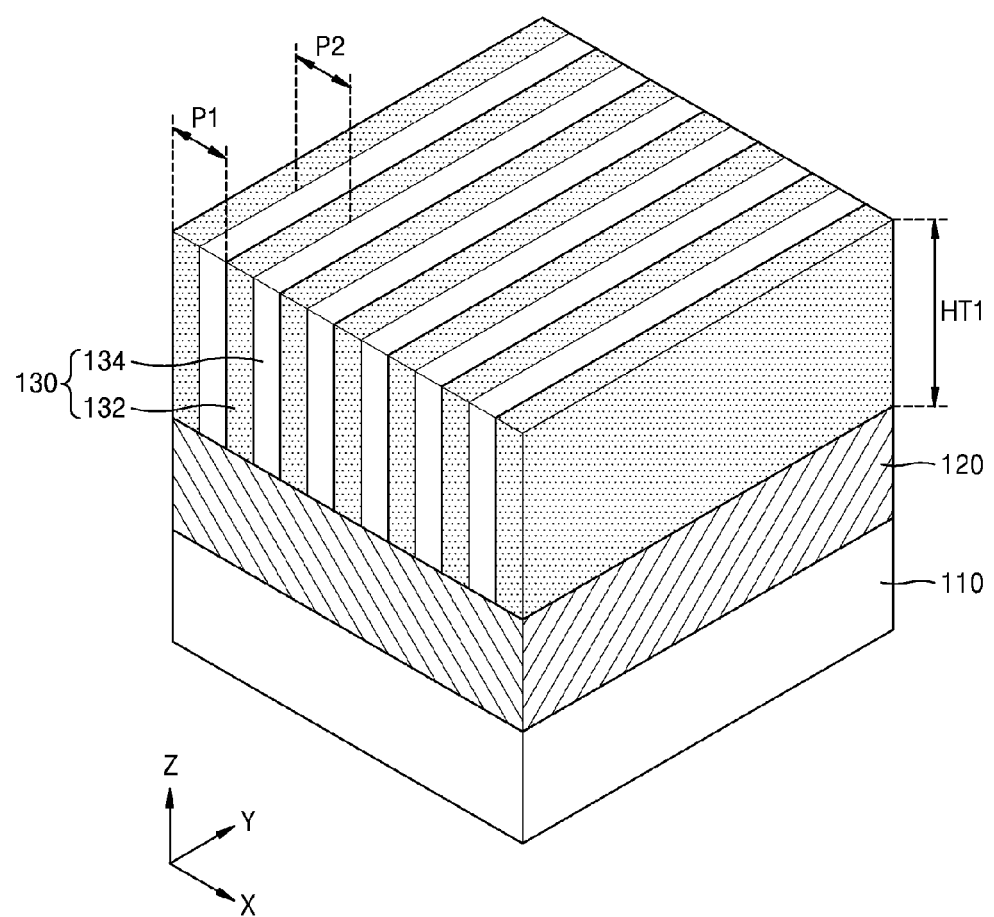
FIGS. 2A to 2F are perspective views of essential parts for sequentially illustrating processes in a method of forming a pattern, according to an example of the inventive concept.

Referring to FIGS. 1 and 2A, in process P10, a feature layer 120 may be formed on a substrate 110.

The substrate 110 may be a semiconductor substrate. In some examples, the substrate 110 may be formed of a semiconductor such as Si or Ge. In some other examples, the substrate 110 may include a substrate of a semiconductor compound, such as SiGe, SiC, GaAs, InAs, or InP. In some other examples, the substrate 110 may have a silicon-on-insulator (SOI) structure. That is, the substrate 110 may be a multi-layered structure including a base and one or more layers stacked on the base. The substrate 110 may include a conductive region, for example, an impurity-doped well or an impurity-doped structure. The substrate 110 may have any of a variety of device isolation structures, such as a shallow trench isolation (STI) structure.

The feature layer 120 may be an insulation film or a conductive film. For example, the feature layer 120 may be formed of a metal, an alloy, a metal carbide, a metal nitride, a metal oxynitride, a metal oxycarbide, a semiconductor, a polysilicon, an oxide, a nitride, an oxynitride, a hydrocarbon compound, or a combination thereof. However, examples of the inventive concept are not limited thereto.

Referring to FIGS. 1 and 2A, in process P20, a first level pattern layer 130 may be formed on the feature layer 120 on the substrate 110.

The first level pattern layer 130 may include a plurality of first line patterns 132 extending parallel to one another with a first pitch P1 in a first direction (Y direction), and a plurality of first space burying patterns 134 extending parallel to one another with a second pitch P2 in the first direction (Y direction). The plurality of first line patterns 132 and the plurality of first space burying patterns 134 in the first level pattern layer 130 may be alternately arranged in a direction (X direction) perpendicular to the first direction (Y direction).

In some examples, the first pitch P1 may be equal to the second pitch P2.

In some examples, the plurality of first line patterns 132 may have the same width as the plurality of first space burying patterns 134 in the X direction. In some other examples, the plurality of first line patterns 132 may have different widths than the plurality of first space burying patterns 134 in the X direction.

In some examples, to form the first level pattern layer 130, the plurality of first space burying patterns 134 may be formed after forming the plurality of first line patterns 132. In some other examples, to form the first level pattern layers 130, the plurality of first line patterns 132 may be formed after forming the plurality of first space burying patterns 134.

The first level pattern layer 130 may have a first height HT1. The first level pattern layer 130 may have a planarized upper surface so that upper surfaces of the plurality of first line patterns 132 may be on the same plane as the upper surfaces of the plurality of first space burying patterns 134.

In the example of FIG. 2A, the plurality of first line patterns 132 is illustrated as having substantially the same height as the plurality of first space burying patterns 134. However, examples of the inventive concept are not limited thereto. For example, the plurality of first line patterns 132 may have a height different from that of the plurality of first space burying patterns 134. For example, at least either the plurality of first line patterns 132 or the plurality of first space burying patterns 134 may extend to a level higher than the first height HT1 in a Z direction.

In some examples, to form the first level pattern layer 130, after forming the plurality of first line patterns 132 on the feature layer 120, a planarized first level pattern (not shown) including the plurality of first space burying patterns 134 may be formed on the plurality of first line patterns 132. The planarized first level pattern may be formed to have a height greater than the height of the plurality of first line patterns 132.

In some other examples, to form the first level pattern layer 130, after forming the plurality of first space burying patterns 134 on the feature layer 120, a planarized first level pattern (not shown) including the plurality of first line patterns 132 may be formed on the plurality of first space burying patterns 134. The planarized first level pattern may be formed to have a height greater than the height of the plurality of first space burying patterns 134.

The plurality of first line patterns 132 and the plurality of first space burying patterns 134 may include different films selected from the group consisting of, for example, a silicon oxide film, a carbon-containing film, a polysilicon film, and a silicon nitride film. However, the inventive concept is not limited thereto. The carbon-containing film may include a spin-on hardmask (SOH) film. In some examples, the SOH film may include a hydrocarbon compound with a relatively high carbon content of about 85 wt % to about 99 wt % based on a total weight of the SOH film, or a derivative thereof. In some examples, the plurality of first line patterns 132 may include a silicon oxide film, and the plurality of first space burying patterns 134 may include an SOH film. In some other examples, the plurality of first line patterns 132 may include a polysilicon film, and the plurality of first space burying patterns 134 may include a silicon oxide film. In some other examples, the plurality of first line patterns 132 may include an SOH film, and the plurality of first space burying patterns 134 may include a silicon oxide film. However, the inventive concept is not limited thereto.

Figure 2B:
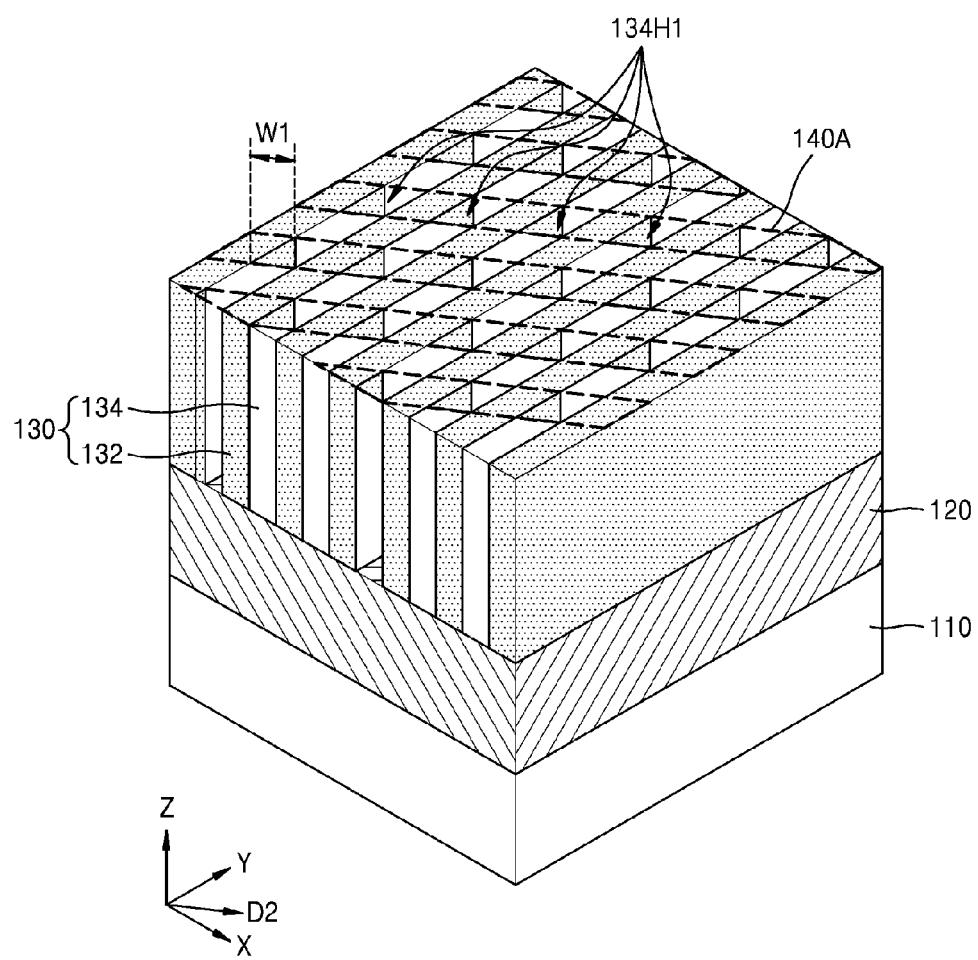

Referring to FIGS. 1 and 2B, in process P30, the plurality of first space burying patterns 134 may be partially removed from a second line pattern region 140A extending in a second direction (D2 direction) that intersects the first direction (Y direction) to form a plurality of second direction pattern spaces 134H1 in the first level pattern layer 130, the plurality of second direction pattern spaces 134H1 intermittently extending in the second direction (D2 direction).

Although in this example, the second direction (D2 direction) is defined as intersecting the first direction (Y direction) at an acute angle, the inventive concept is not limited thereto. For example, the second direction (D2 direction) may be a direction (X direction) that may intersect the first direction (Y direction) at a right angle.

In some examples, to form the second direction pattern spaces 134H1, after forming a mask pattern (not shown) exposing the second line pattern region 140A on the first level pattern layer 130, only the plurality of first space burying patterns 134 but not the plurality of first line patterns 132, may be partially removed with the mask pattern as an etch mask, using a difference in etch selectivity between the plurality of first line patterns 132 and the plurality of first space burying patterns 134, along the second line pattern region 140A. The partial removing of the plurality of first space burying patterns 134 may be performed by a dry etching or wet etching process.

Through the second direction pattern spaces 134H1 formed as described above, an upper surface of the feature layer 120 may be exposed.

The plurality of second direction pattern spaces 134H1 may each have a width W1 in the second direction (D2 direction) defined by opposing side surfaces of two adjacent first line patterns 132. The plurality of second direction pattern spaces 134H1 may be arranged as a hexagonal array on an X-Y plane.

Figure 2C:
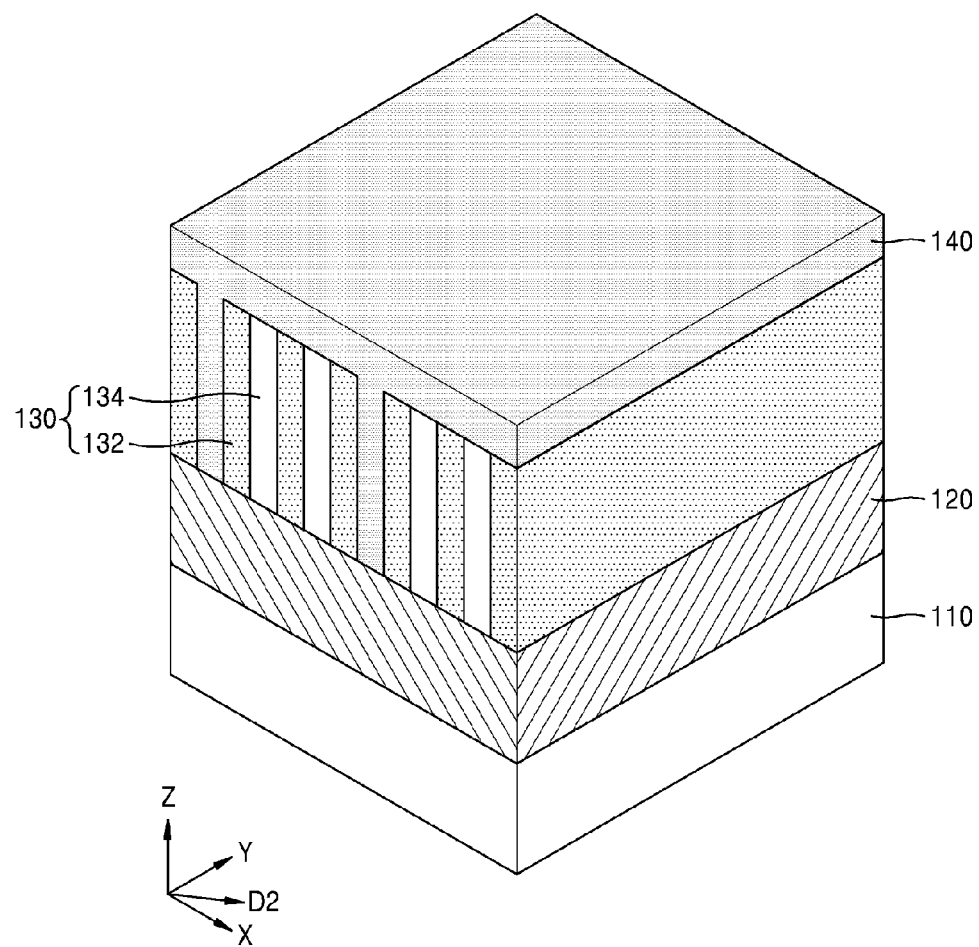

Referring to FIGS. 1 and 2C, in process P40, a second burying film 140 filling the plurality of second direction pattern spaces 134H1 (see FIG. 2C) may be formed.

The second burying film 140 may be formed to a thickness that may sufficiently fill the second direction pattern spaces 134H1. The second burying film 140 may cover the upper surfaces of the plurality of first line patterns 132 and the first space burying patterns 134.

The second burying film 140 may be formed of the same material as the material of the plurality of first line patterns 132. For example, the second burying film 140 may include a silicon oxide film, a carbon-containing film, a polysilicon film, or a silicon nitride film.

Figure 2D:
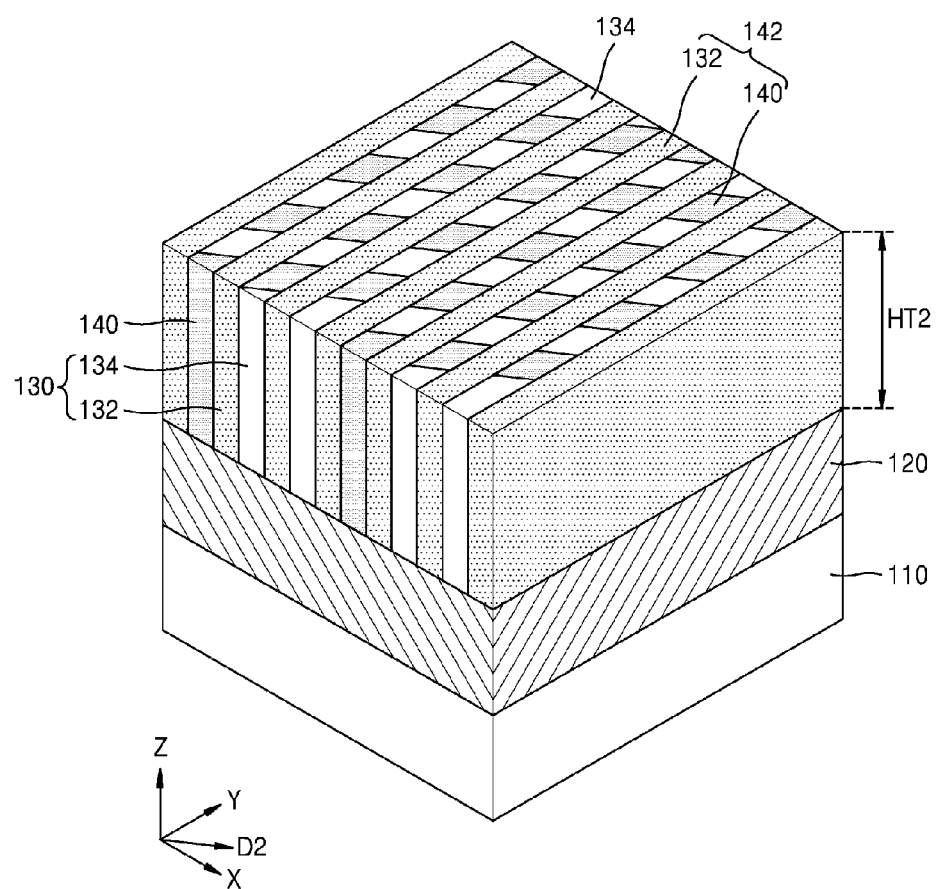

Referring to FIGS. 1 and 2D, in process P50, an upper surface of the second burying film 140 may be planarized to expose the plurality of first space burying patterns 134, and thus form a network structure pattern 142 as a combined structure of the plurality of first line patterns 132 and the planarized second burying film 140.

To form the network structure pattern 142, a resultant structure of FIG. 2C after the formation of the second burying film 140 may be planarized using a chemical mechanical polishing (CMP) or etchback process. As a result of the planarization process, the upper surface of the plurality of first space burying patterns 134 may be exposed through the network structure pattern 142.

The network structure pattern 142 resulting from the planarization process may have a second height HT2. The second height HT2 may be equal to or less than the first height HT1 of the first level pattern layer 130 illustrated in FIG. 2A.

Figure 2E:
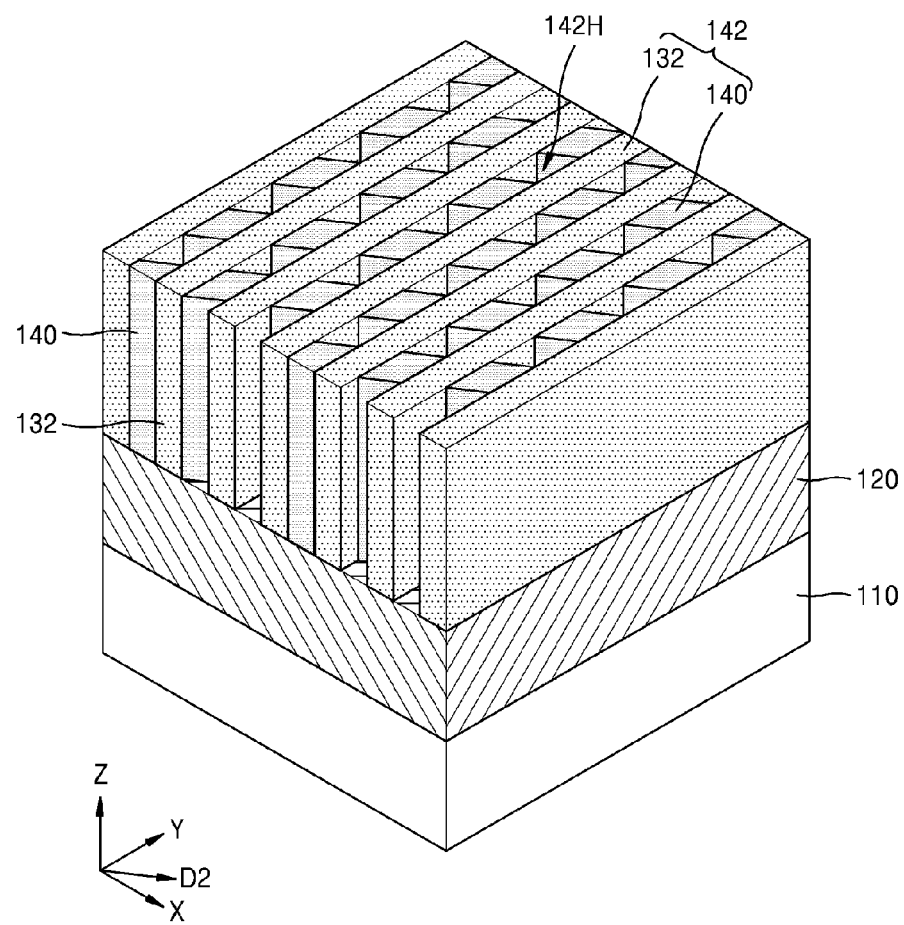

Referring to FIGS. 1 and 2E, in process P60, portions of the plurality of first space burying patterns 134 exposed through the network structure pattern 142 (see FIG. 2D) may be removed to form a plurality of etch holes 142H that may pass through the network structure pattern 142. At this time, the network structure pattern 142 may be lattice-shaped.

The plurality of etch holes 142H may be formed using a dry etching process or a wet etching process based on a difference in etch selectivity between the network structure pattern 142, as a combination of the plurality of first line patterns 132 and the planarized second burying film 140, and the plurality of first space burying patterns 134.

The upper surface of the feature layer 120 may be exposed through the plurality of etch holes 142H.

Figure 2F:
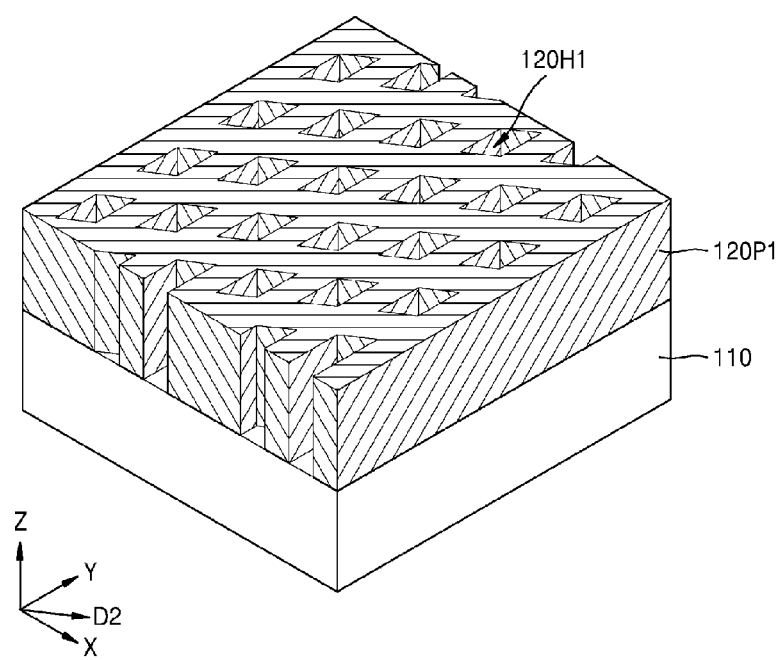

Referring to FIGS. 1 and 2F, in process P70, portions of the feature layer 120, exposed through a plurality of etch holes 142H (see FIG. 2E), may be etched using the network structure pattern 142 as an etch mask to form a pattern of features 120P1 in which the features are holes 120H1. Such a pattern may be referred to hereinafter simply a feature pattern 120P1 or a feature pattern 120P1 of a plurality of holes 120H1.

The feature layer 120 may be etched using a dry etching process. However, the inventive concept is not limited thereto.

Then, unnecessary films remaining on the feature pattern 120P1 may be removed.

Figure 3:
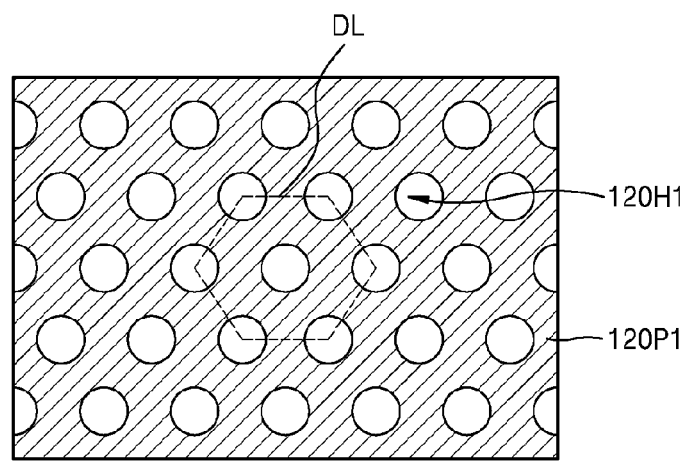
FIG. 3 is a plan view of a pattern of features formed by a pattern forming method according to an example of the inventive concept.
Figure 3:
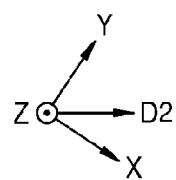

FIG. 3 is a plan view of a feature pattern 120P1 formed as described with reference to FIG. 2F.

The holes 120H1 of the pattern may be arranged as a hexagonal array as illustrated by a dashed line DL in FIG. 3. Referring back to the description of FIG. 2B, such a hexagonal array may be obtained by selecting the second direction (D2 direction) as a direction that intersects the first direction (Y direction) at an appropriately acute angle.

In the pattern forming method described with reference to FIGS. 2A to 3, the feature layer 120 may be etched using the network structure pattern 142 as an etch mask to form a plurality of holes 120H1 in the feature layer 120 on the substrate 110, and in examples of the inventive concept the network structure pattern 142 is a 1-level etch mask meaning that the etching proceeds through the mask at one level only above the feature layer 120. In contrast to a method in which a feature layer is etched using a 2-level etch mask made up of a plurality of line patterns at different levels above the feature layer, a pattern asymmetry problem in forming the plurality of holes 120H1 in the feature layer 120 is mitigated and deviation in the critical dimension (CD) of the plurality of holes 120H1 formed in the feature layer 120 from the desired CD is minimized. Accordingly, when manufacturing an IC device by using the pattern 120P1 of holes 120H1, a fine pattern including a plurality of holes regularly arranged at a high density with a relatively narrow width and a relatively small pitch may be formed so that an IC device with improved reliability may be realized.

FIGS. 4A to 4F are perspective views of essential parts for sequentially illustrating processes in a method of forming a pattern, according to another example of the inventive concept. Another example of the pattern forming method of FIG. 1 will be described with reference to FIGS. 4A to 4F. In FIGS. 4A to 4F, the same reference numerals as those in FIGS. 2A to 2F represent the same elements, and detailed descriptions thereof will not be provided here.

Figure 4A:
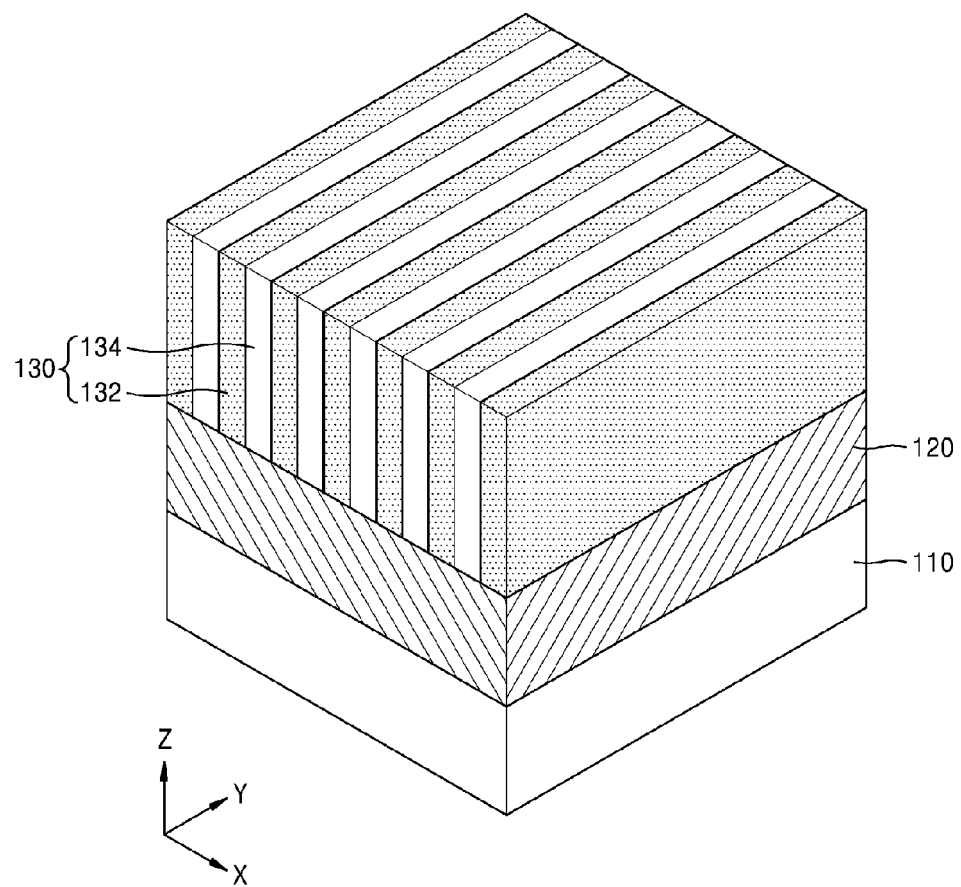
FIGS. 4A to 4F are perspective views of essential parts for sequentially illustrating processes in a method of forming a pattern, according to another example of the inventive concept.

Referring to FIG. 4A, a feature layer 120 and a first level pattern layer 130 may be formed on a substrate 110 in the same manner as described with reference to FIG. 2A.

The first level pattern layer 130 may include a plurality of first line patterns 132 and a plurality of first space burying patterns 134 that may be alternately arranged.

Figure 4B:
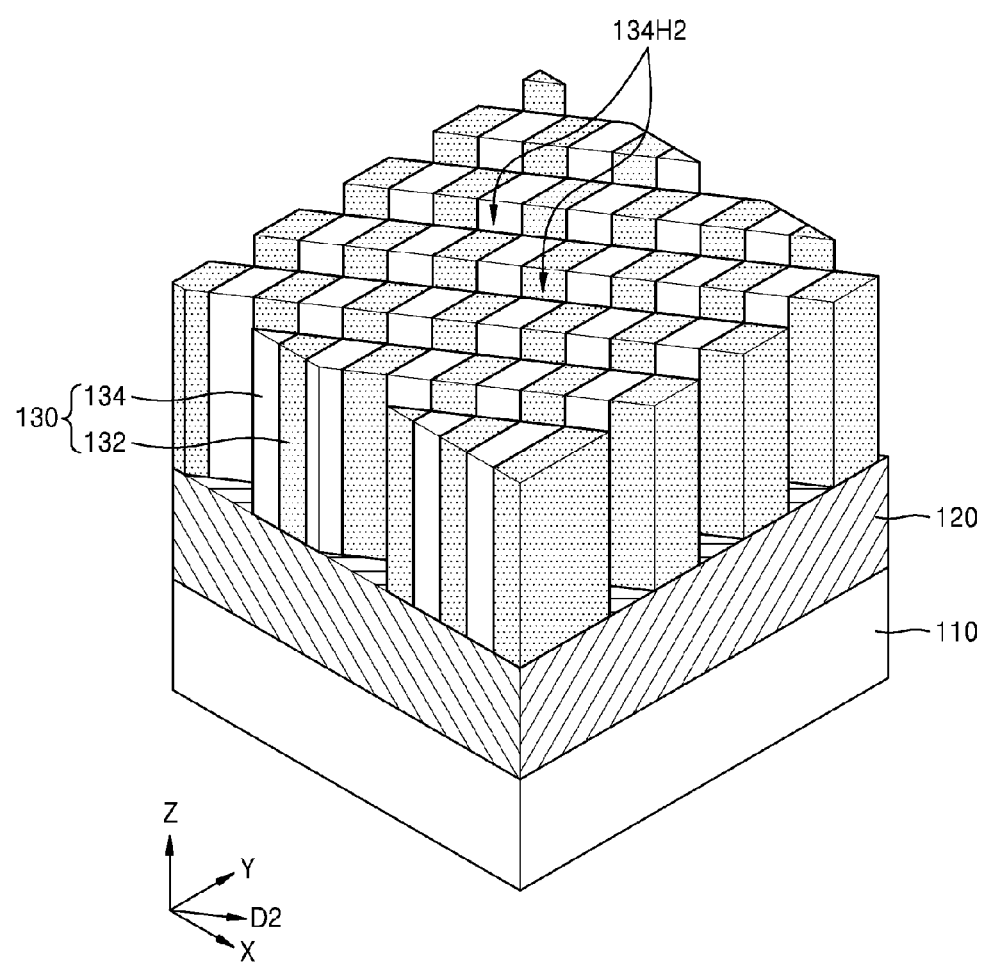

Referring to FIG. 4B, a plurality of second direction pattern spaces 134H2 in a line pattern continuously extending in the second direction (D2 direction) may be formed in the first level pattern layer 130 by partially removing the plurality of first line patterns 132 and the plurality of first space burying patterns 134 along the second line pattern region 140A (see FIG. 2B) extending along the second direction (D2 direction) that may intersect the first direction (Y direction).

In some examples, to form the plurality of second direction pattern spaces 134H2, after forming a mask pattern (not shown) exposing the second line pattern region 140A (see FIG. 2B) on the first level pattern layer 130, exposed portions of the plurality of first line patterns 132 and the plurality of first space burying patterns 134 may be removed by drying etching or wet etching using the mask pattern as an etch mask.

The second direction pattern spaces 134H2 may be formed to continuously extend along the second direction (D2 direction) with a constant width. The second direction pattern spaces 134H2 may include a portion defined by opposite side surfaces of adjacent ones of the first line patterns 132 and a portion defined by opposite side surfaces of adjacent ones of the plurality of first space burying patterns 134.

Through the second direction pattern spaces 134H2 formed as described above, an upper surface of the feature layer 120 may be exposed.

Figure 4C:
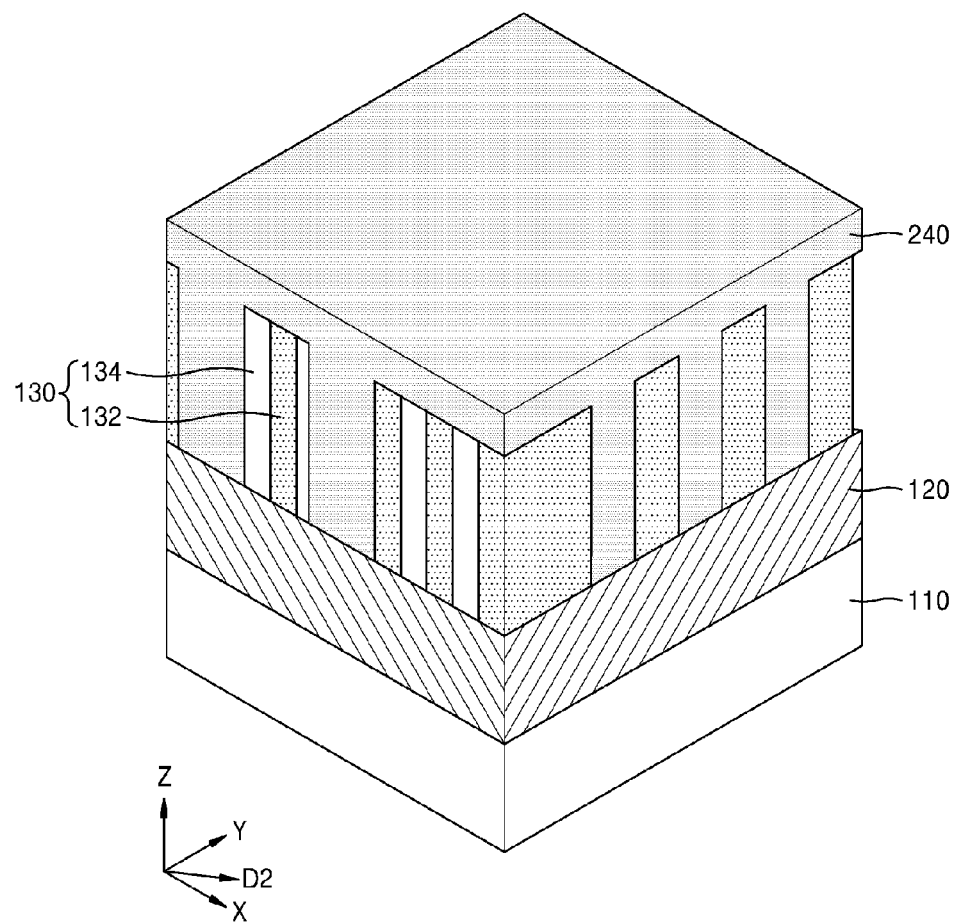

Referring to FIG. 4C, a second burying film 240 filling the second direction pattern spaces 134H2 (see FIG. 4C) may be formed in a similar manner as the method of forming the second burying film 140 described above with reference to FIG. 2C.

The second burying film 240 may be formed to a thickness that may sufficiently fill the second direction pattern spaces 134H2. The second burying film 240 may cover the upper surfaces of the plurality of first line patterns 132 and the plurality of first space burying patterns 134.

A material of the second burying film 240 may be the same as the material of the second burying film 140 described above with reference to FIG. 2C, and thus a detailed description thereof will not be provided here.

Figure 4D:
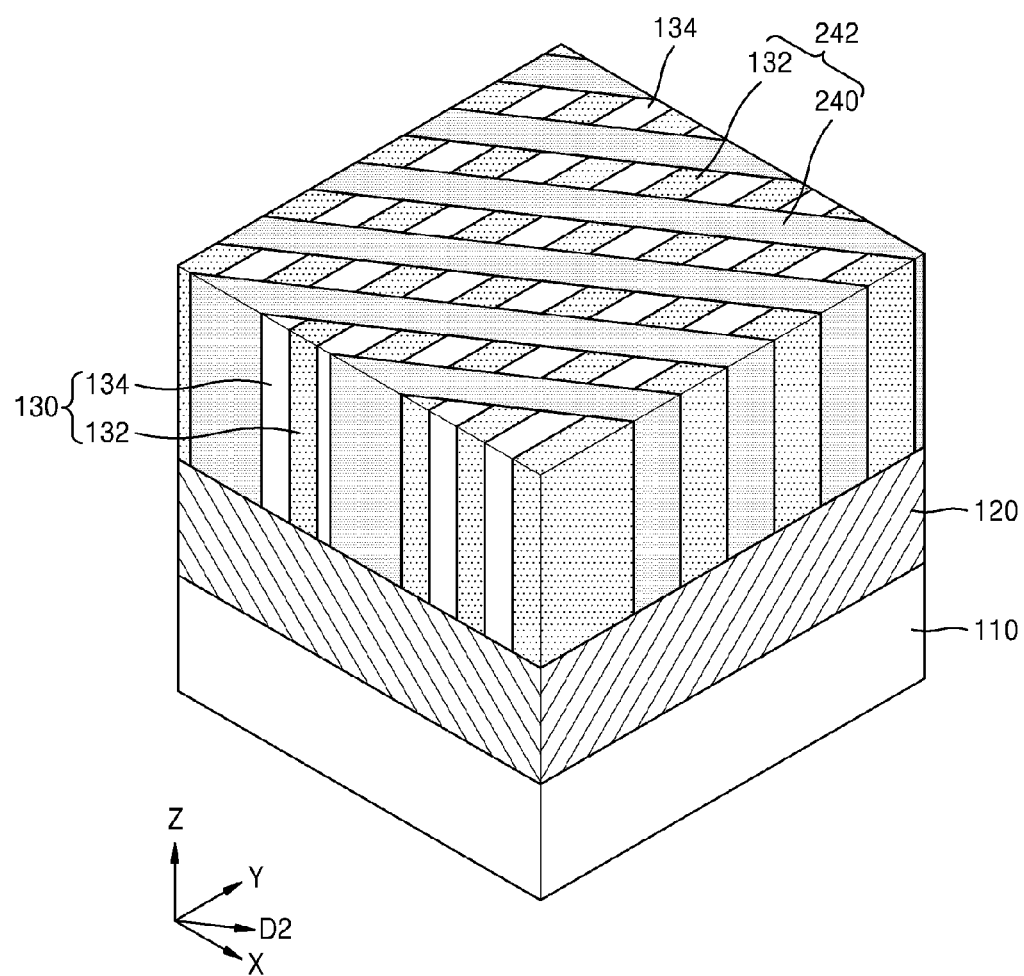

Referring to FIG. 4D, an upper surface of the second burying film 240 may be planarized to expose the plurality of first space burying patterns 134 in a similar manner as described above with reference to FIG. 2D, and thus form a network structure pattern 242 as a combined structure of the plurality of first line patterns 132 and the planarized second burying film 140.

To form the network structure pattern 242, a resultant structure of FIG. 4C after the formation of the second burying film 240 may be planarized using a CMP or etch-back process. As a result of the planarization process, the upper surface of the plurality of first space burying patterns 134 may be exposed through the network structure pattern 242.

A network structure pattern 242 resulting from the planarization process may be substantially the same as the network structure pattern 142 described above with reference to FIG. 2D, and thus a detailed description thereof will not be provided here.

Figure 4E:
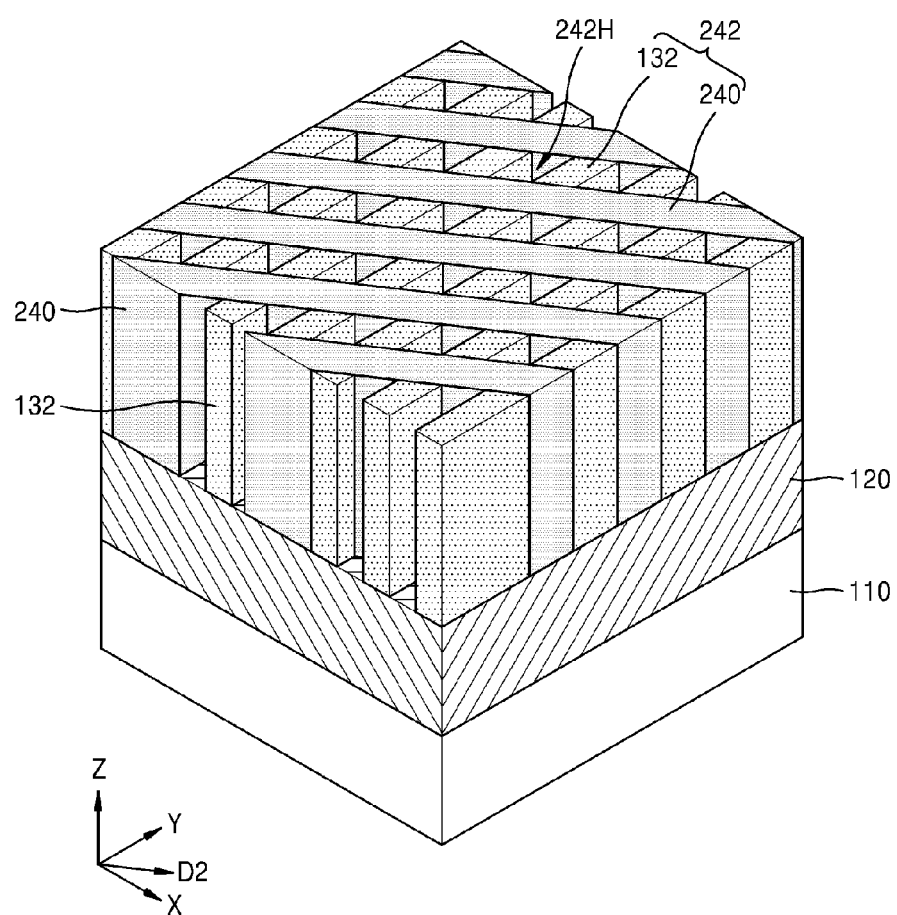

Referring to FIG. 4E, the plurality of first space burying patterns 134 exposed through the network structure pattern 242 (see FIG. 4D) may be removed in a similar manner as described above with reference to FIG. 2E, and thus form a plurality of etch holes 242H that may pass through the network structure pattern 242.

The plurality of etch holes 242H may be formed using a dry etching process or a wet etching process based on a difference in etch selectivity between the network structure pattern 242, as a combination of the plurality of first line patterns 132 and the planarized second burying film 240, and the plurality of first space burying patterns 134.

The upper surface of the feature layer 120 may be exposed through the plurality of etch holes 242H.

Figure 4F:
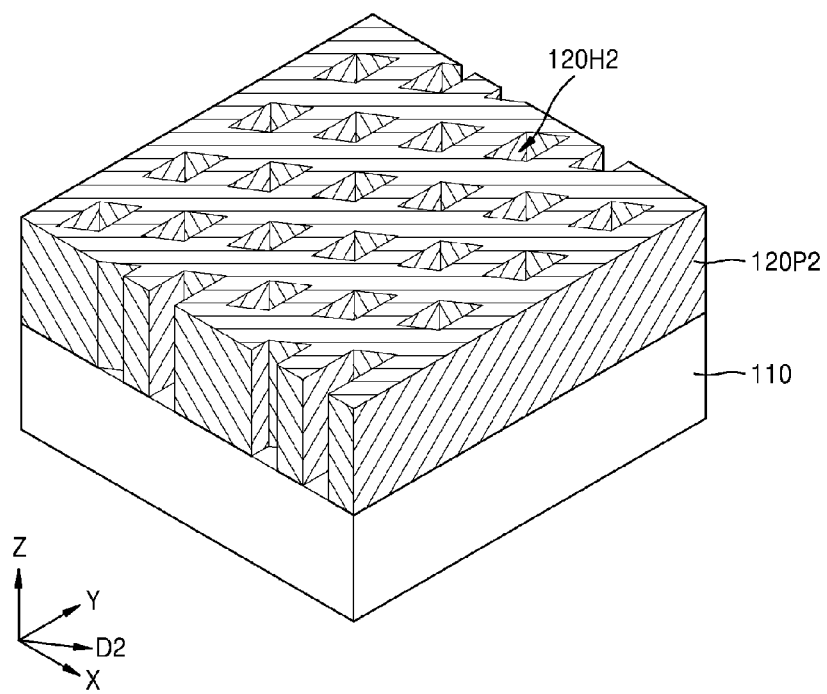

Referring to FIG. 4F, portions of the feature layer 120 exposed through a plurality of etch holes 242H (see FIG. 4E) may be etched in a similar manner as described above with reference to FIG. 2F, using the network structure pattern 242 as an etch mask, and thus form a feature pattern 120P2 having a plurality of holes 120H2.

Then, unnecessary films remaining on the feature pattern 120P2 may be removed.

The plurality of holes 120H2 in the feature pattern 120P2 formed in a manner as described above with reference to FIGS. 4A to 4F may be arranged as a hexagonal array on a X-Y plane, as illustrated in FIG. 3.

In some examples of the pattern forming method described with reference to FIGS. 4A to 4F, to form a plurality of holes 120H2 in the feature layer 120 on the substrate 110, the feature layer 120 is etched using the network structure pattern 242 as an etch mask, and the network structure pattern 242 is a 1-level mask on the feature layer 120. Accordingly, a pattern asymmetry problem in forming the plurality of holes 120H2 in the feature layer 120 may be mitigated and a deviation in the CD of the plurality of holes 120H2 formed in the feature layer 120 from the desired CD may be minimized. Accordingly, when manufacturing an IC device by using the feature pattern 120P2 including a plurality of holes 120H2, a fine pattern including a plurality of holes regularly arranged at a high density with a relatively narrow width and a relatively small pitch may be formed so that an IC device with improved reliability may be realized.

Other examples of forming a fine pattern having a plurality of holes with a fine line width greater than a resolution limit of a conventional photolithography process by the pattern forming methods described above with reference to FIG. 2A to FIG. 4F will be described in greater detail.

FIGS. 5A to 17C are views for illustrating methods of forming patterns, according to examples of the inventive concept. In particular, FIGS. 5A, 6A, . . . , and FIG. 17A sequentially illustrate plan views of methods of forming patterns, according to examples of the inventive concept. FIGS. 5B, 6B, . . . , and 17B are cross-sectional views taken along line B-B' and line B2-B2' in FIGS. 5A, 6A, . . . , and 17A, respectively. FIGS. 5C, 6C, . . . , and 17C are sectional views taken along line C-C' in FIGS. 5A, 6A, . . . , and 17A, respectively.

In FIGS. 5A to 17C, the same reference numerals as those in FIGS. 2A to 4F represent the same elements, and thus a detailed description thereof will not be provided here.

FIGS. 5A to 8C are views for illustrating a process of forming feature layers 322 and 324 on a substrate 110, according to processes P10 and P20 of FIG. 1, and a process of forming a first level pattern layer 330 on the feature layers 322 and 324, wherein the first level pattern layer 330 may correspond to the first level pattern layer 130 described above with reference to FIG. 2A.

Figure 5A:
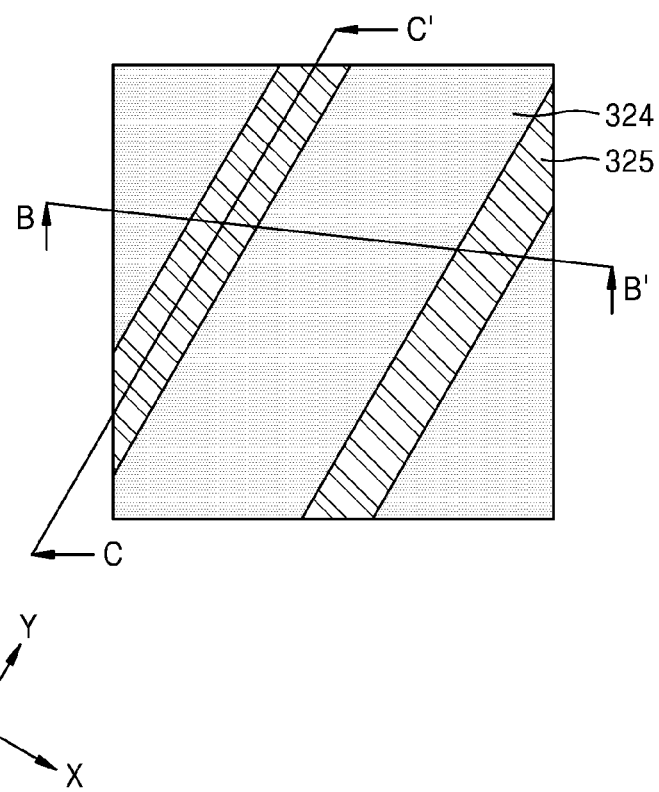
Figure 5B:
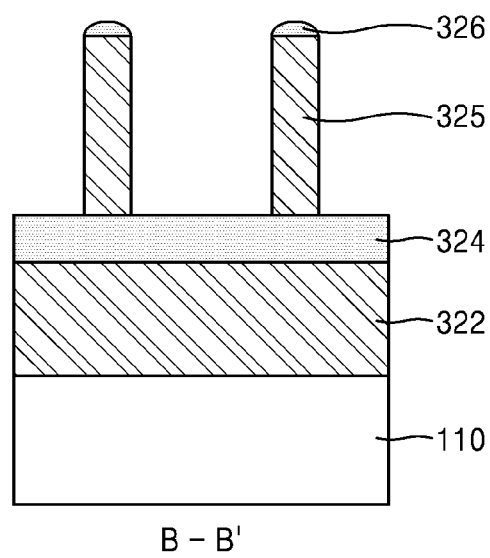
FIGS. 5B, 6B, . . . , and 17B are cross-sectional views taken along line B-B' and line B2-B2' in FIGS. 5A, 6A, . . . , and 17A, respectively.
Figure 5C:
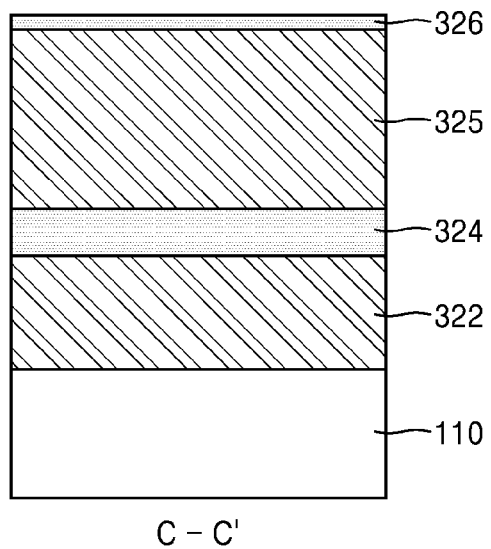
FIGS. 5C, 6C, . . . , and 17C are sectional views taken along line C-C' in FIGS. 5A, 6A, . . . , and 17A, respectively.

Referring to FIGS. 5A to 5C, the feature layers 322 and 324 may be formed on the substrate 110, and a plurality of first reference line patterns 325 extending parallel to one another may be formed on the feature layers 322 and 324.

The plurality of first reference line patterns 325 may be formed using a plurality of reference mask patterns 326 as an etch mask. Although not shown in FIG. 5A, the plurality of reference mask patterns 326 remaining after the formation of the plurality of first reference line patterns 325 are shown in FIGS. 5B and 5C.

The feature layers 322 and 324 may include a first feature layer 322 and a second feature layer 324 that may be sequentially stacked on the substrate 110. In some examples, the first feature layer 322 may include an SOH film, and the second feature layer 324 may include an SiON film. However, the inventive concept is not limited thereto.

In some examples, the plurality of first reference line patterns 325 may be formed of an SOH material, and the plurality of reference mask patterns 326 may be formed of an SiON material.

Figure 6A:
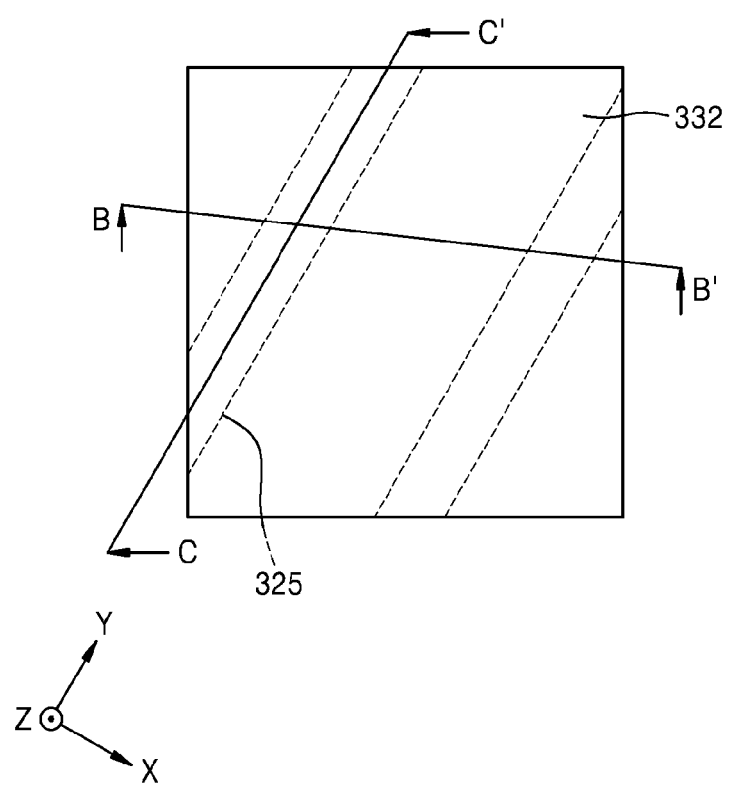
Figure 6B:
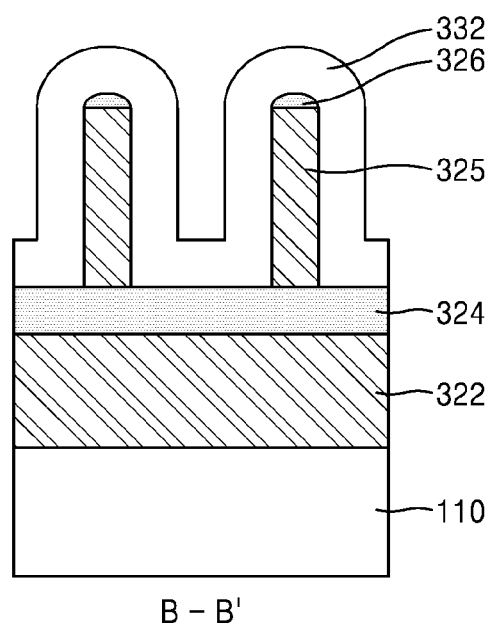
Figure 6C:
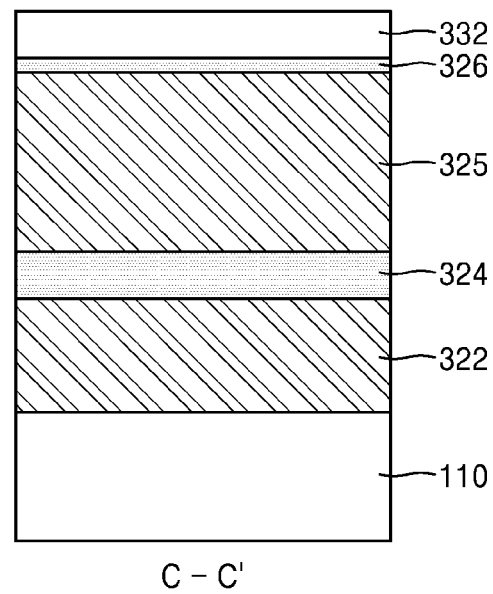

Referring to FIGS. 6A to 6C, a spacer layer 332 may be formed on the feature layers 332 and 324 to a uniform thickness and cover side surfaces and an upper surface of each of the plurality of first reference line patterns 325.

In some examples, the spacer layer 332 may include a silicon oxide film. The spacer layer 332 may be formed using an atomic layer deposition (ALD) process.

Figure 7A:
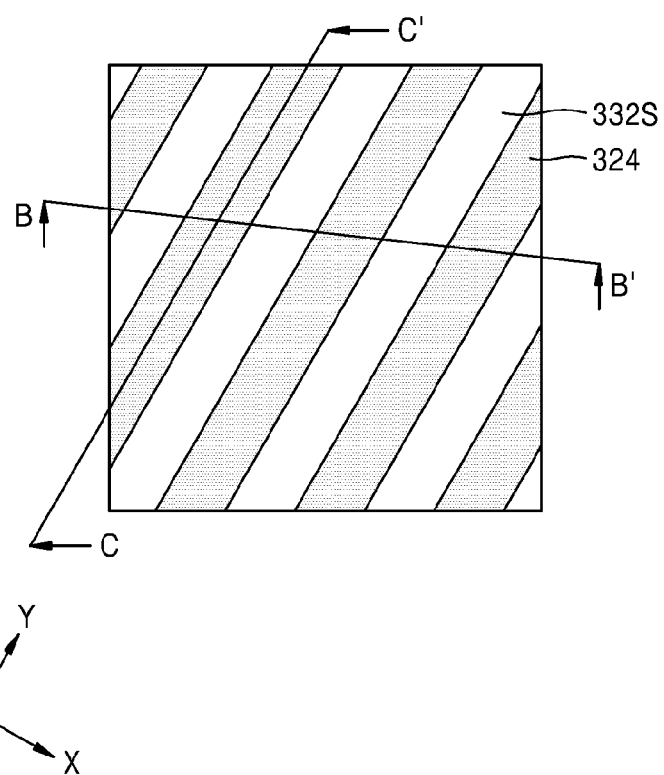
Figure 7B:
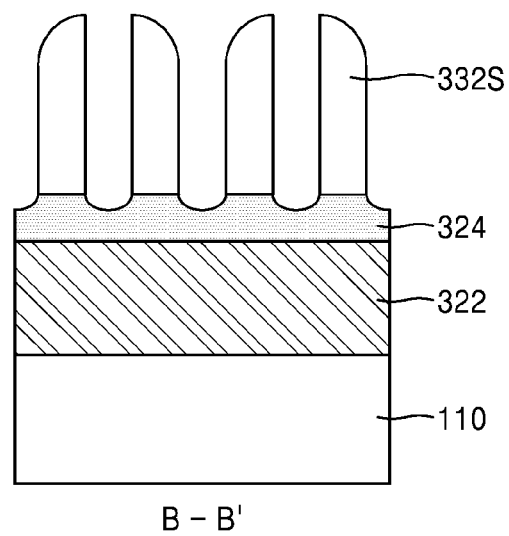
Figure 7C:
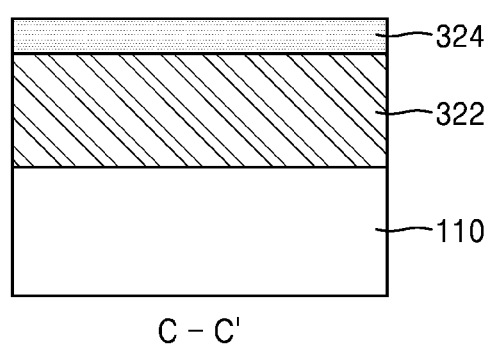

Referring to FIGS. 7A to 7C, the spacer layer 332 may be etched back to form a plurality of first line patterns 332S as a plurality of spacers that may remain on both side surfaces of the plurality of first reference line patterns 325 on the second feature layer 324. Portions of the plurality of reference mask patterns 326 and the plurality of first reference line patterns 325 (see FIGS. 6A to 6C) exposed through the plurality of first line patterns 332S may be sequentially removed to expose an upper surface of the second feature layer 324 through a space between every respective pair of adjacent ones of the first line patterns 332S.

The plurality of first line patterns 332S may correspond to the plurality of first line patterns 132 illustrated in FIG. 2A.

Figure 8A:
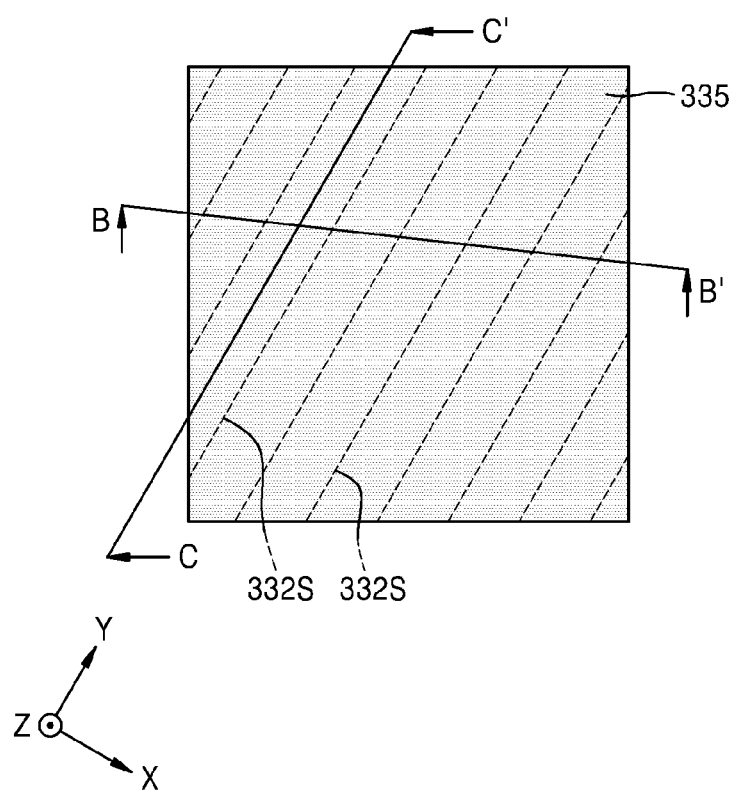
Figure 8B:
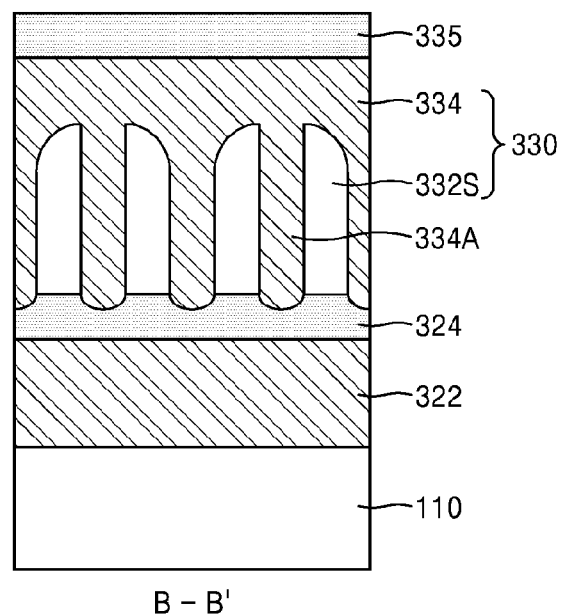
Figure 8C:
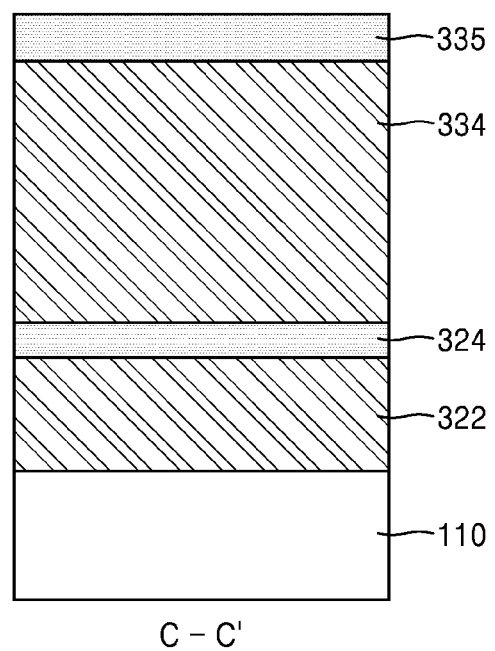

Referring to FIGS. 8A to 8C, a planarized first space burying layer 334 covering a resultant structure with the plurality of first line patterns 332S thereon, and an upper mask layer 335 covering the planarized first space burying layer 334 may be formed.

The planarized first space burying layer 334 may include a plurality of first space burying patterns 334A alternately arranged with the plurality of first line patterns 332S. The plurality of first line patterns 332S and the plurality of first space burying patterns 334A may constitute the first level pattern layer 330. The first level pattern layer 330 may correspond to the first level pattern layer 130 illustrated in FIG. 2A.

In some examples, the planarized first space burying layer 334 may be formed of an SOH material, and the upper mask layer 335 may be formed of an SiON material.

FIGS. 9A to 13C are views for illustrating a process of forming a plurality of second direction pattern spaces 334H1 in a first level pattern layer 330 (see FIGS. 13A to 13C), according to process P30 of FIG. 1 in a similar manner as described above with reference to FIG. 2B.

Figure 9A:
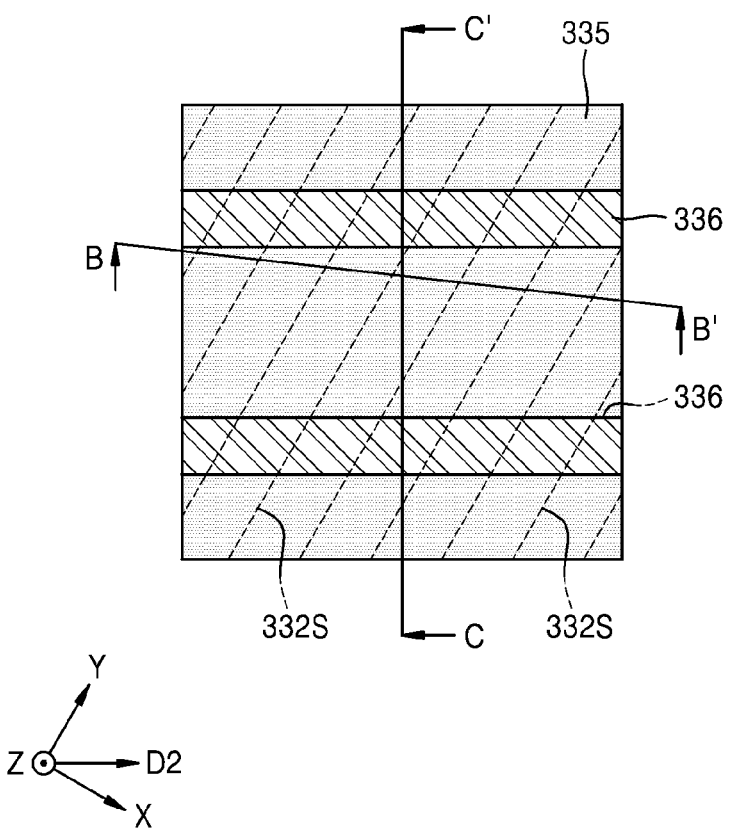
Figure 9B:
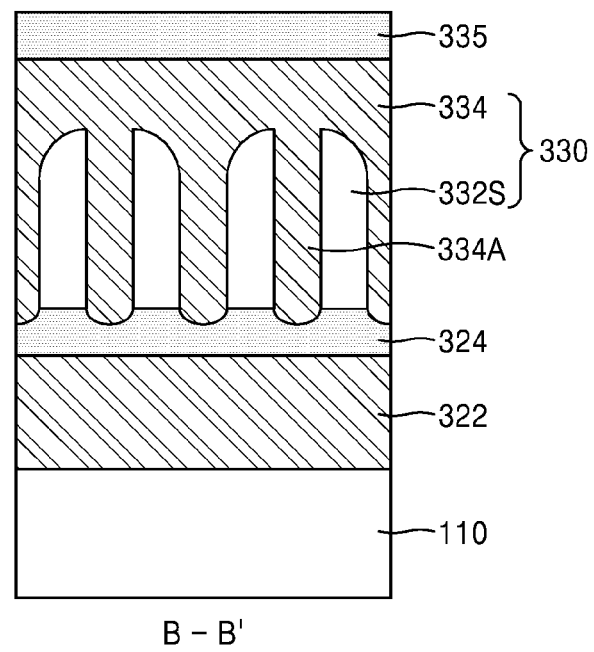
Figure 9C:
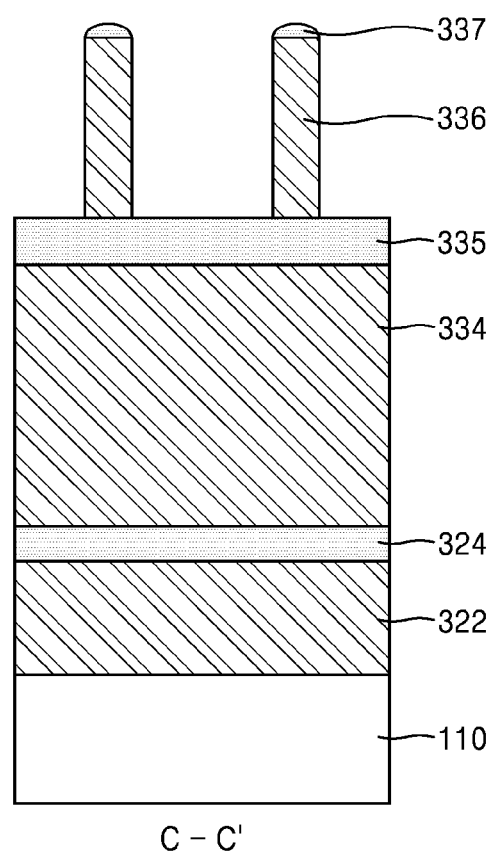

Referring to FIGS. 9A to 9C, a plurality of second reference line patterns 336 extending parallel to one another in the second direction (D2 direction) may be formed on the upper mask layer 335.

The plurality of second reference line patterns 336 may be formed using a plurality of reference mask patterns 337 as an etch mask. Although not shown in FIG. 9A, the plurality of reference mask patterns 337 remaining after the formation of the plurality of second reference line patterns 336 are shown in FIGS. 9B and 9C.

In some examples, the plurality of second reference line patterns 336 may be formed of an SOH material, and the plurality of reference mask patterns 337 may be formed of an SiON material.

Figure 10A:
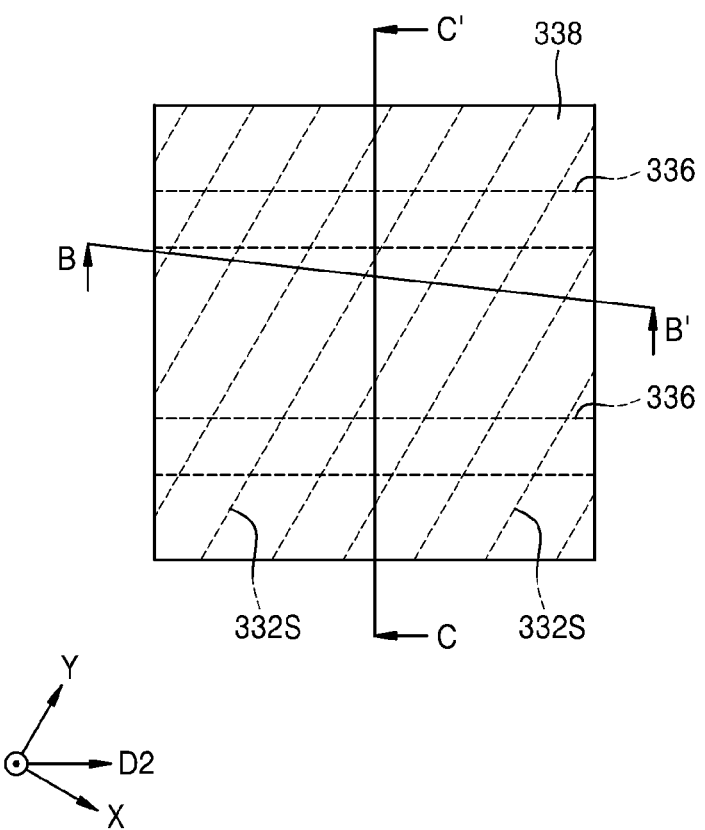
Figure 10B:
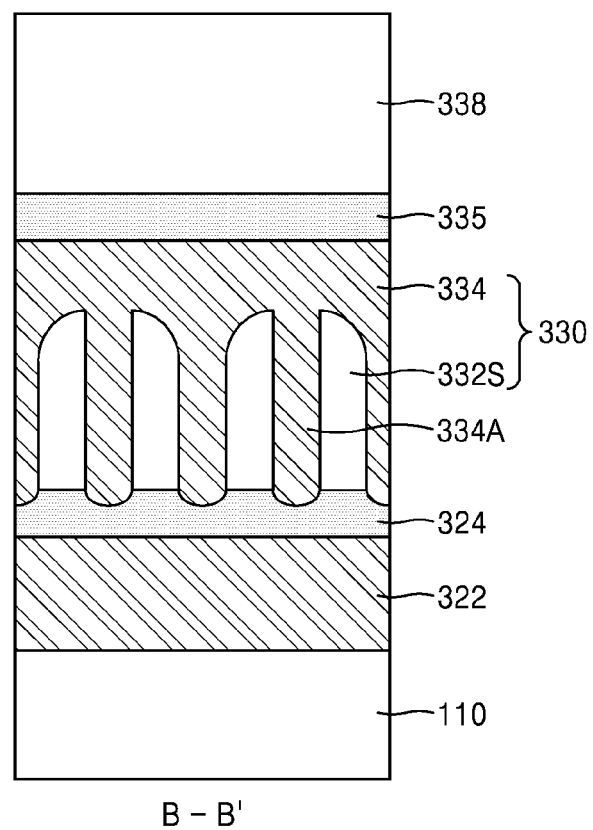
Figure 10C:
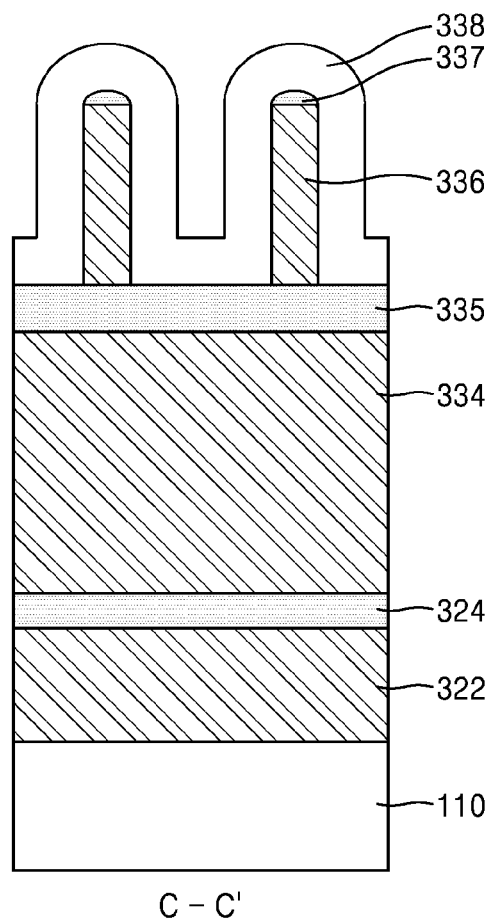

Referring to FIGS. 10A to 10C, a spacer layer 338 may be formed on the upper mask layer 335 to a uniform thickness and cover side surfaces and an upper surface of each of the plurality of second reference line patterns 336.

In some examples, the spacer layer 338 may include a silicon oxide film. The spacer layer 338 may be formed using an ALD process.

Figure 11A:
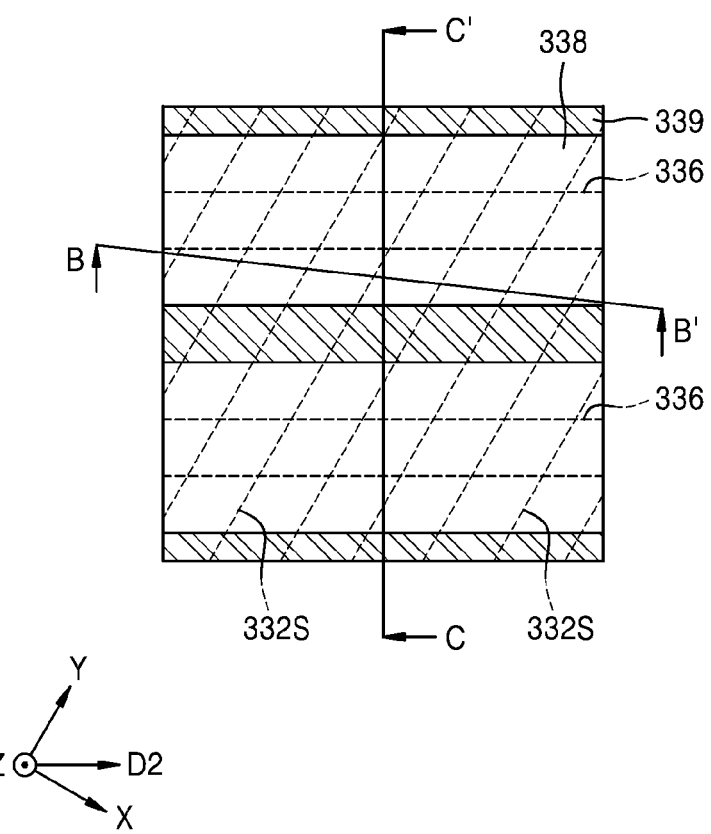
Figure 11B:
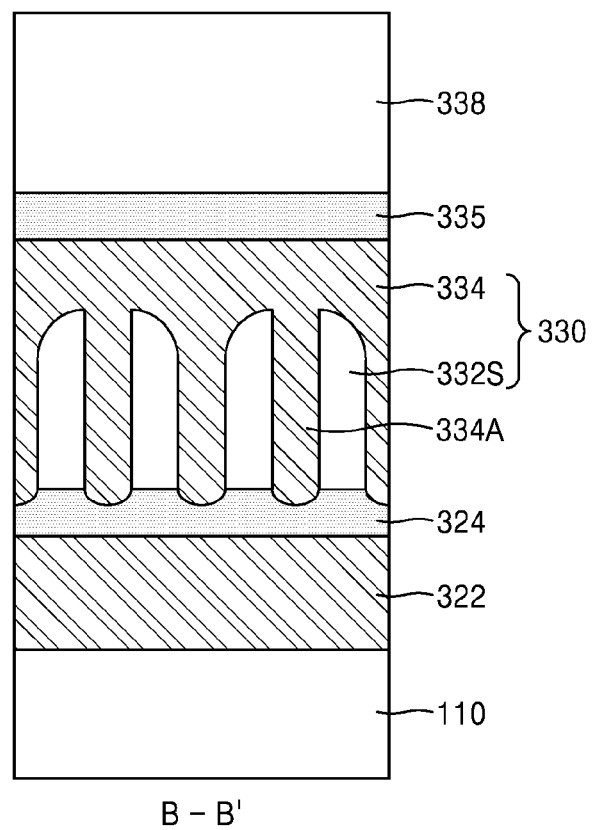
Figure 11C:
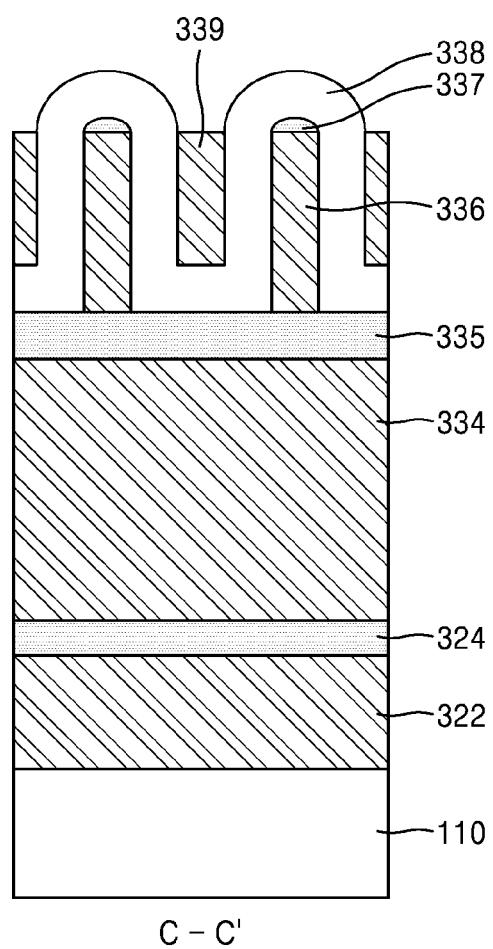

Referring to FIGS. 11A to 11C, a plurality of doubling patterns 339 alternately arranged with the plurality of second reference line patterns 336 may be formed on a resultant structure with the spacer layer 338 formed thereon.

The material of the plurality of doubling patterns 339 may be the same as the material of the plurality of second reference line patterns 336. For example, the plurality of doubling patterns 339 and the plurality of second reference line patterns 336 may be formed of an SOH material.

To form the plurality of doubling patterns 339, a doubling layer (not shown) may be formed on the spacer layer 338 and then etched back so that the spacer layer 338 is exposed.

Figure 12A:
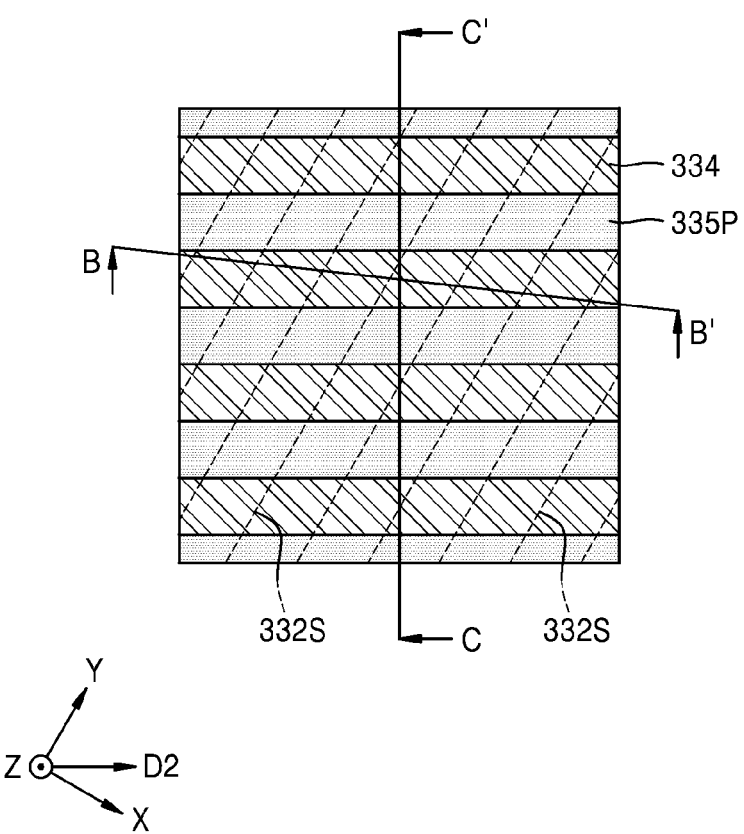
Figure 12B:
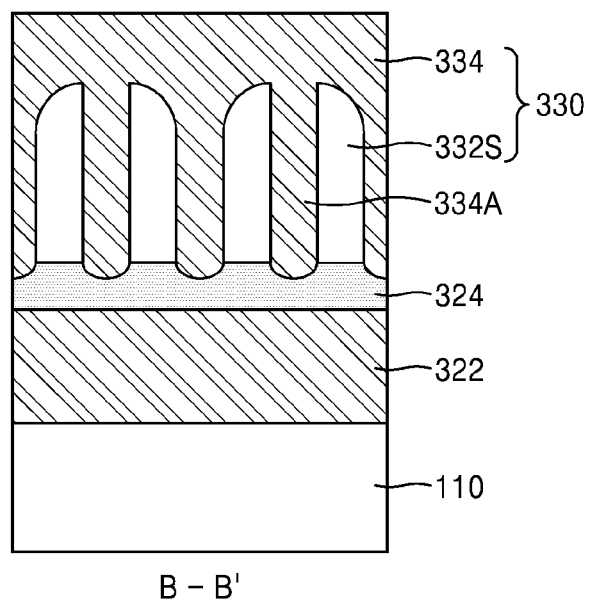
Figure 12C:
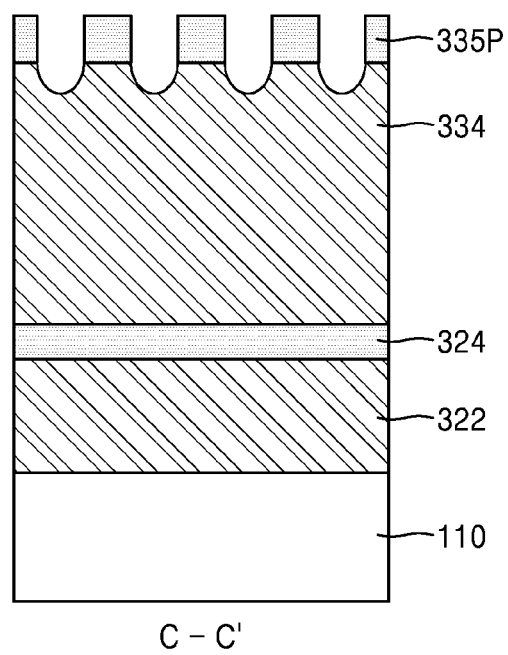

Referring to FIGS. 12A to 12C, the spacer layer 338 (see FIG. 11C) may be etched using the plurality of second reference line patterns 336 and the plurality of doubling patterns 339 as an etch mask, to thereby expose an upper mask layer 335. The exposed upper mask layer 335 may be etched to form an upper mask pattern 335P.

The etching process for forming the upper mask pattern 335P may be performed to such an extent that an upper region of the planarized first space burying layer 334 is partially removed.

Then, unnecessary films remaining on the planarized first space burying layer 334 and on the upper mask pattern 335P may be removed.

Figure 13A:
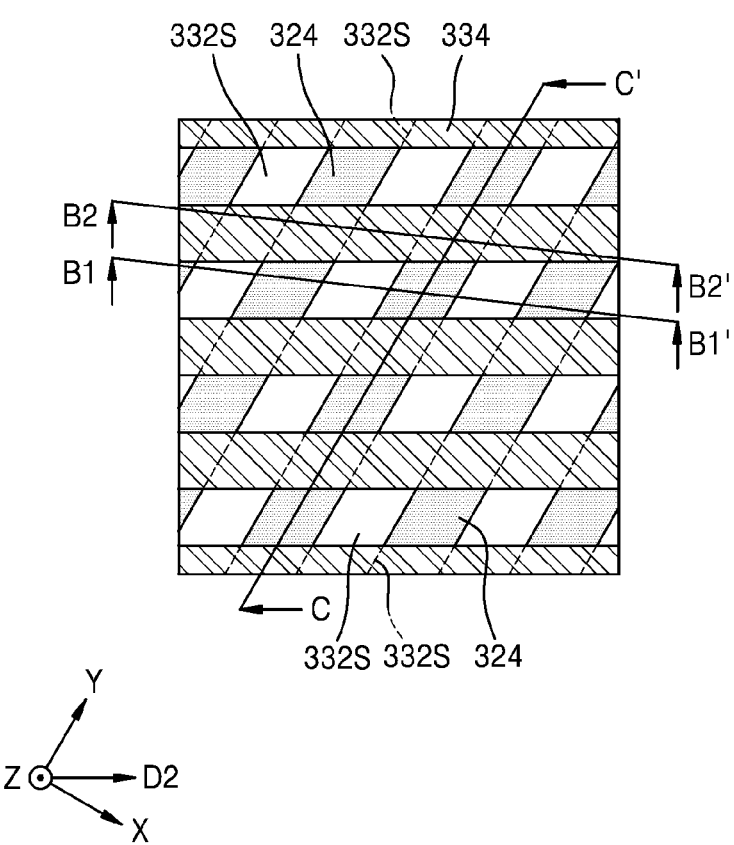
Figure 13B:
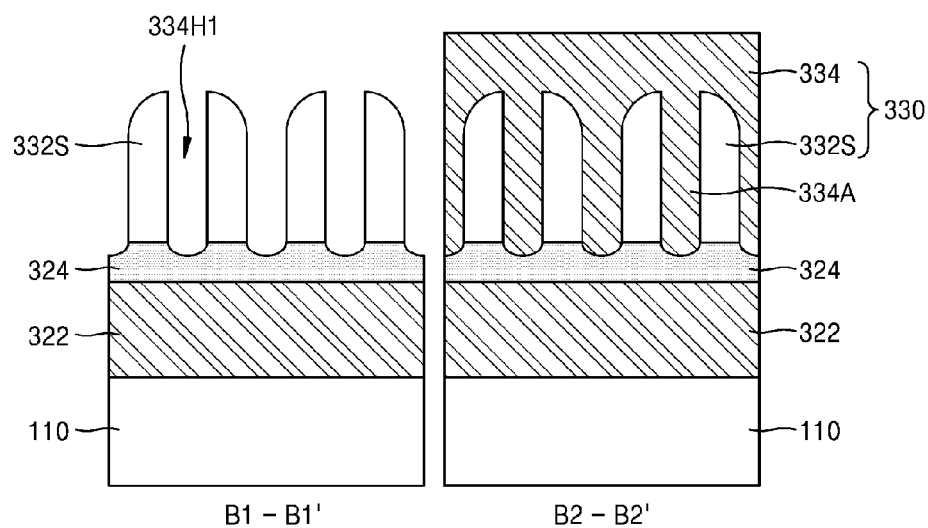
Figure 13C:
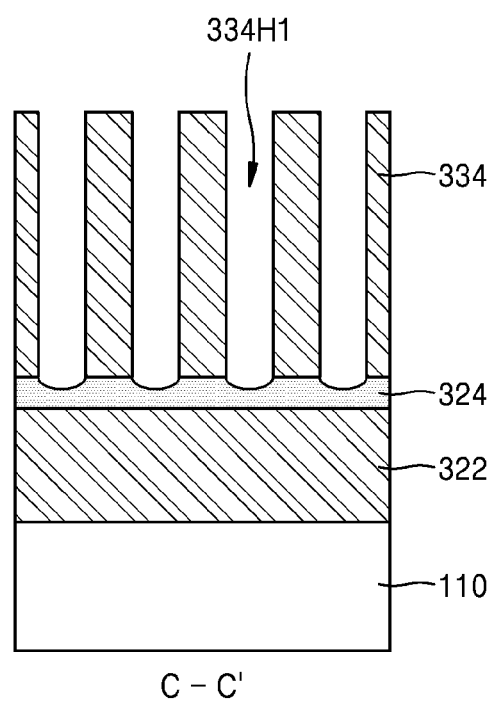

Referring to FIGS. 13A to 13C, the planarized first space burying layer 334 may be etched using the upper mask pattern 335P (see FIGS. 12A to 12C) as an etch mask to form a plurality of second direction pattern spaces 334H1 partially exposing the plurality of first line patterns 332S.

The second direction pattern spaces 334H1 may be formed intermittently along the second direction (D2 direction). An upper surface of the second feature layer 324 may be partially exposed through the plurality of second direction pattern spaces 334H1.

The plurality of second direction pattern spaces 334H1 may correspond to the plurality of second direction pattern spaces 134H1 illustrated in FIG. 2B.

Figure 14A:
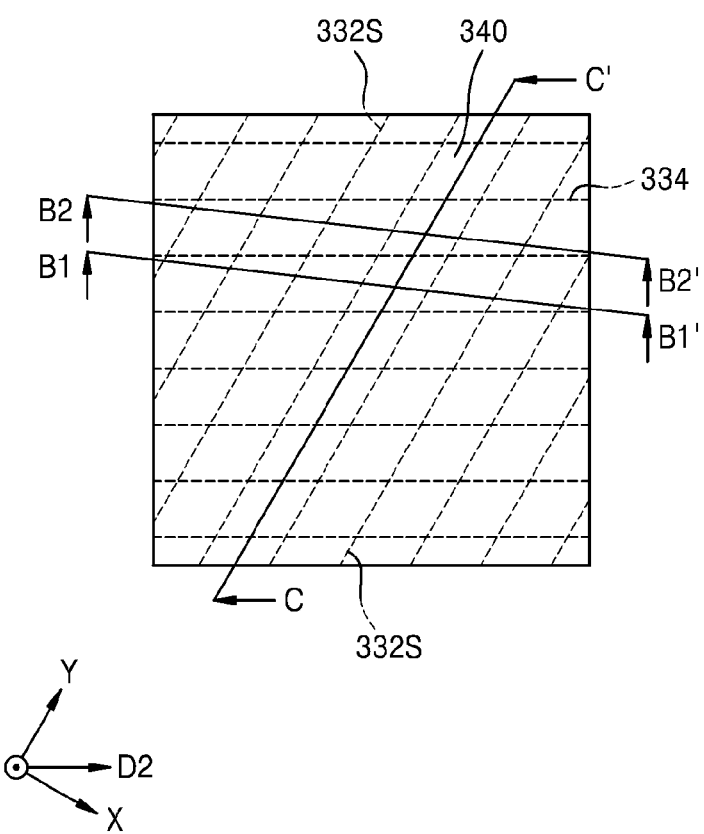
Figure 14B:
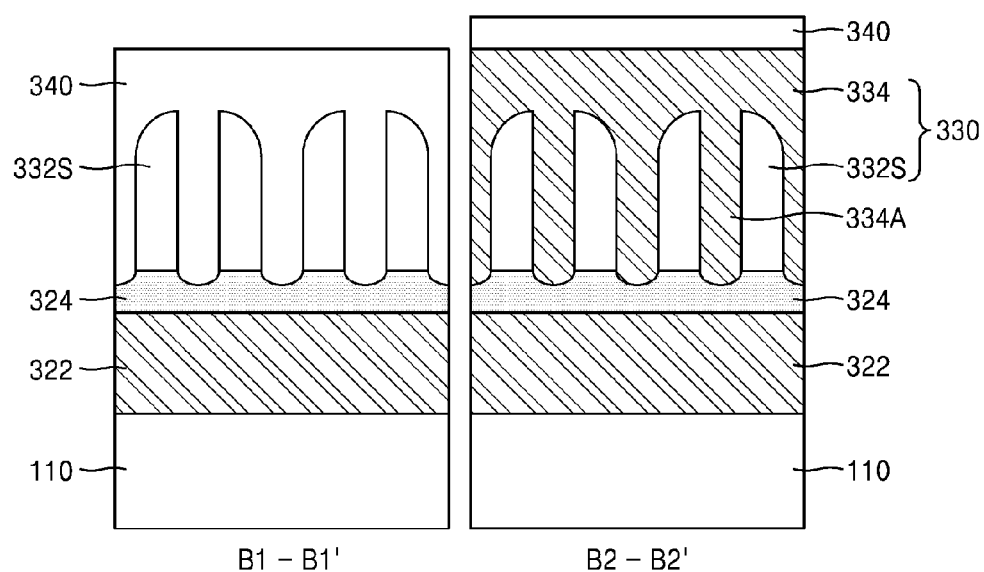
Figure 14C:
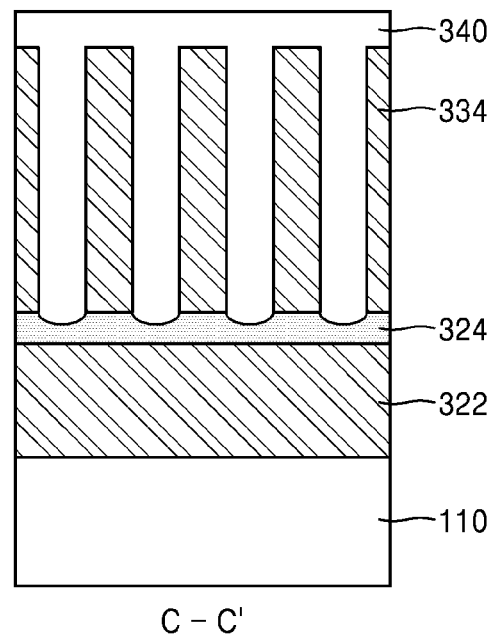

FIGS. 14A to 14C are views for illustrating a process of forming a second burying film 340, which corresponds to the second burying film 140 described above with reference to FIG. 2C, according to process P40 of FIG. 1.

Referring to FIGS. 14A to 14C, the second burying film 340 filling the plurality of second direction pattern spaces 334H1 (see FIGS. 13B and 13C) may be formed on the planarized first space burying layer 334. In some examples, the second burying film 340 may include a silicon oxide film.

Figure 15A:
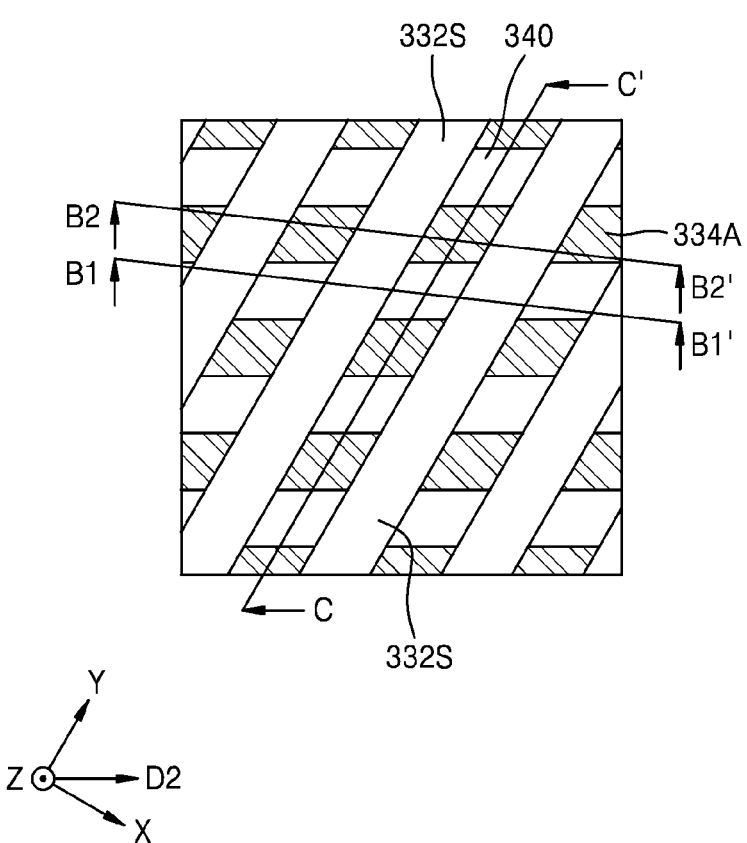
Figure 15B:
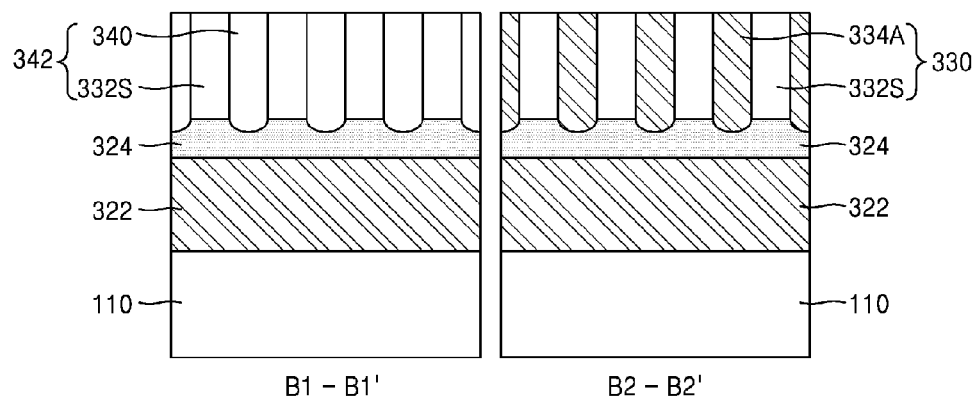
Figure 15C:
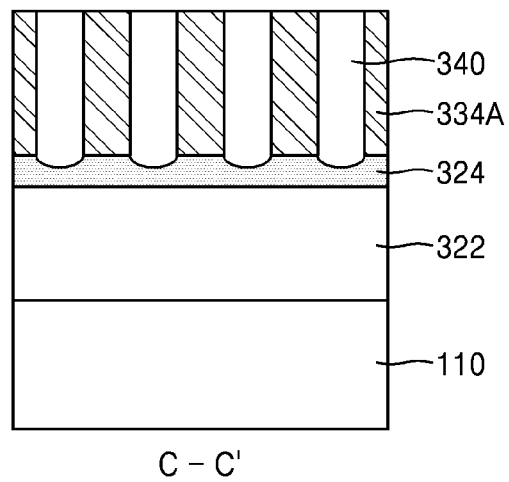

FIGS. 15A to 15C are views for illustrating a process of forming a network structure pattern 342 as a combined structure of the plurality of first line patterns 332S and the planarized second burying film 340 by planarizing an upper surface of the second burying film 340, according to process P50 of FIG. 1 in a similar manner as described above with reference to FIG. 2B.

Referring to FIGS. 15A to 15C, the planarized first space burying layer 334 and the second burying film 340 (see FIGS. 14A to 14C) may be further planarized so that the upper surface of the plurality of first line patterns 332S is exposed, so that the plurality of first line patterns 332S may be alternately arranged with the plurality of first space burying patterns 334A of the planarized first space burying layer 334, and the height of the second burying film 340 may be reduced to a level that is similar to the height of the plurality of first line patterns 332S.

As a result, the network structure pattern 342 as a combination of the plurality of first line patterns 332S and the planarized second burying film 340 may be obtained. The upper surface of the plurality of first space burying patterns 334A may be exposed through the network structure pattern 342.

In some examples, the planarized first space burying layer 334 and the second burying film 340 (see FIGS. 14A to 14C) may be further planarized using a CMP process or an etchback process.

Figure 16A:
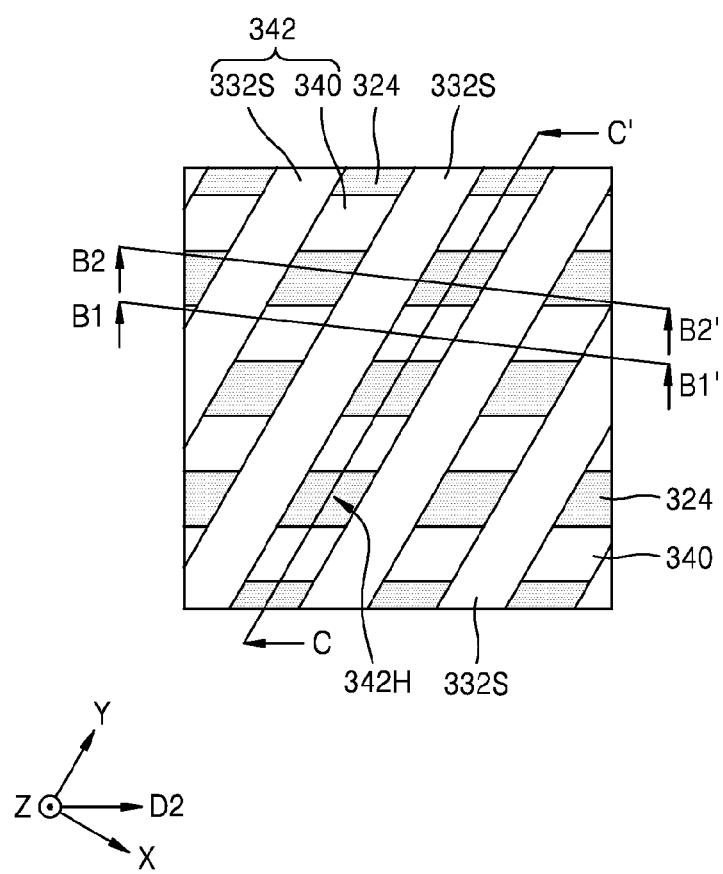
Figure 16B:
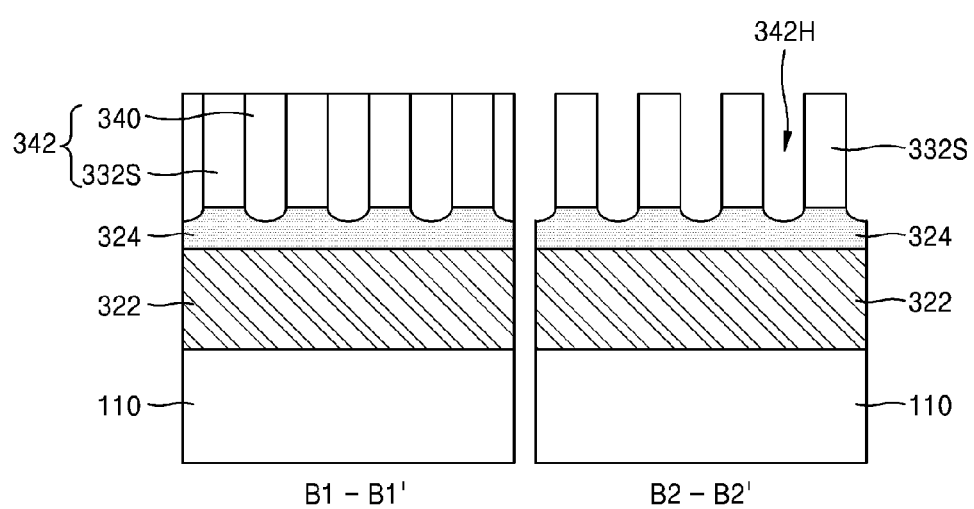
Figure 16C:
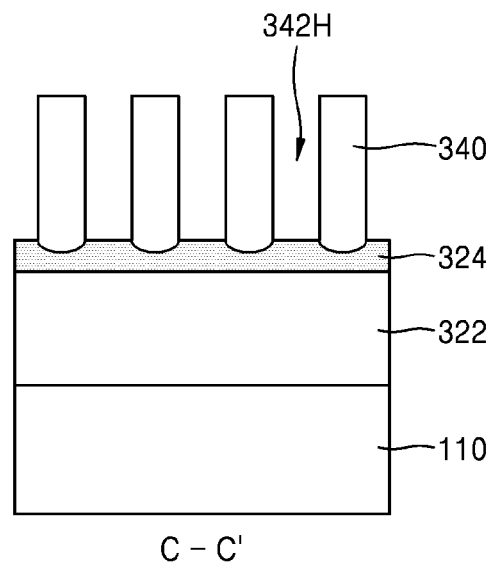

FIGS. 16A to 16C are views for illustrating a process of forming a plurality of etch holes 342H passing through the network structure pattern 342 by removing the plurality of first space burying patterns 334A (see FIG. 15A) exposed through the network structure pattern 342, according to process P60 in a similar manner as described above with reference to FIG. 2E.

The plurality of first space burying patterns 334A may be removed using a wet etching process or a dry etching process based on a difference in etch selectivity between the plurality of first space burying patterns 334 and the network structure pattern 342.

Figure 17A:
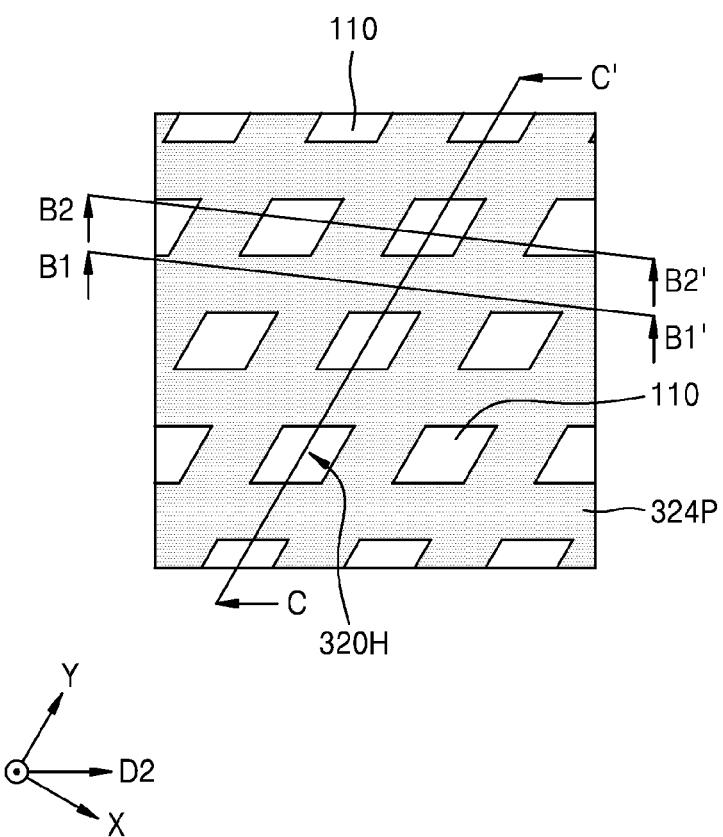
Figure 17B:
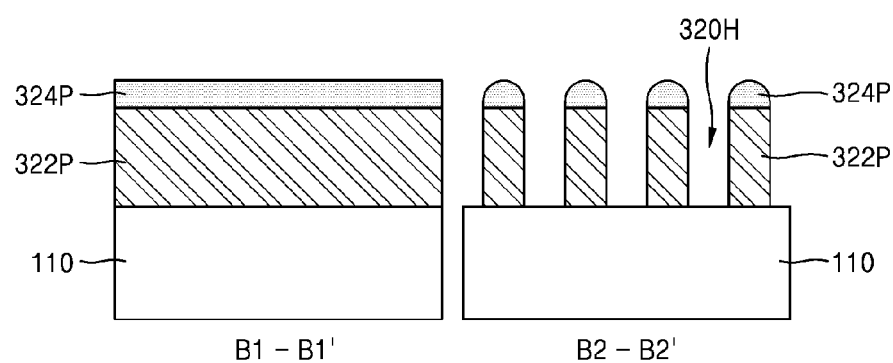
Figure 17C:
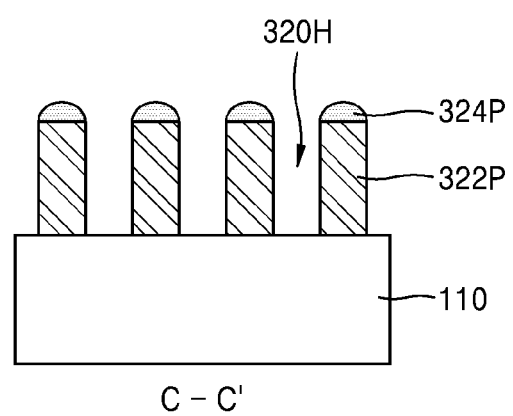

FIGS. 17A to 17C are views for illustrating a process of forming a pattern of features including a first feature pattern 322P and a second feature pattern 324P, wherein the features are a plurality of holes 320H, by etching portions of the feature layers 322 and 324 exposed through the plurality of etch holes 342H (see FIG. 16A) with the network structure pattern 342 (see FIG. 16A) as an etch mask, according to process P70 of FIG. 1 in a similar manner as described above with reference to FIG. 2F.

Referring to FIGS. 17A to 17C, after the second feature pattern 324P is formed by etching portions of the second feature layer 324 exposed through the plurality of etch holes 342H (see FIG. 16A) with the network structure pattern 342 as an etch mask, the first feature pattern 322P may be formed by etching the first feature layer 322 with the second feature pattern 324P as an etch mask. Then, unnecessary films remaining on the second feature pattern 324P may be removed.

The first feature pattern 322P and the second feature pattern 324P may collectively correspond to the feature pattern 120P1 illustrated in FIG. 3. The plurality of holes 320H may be arranged as a hexagonal array on the X-Y plane.

FIGS. 18A to 30C are views for illustrating methods of forming patterns, according to examples of the inventive concept. In particular, FIGS. 18A, 19A, ..., and FIG. 30A sequentially illustrate plan views of methods of forming patterns, according to examples of the inventive concept. FIGS. 18B, 19B, ..., and 30B are cross-sectional views taken along line B-B' of FIGS. 18A, 19A, ..., and 30A, respectively. FIGS. 18C, 19C, . . . , and 30C are cross-sectional views taken along line C-C', line C1-C1', and line C2-C2' of FIGS. 18A, 19A, . . . , 30A, respectively.

In FIGS. 18A to 30C, the same reference numerals as those used in FIGS. 2A to 17C represent the same elements, and thus a detailed description thereof will not be provided here.

FIGS. 18A to 21C are views for illustrating a process of forming a first level pattern layer 432 on the feature layer 420 on the substrate 110, according to process P20 of FIG. 1, wherein the first level pattern layer 432 may correspond to the first level pattern layer 130 described above with reference to FIG. 4A.

Figure 18A:
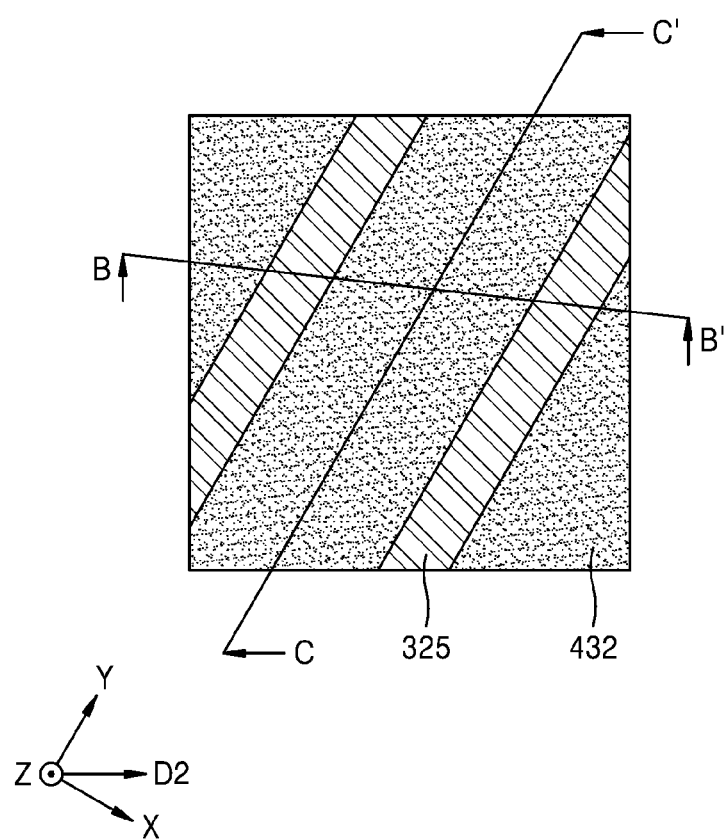
Figure 18B:
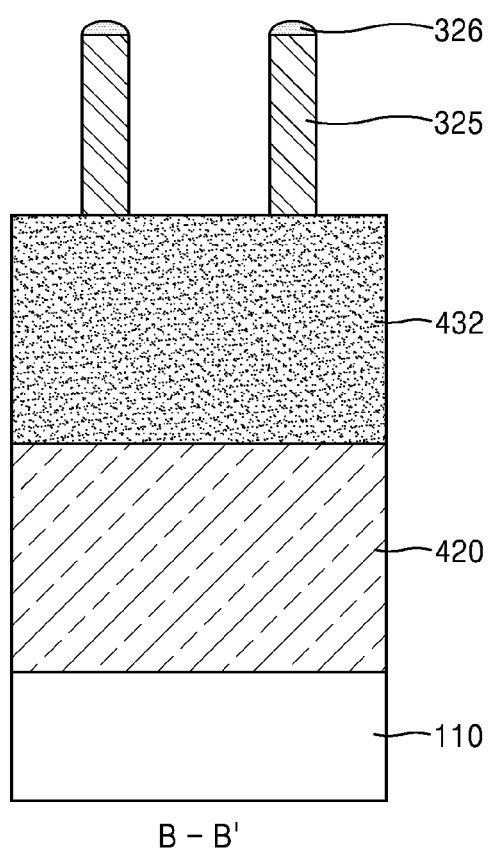
FIGS. 18B, 19B, . . . , and 30B are cross-sectional views taken along line B-B' of FIGS. 18A, 19A, . . . , and 30A, respectively.
Figure 18C:
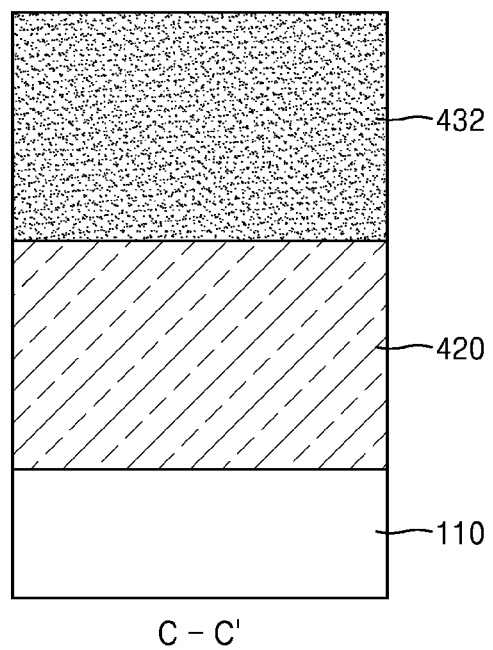
FIGS. 18C, 19C, . . . , and 30C are cross-sectional views taken along line C-C', line C1-C1', and line C2-C2' of FIGS. 18A, 19A, . . . , 30A, respectively.

Referring to FIGS. 18A to 18C, the feature layer 420 may be formed on the substrate 110, and a first line layer 432 may be formed on the feature layer 420. Next, a plurality of first reference line patterns 325 extending parallel to one another in the first direction (Y direction) may be formed on the first line layer 432.

In some examples, the feature layer 420 may be formed of a silicon oxide, a silicon nitride, a silicon oxynitride, an SOH, or a combination thereof. The first line layer 432 may be formed of polysilicon.

The plurality of first reference line patterns 325 may be formed using a plurality of reference mask patterns 326 as an etch mask. Although not shown in FIG. 18A, the plurality of reference mask patterns 326 remaining after the formation of the plurality of first reference line patterns 325 are shown in FIG. 18B.

Figure 19A:
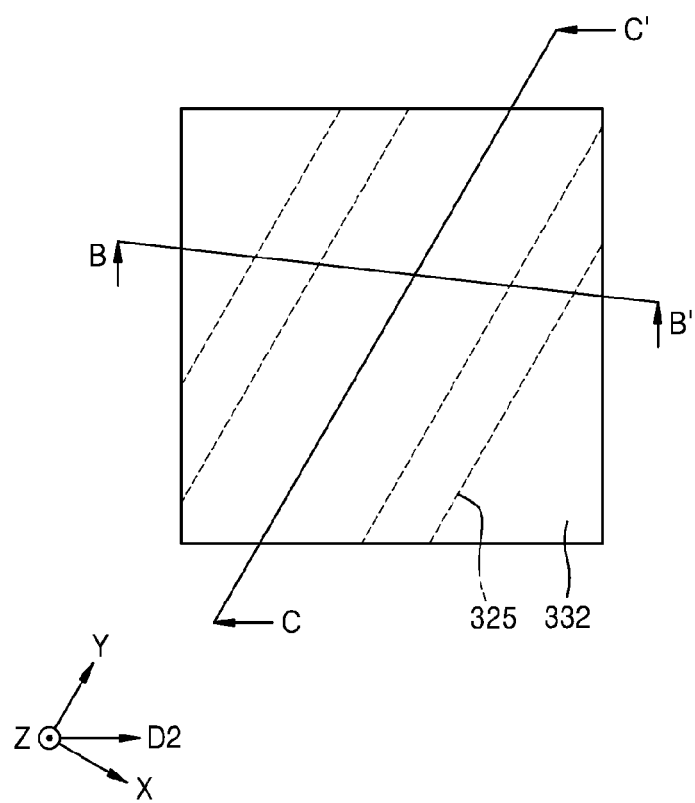
Figure 19B:
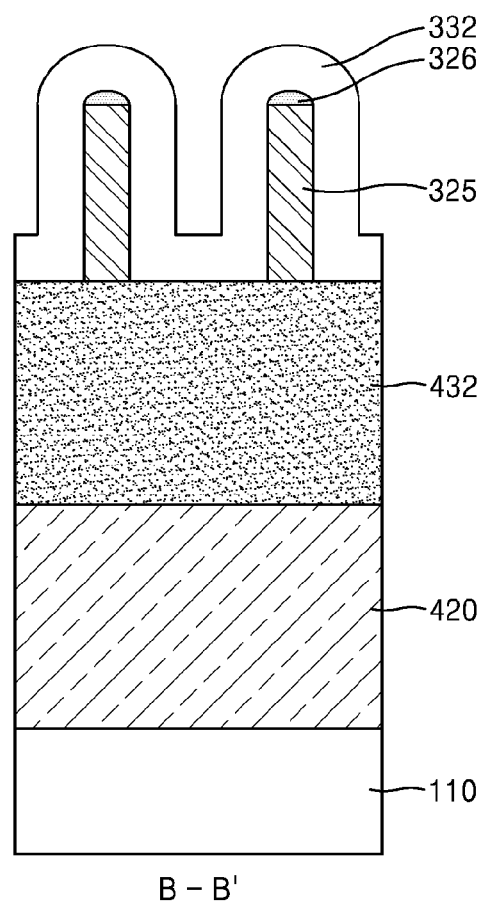
Figure 19C:
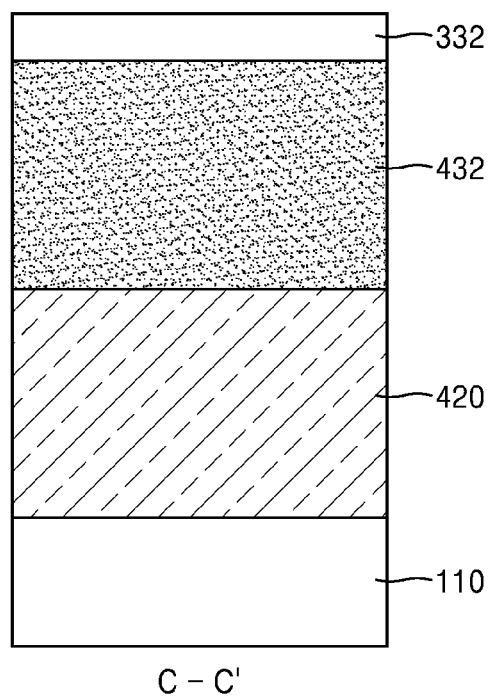

Referring to FIGS. 19A to 19C, a spacer layer 332 may be formed on the first line layer 432 to a uniform thickness and cover side surfaces and an upper surface of each of the plurality of first reference line patterns 325.

Figure 20A:
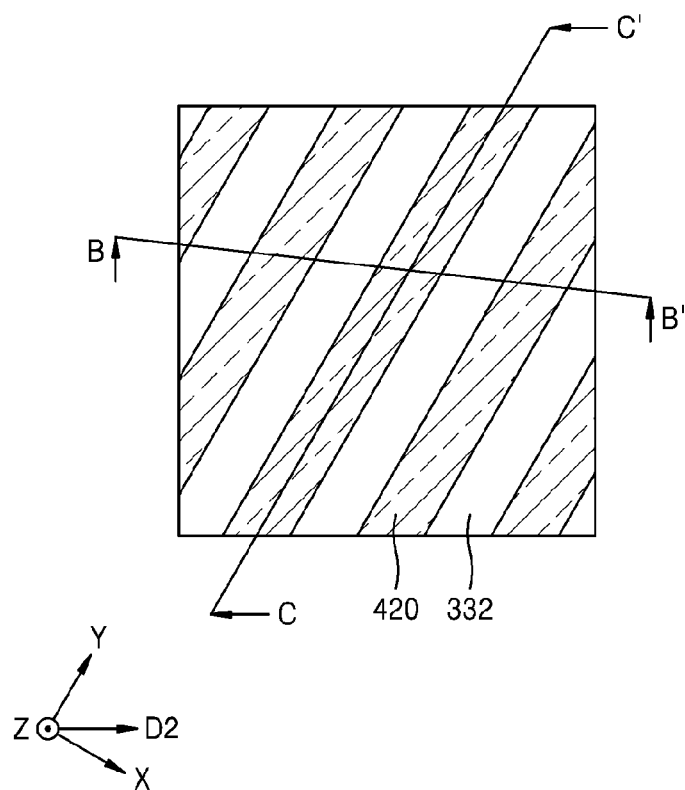
Figure 20B:
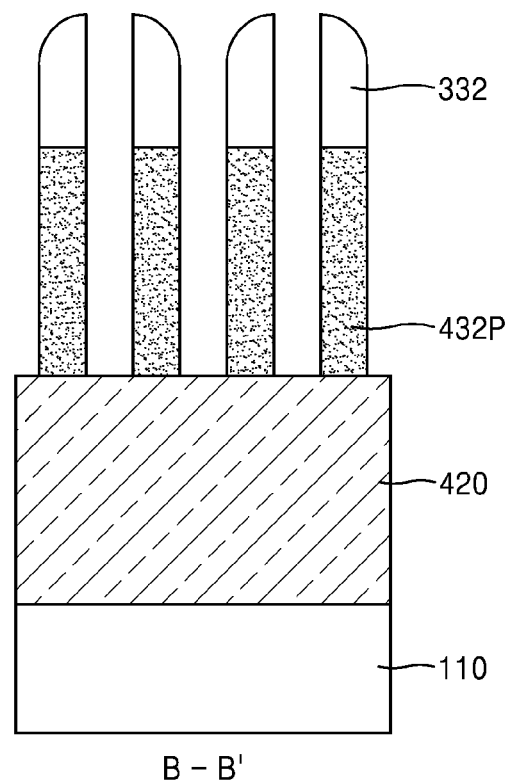
Figure 20C:
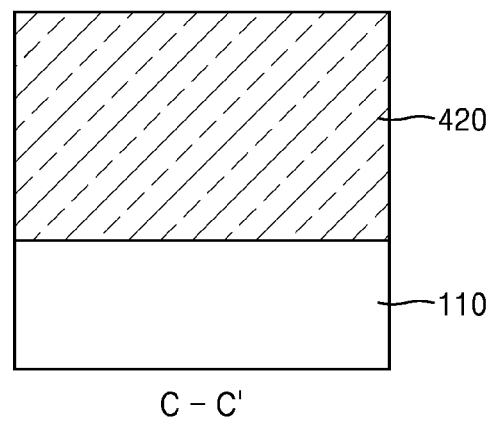

Referring to FIGS. 20A to 20C, the first line layer 432 may be etched using the spacer layer 332 as an etch mask, to thereby form a plurality of first line patterns 432P extending parallel to one another in the first direction (Y direction).

The plurality of first line patterns 432P may correspond to the plurality of first line patterns 132 described with reference to FIG. 4A.

Figure 21A:
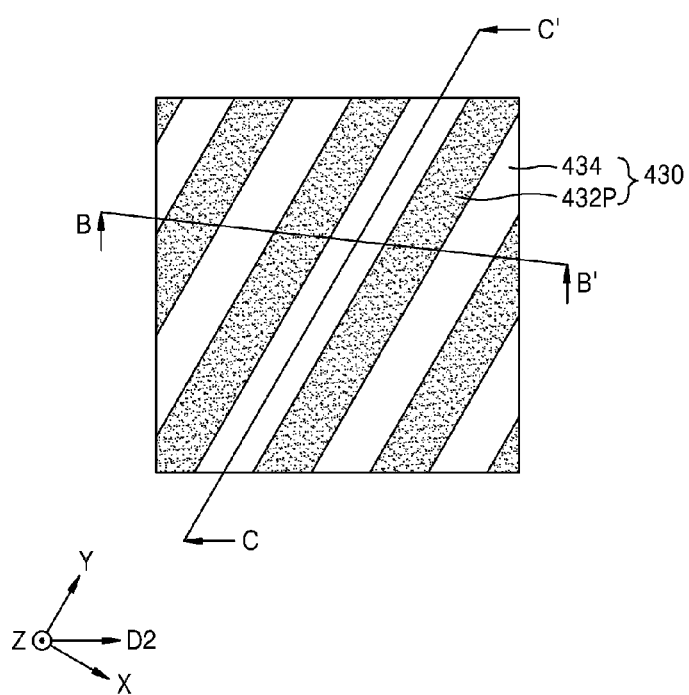
Figure 21B:
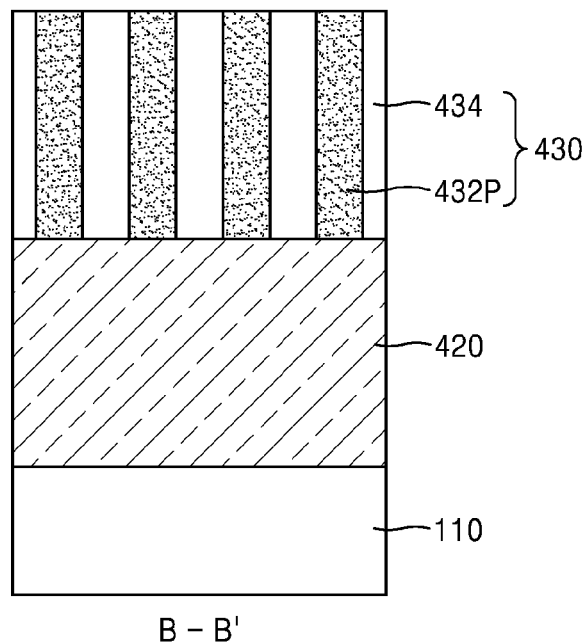
Figure 21C:
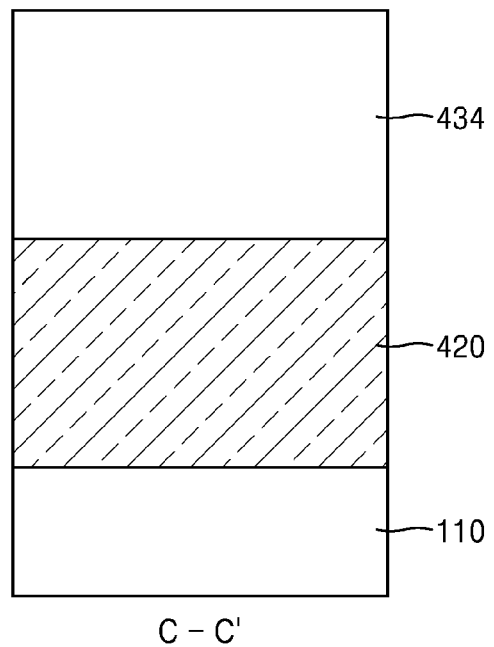

Referring to FIGS. 21A to 21C, a plurality of first space burying patterns 434 filling spaces in the plurality of first line patterns 432P and extending parallel to one another in the first direction (Y direction) may be formed.

The plurality of first line patterns 432P and the plurality of first space burying patterns 434 may constitute the first level pattern layer 430. The first level pattern layer 430 may correspond to the first level pattern layer 130 described with reference to FIG. 4A.

In some examples, the plurality of first space burying patterns 434 may be formed of silicon oxide.

FIGS. 22A to 26C are views for illustrating a process of forming a plurality of second direction pattern spaces 434H2 in the first level pattern layer 430, according to process P30 of FIG. 1 in a similar manner as described above with reference with FIG. 4B.

Figure 22A:
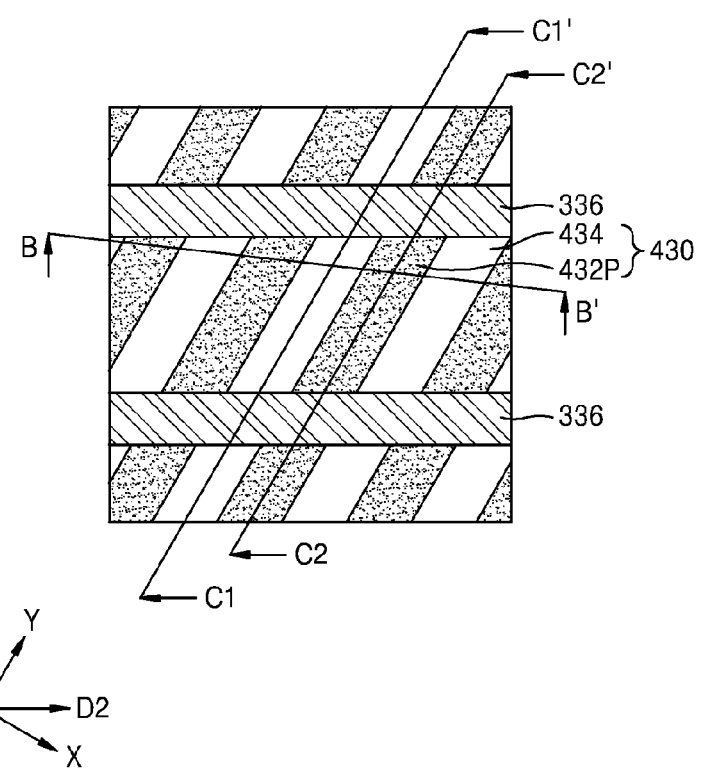
Figure 22B:
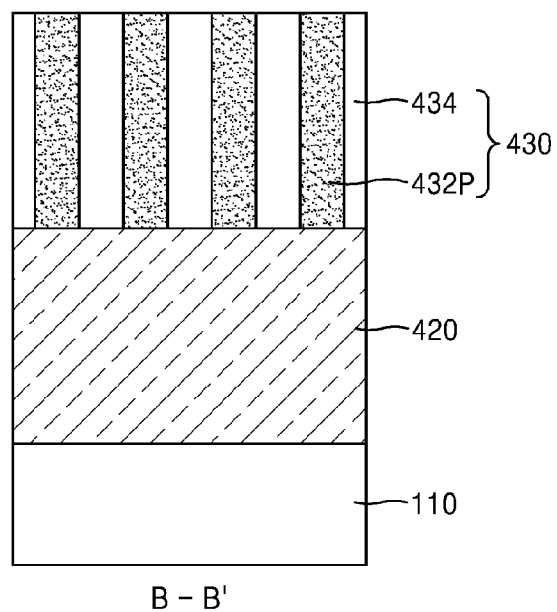
Figure 22C:
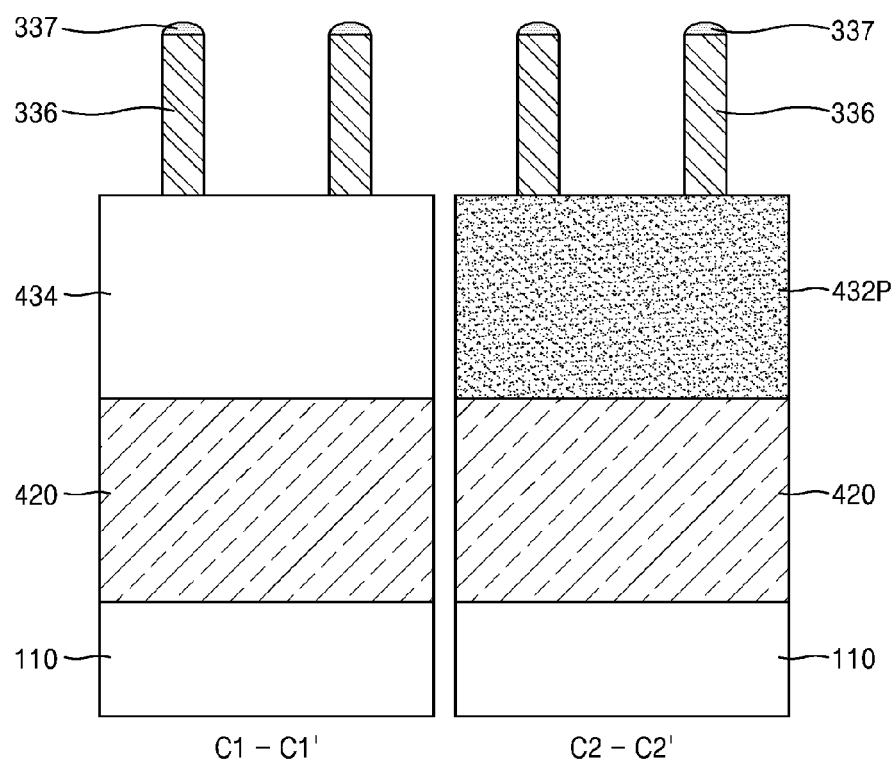

Referring to FIGS. 22A to 22C, a plurality of second reference line patterns 336 extending parallel to one another in the second direction (D2 direction) may be formed on the first level pattern layer 430 in a similar manner as described above with reference to FIGS. 9A and 9B.

The plurality of second reference line patterns 336 may be formed using a plurality of reference mask patterns 337 as an etch mask. Although not shown in FIG. 22A, the plurality of reference mask patterns 337 remaining after the formation of plurality of second reference line patterns 336 is shown in FIGS. 22B and 22C.

In some examples, the plurality of second reference line patterns 336 may be formed of an SOH material, and the plurality of reference mask patterns 337 may be formed of an SiON material.

Figure 23A:
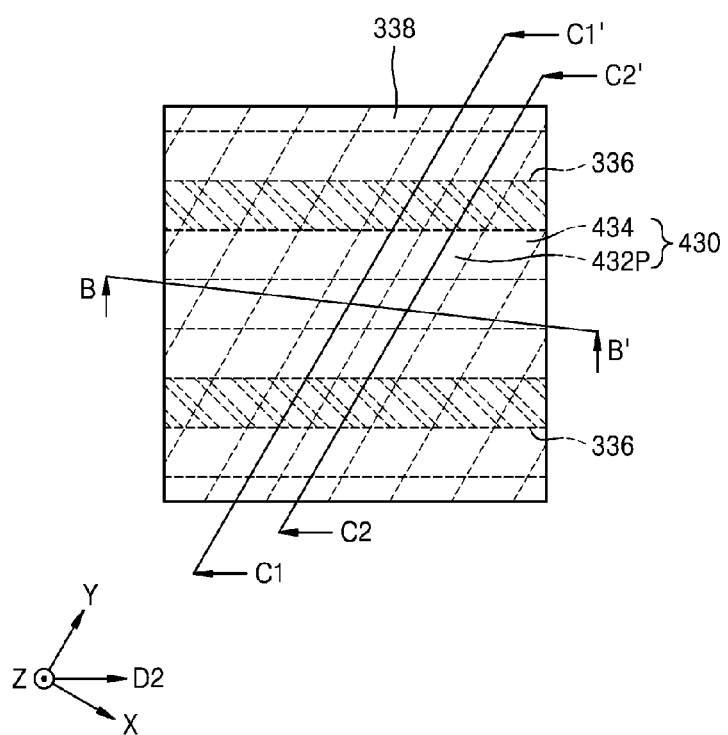
Figure 23B:
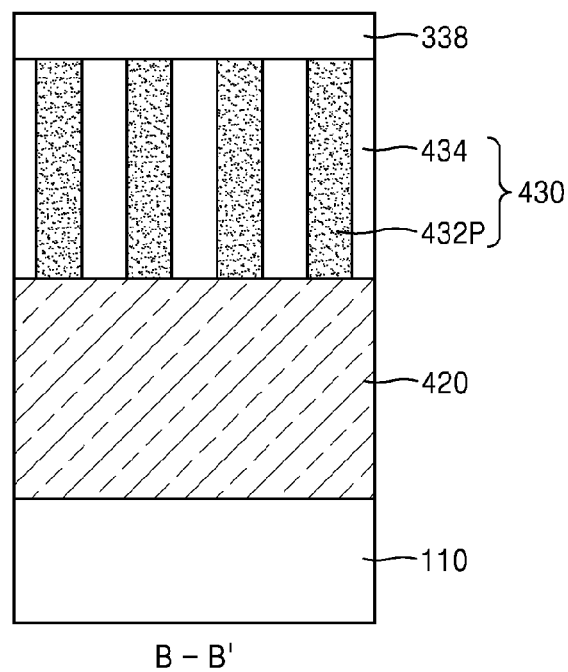
Figure 23C:
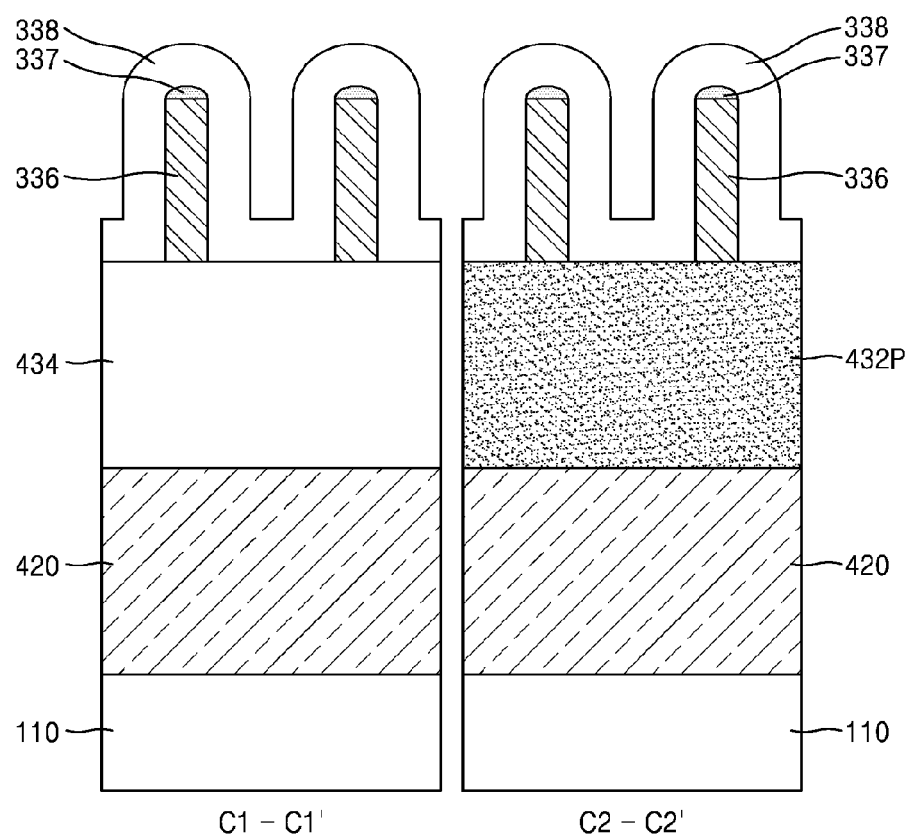

Referring to FIGS. 23A to 23C, a spacer layer 338 may be formed on the first level pattern layer 430 to a uniform thickness and cover side surfaces and an upper surface of each of the plurality of second reference line patterns 336.

Figure 24A:
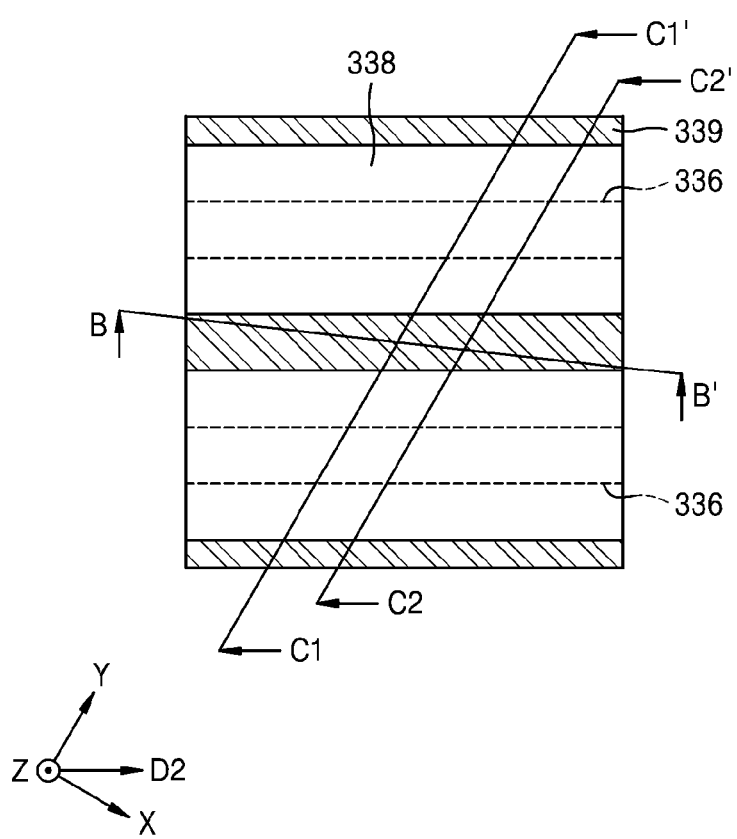
Figure 24B:
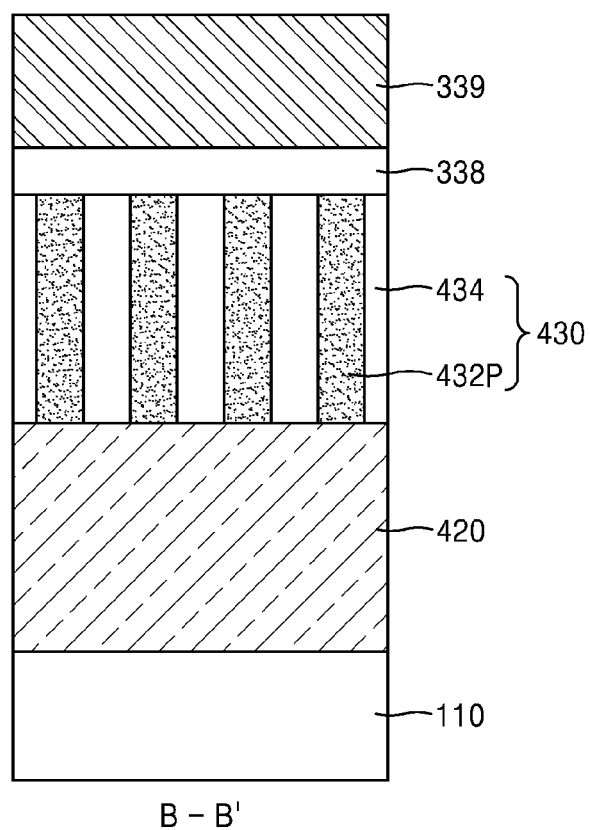
Figure 24C:
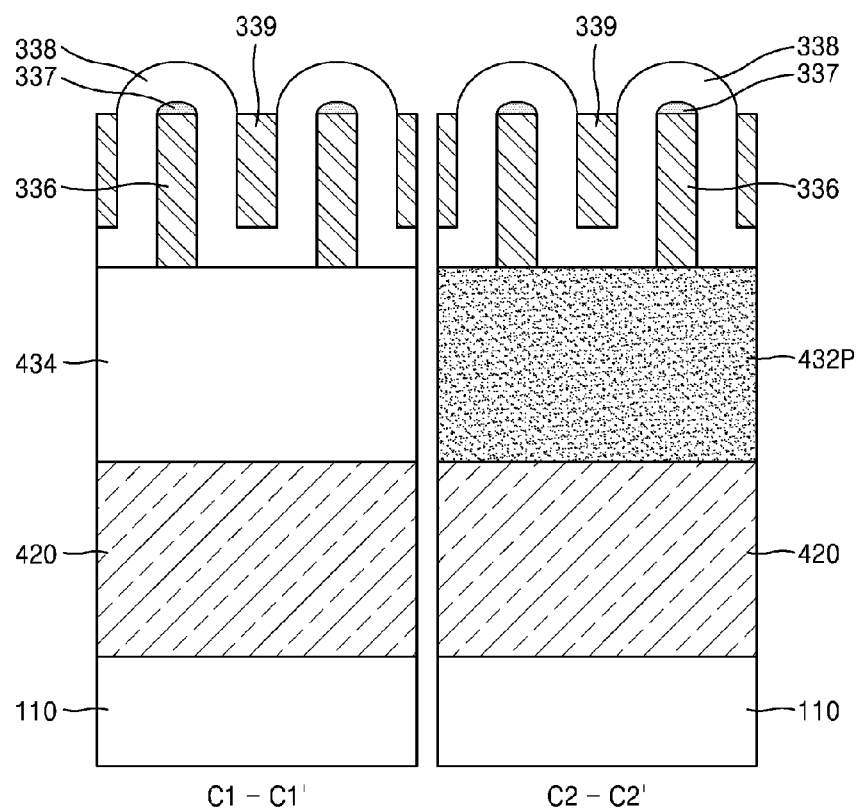

Referring to FIGS. 24A to 24C, a plurality of doubling patterns 339 alternately arranged with the plurality of second reference line patterns 336 may be formed on a resultant structure with the spacer layer 338 formed thereon in a similar manner as described above with reference to FIGS. 11A to 11C.

Figure 25A:
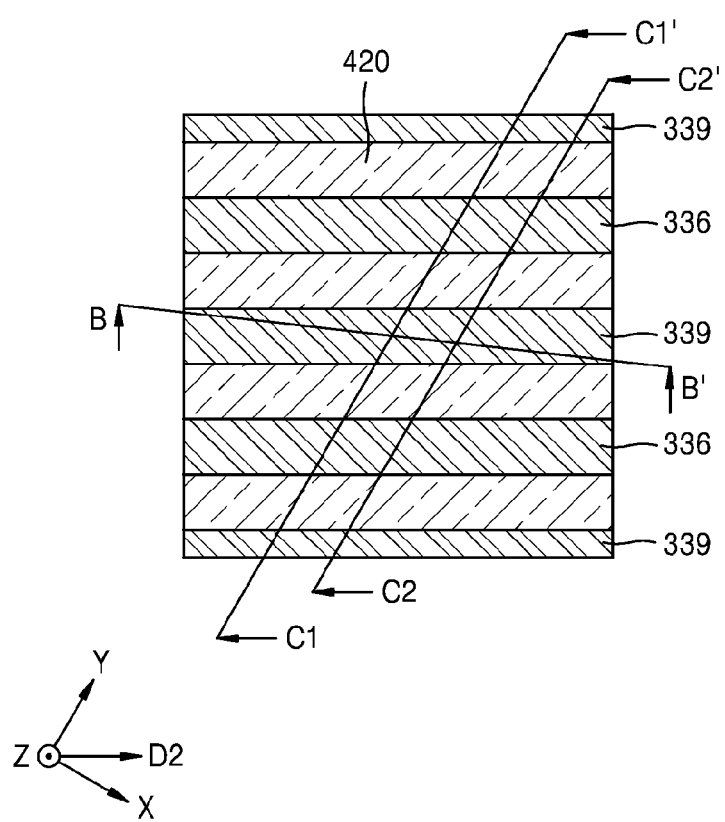
Figure 25B:
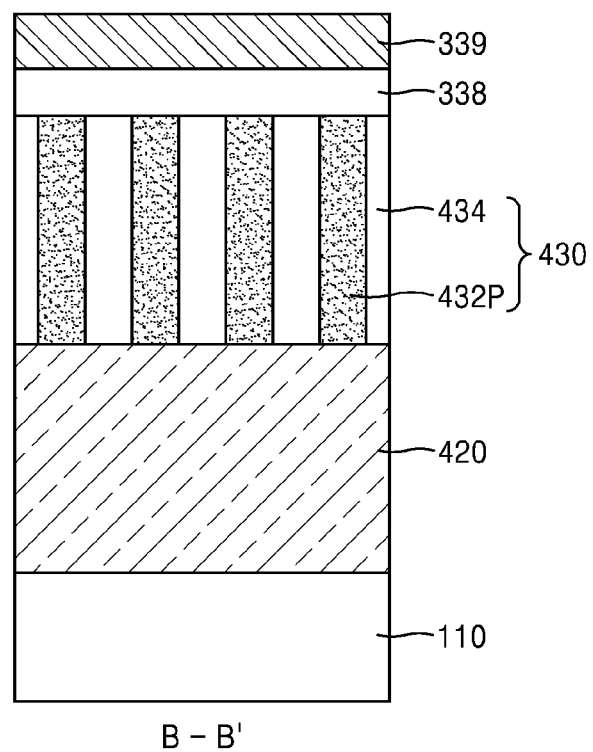
Figure 25C:
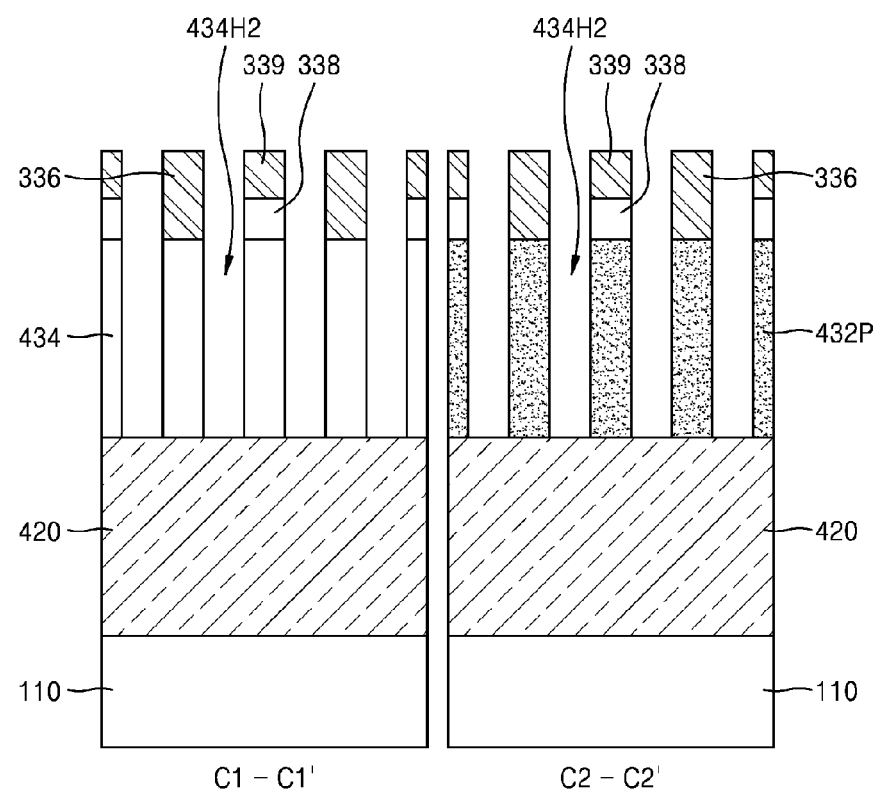

Referring to FIGS. 25A to 25C, the spacer layer 338 may be etched using the plurality of second reference line patterns 336 and the plurality of doubling patterns 339 as an etch mask, to thereby partially expose the plurality of first line patterns 432P and the plurality of first space burying patterns 434 of the first level pattern layer 430. Subsequently, a plurality of second direction pattern spaces 434H2 in a line pattern continuously extending in the second direction (D2 direction) may be formed in the first level pattern layer 430 by removing the exposed portions of the plurality of first line patterns 432P and the plurality of first space burying patterns 434 together with the plurality of second reference line patterns 336 and the plurality of doubling patterns 339 as an etch mask.

The plurality of second direction pattern spaces 434H2 may correspond to the plurality of second direction pattern spaces 134H2 illustrated in FIG. 4B.

Through the plurality of second direction pattern spaces 434H2, an upper surface of the feature layer 420 may be exposed.

Figure 26A:
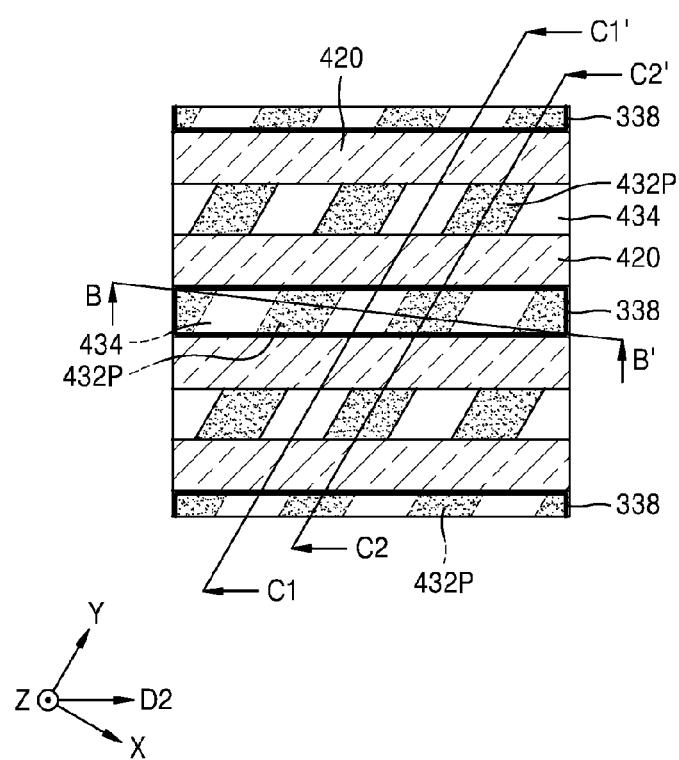
Figure 26B:
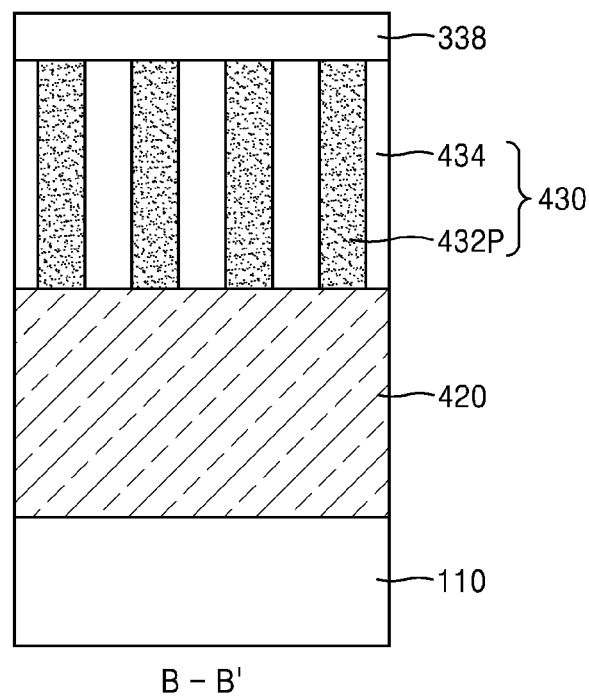
Figure 26C:
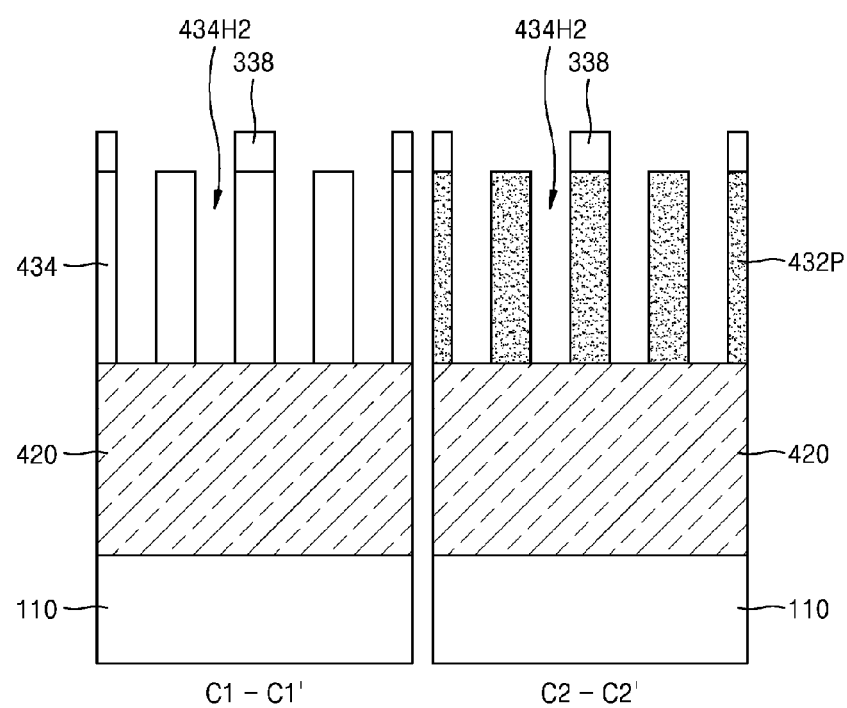

Referring to FIGS. 26A to 26C, the plurality of second reference line patterns 336 and the plurality of doubling patterns 339 remaining on the first level pattern layer 430 (see FIGS. 25A to 25C) may be removed, to thereby expose the upper surface of the first level pattern layer 430 and an upper surface of the remaining spacer layer 338.

Figure 27A:
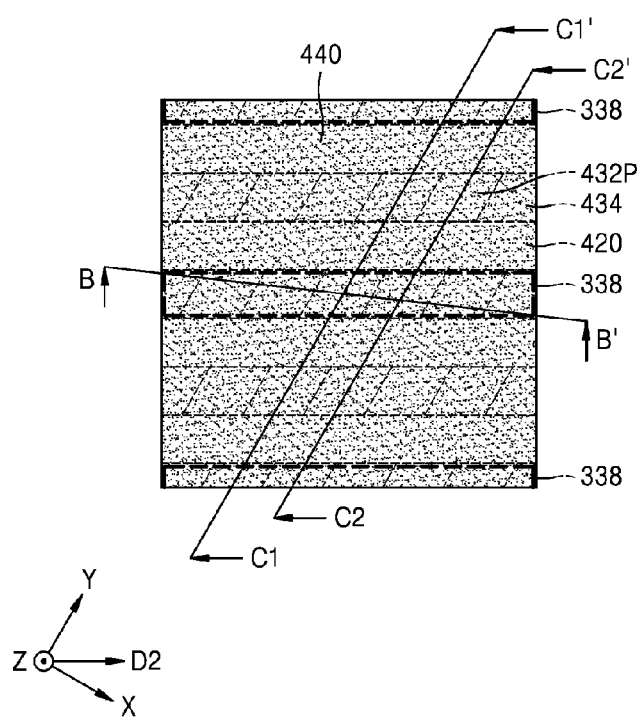
Figure 27B:
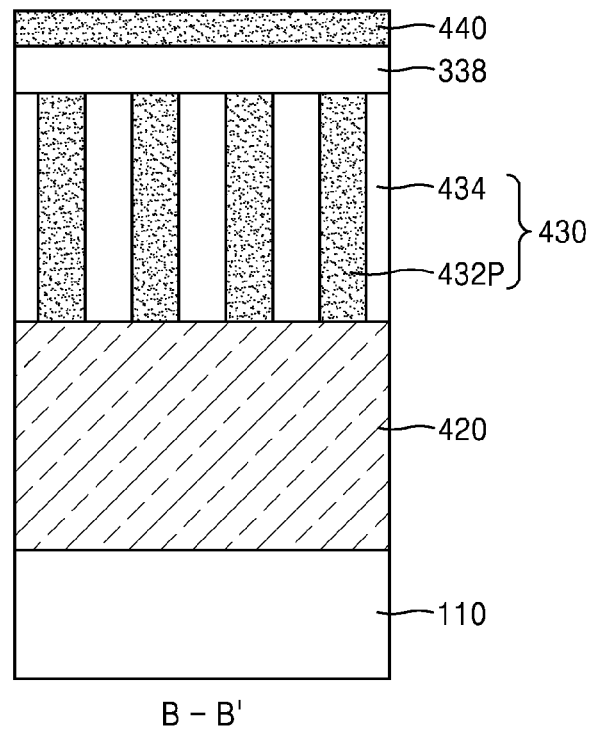
Figure 27C:
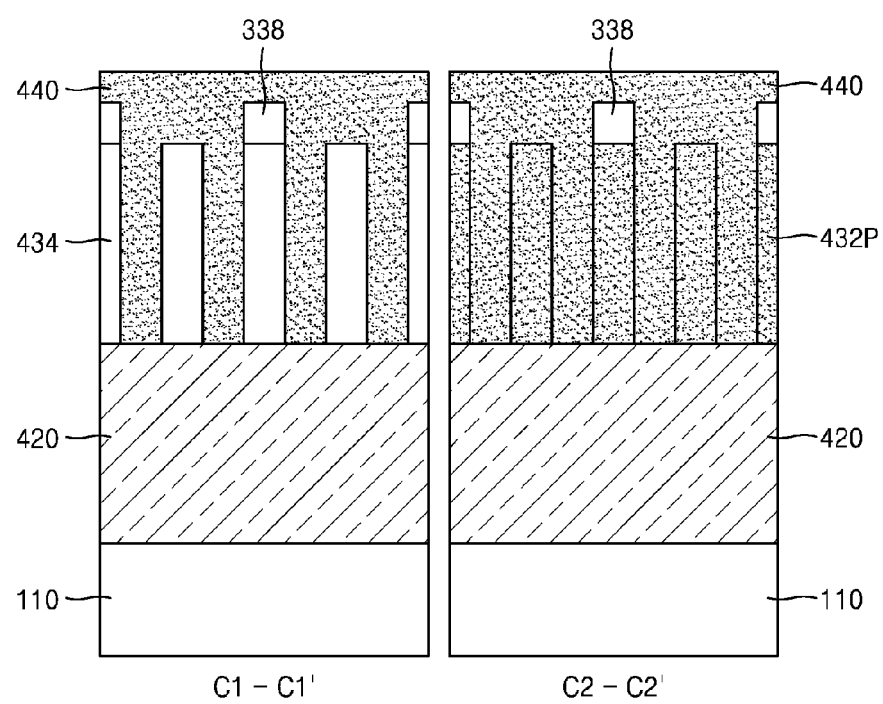

FIGS. 27A to 27C are views for illustrating a process of forming a second burying film 440, according to process P40 of FIG. 1, wherein the second burying film 440 may correspond to the second burying film 240 described above with reference to FIG. 4C.

Referring to FIGS. 27A to 27C, a second burying film 440 filling the plurality of second direction pattern spaces 434H2 (see FIGS. 26A to 26C) may be formed. In some examples, the second burying film 440 may be formed of polysilicon.

Figure 28A:
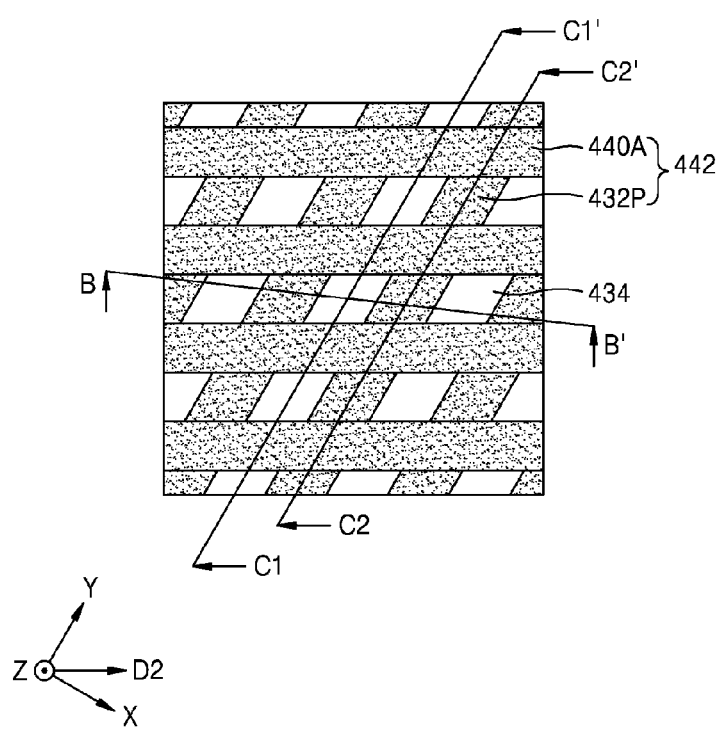
Figure 28B:
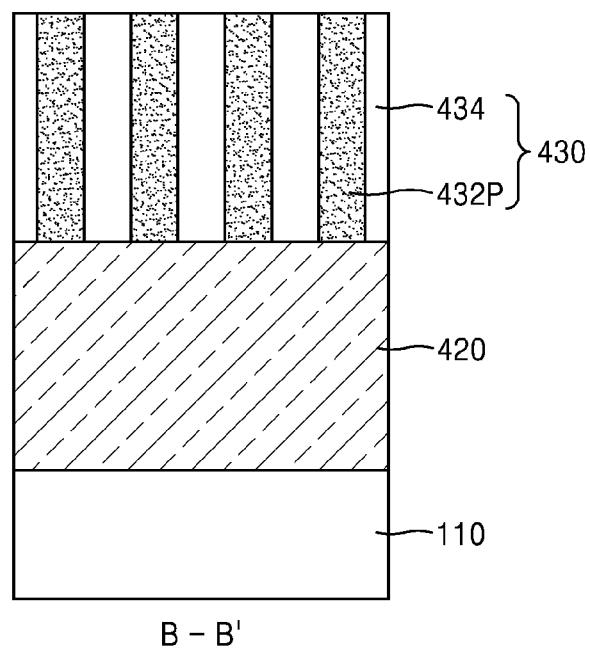
Figure 28C:
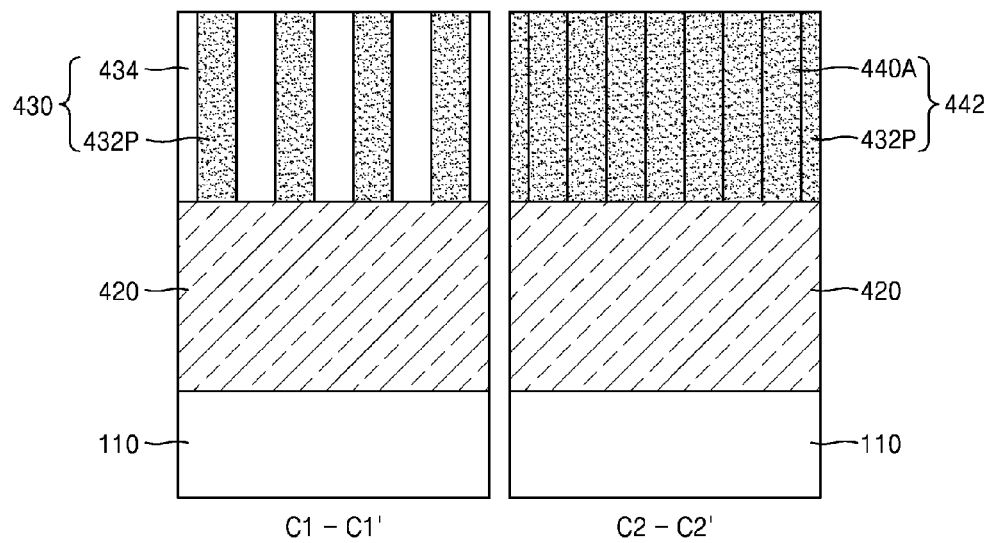

FIGS. 28A to 28C are views for illustrating a process of forming a network structure pattern 442 as a combined structure of the plurality of first line patterns 432P and the planarized second burying film 440 by planarizing an upper surface of the second burying film 440, according to process P50 of FIG. 1 in a similar manner as described with reference to FIGS. 28A to 28C.

Referring to FIGS. 28A to 28C, the remaining spacer layer 338 and the second burying film 440 (see FIGS. 27A to 27C) may be planarized in a similar manner described above with reference to FIGS. 15A to 15C so that the upper surface of the plurality of first line pattern 432P is exposed, and thus, the plurality of first line patterns 432P may remain and alternate with the plurality of second space burying patterns 440A, and the plurality of first line patterns 432P may end up having a similar height as the plurality of second space burying patterns 440A.

As a result, the network structure pattern 442 as a combination of the plurality of first line patterns 432P and the plurality of second space burying patterns 440A may be obtained. The upper surface of the plurality of first space burying patterns 434 may be exposed through the network structure pattern 442.

In some examples, the remaining spacer layer 338 and the second burying film 440 may be planarized using a CMP process or an etchback process.

Figure 29A:
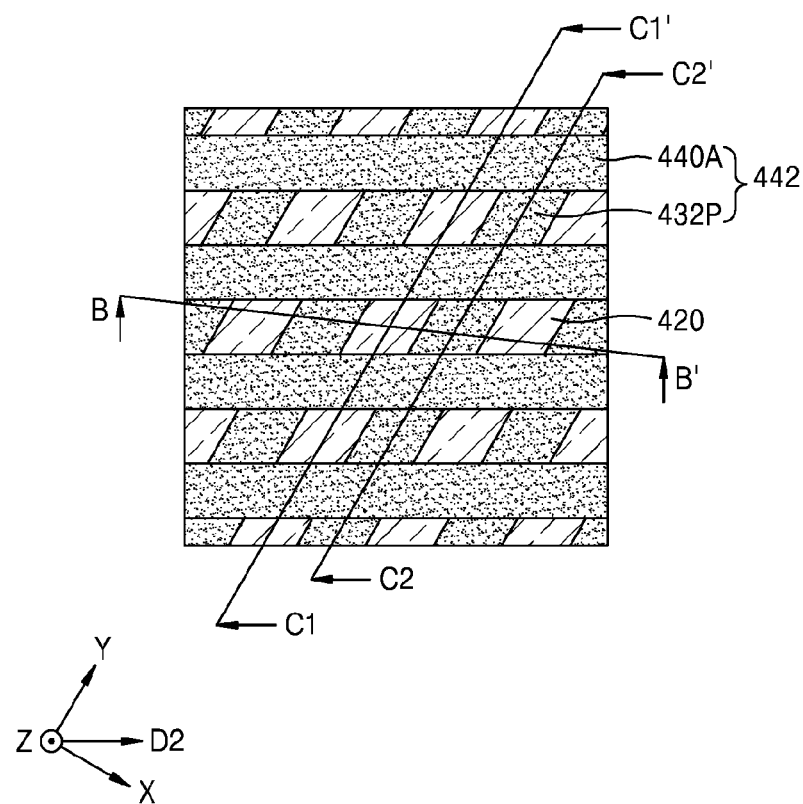
Figure 29B:
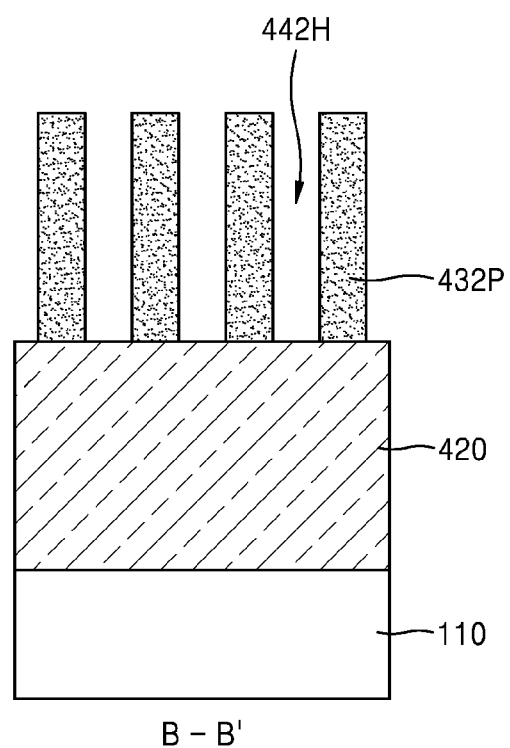
Figure 29C:
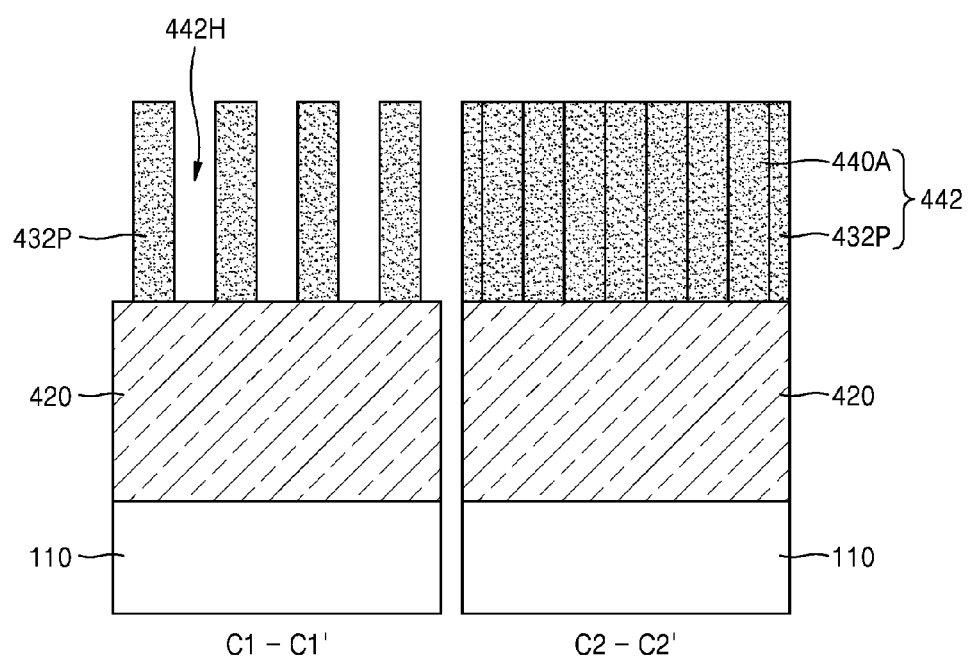

FIGS. 29A to 29C are views for illustrating a process of forming a plurality of etch holes 442H passing through the network structure pattern 442 by removing portions of the plurality of first space burying patterns 434 (see FIG. 28A) exposed through the network structure pattern 442, according to process P60 of FIG. 1 in a similar manner as described above with reference to FIG. 4E.

The plurality of first space burying patterns 434 may be removed using a wet etching process or a dry etching process based on a difference in etch selectivity between the plurality of first space burying patterns 434 and the network structure pattern 442.

Figure 30A:
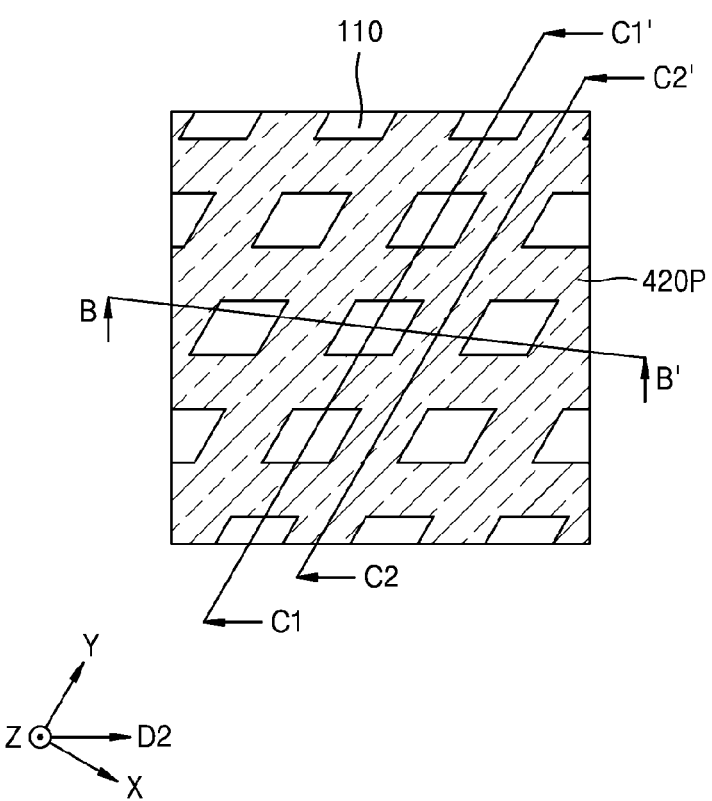
Figure 30B:
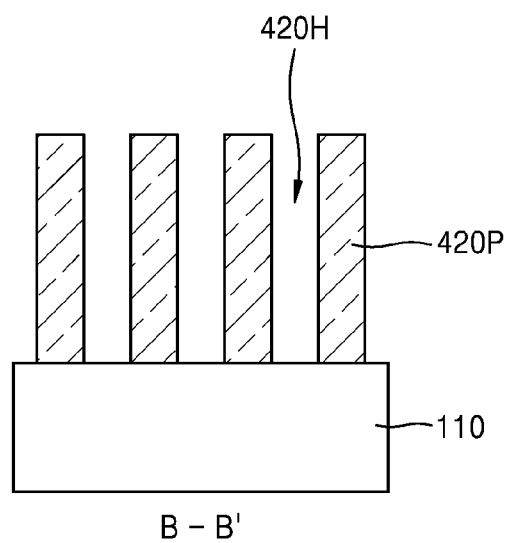
Figure 30C:
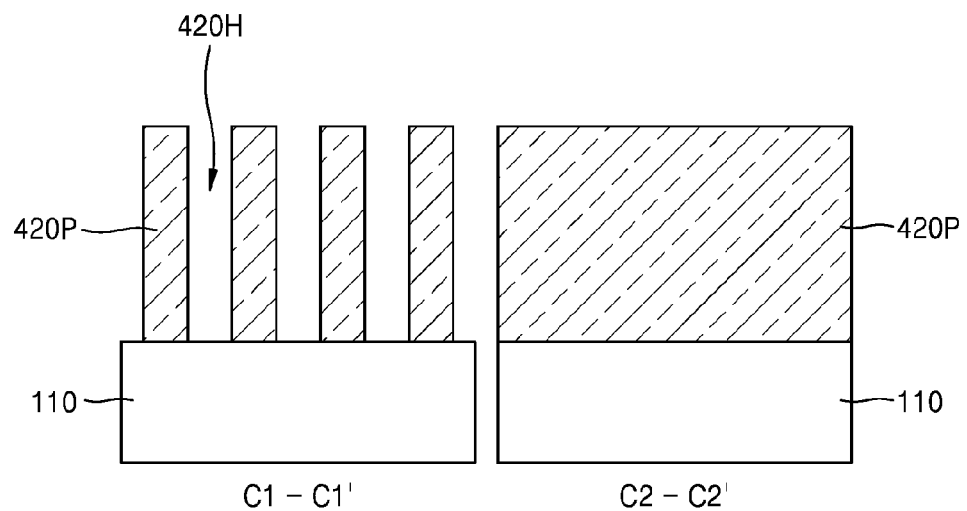

FIGS. 30A to 30C are views for illustrating a process of forming a feature pattern 420P having a plurality of holes 420H by etching portions of the feature layer 420 exposed through the plurality of etch holes 442H (see FIG. 29A) with the network structure pattern 442 (see FIG. 29A) as an etch mask, according to process P70 of FIG. 1 in a similar manner as described above with reference to FIG. 4F.

Referring to FIGS. 30A to 30C, the feature pattern 420P having the plurality of holes 420H arranged as a hexagonal array on the X-Y plane may be formed by etching portions of the feature layer 420 exposed through the plurality of etch holes 442H with the network structure pattern 442 as an etch mask.

The feature pattern 420P may correspond to the feature pattern 120P1 illustrated in FIG. 3 or the feature pattern 120P2 illustrated in FIG. 4F.

FIGS. 31A to 46C are views for illustrating methods of forming patterns, according to examples of the inventive concept. In particular, FIGS. 31A, 32A, ..., and FIG. 46A sequentially illustrate plan views of methods of forming patterns, according to examples of the inventive concept. FIGS. 31B, 32B, ..., and 46B are cross-sectional views taken along line B-B', line B1-B1', and line B2-B2' in FIGS. 31A, 32A, ..., and 46A, respectively. FIGS. 31C, 32C, ..., and 46C are cross-sectional views taken along line C-C', line C1-C1', and line C2-C2' in FIGS. 31A, 32A, ..., and 46A, respectively.

In FIGS. 31A to 46C, the same reference numerals as those in FIGS. 2A to 30C represent the same elements, and thus a detailed description thereof will not be provided here.

FIGS. 31A to 35C are views for illustrating a process of forming a first level pattern layer 530 on the feature layer 420 on the substrate 110, according to process P20 of FIG. 1, wherein the first level pattern layer 530 may correspond to the first level pattern layer 130 described above with reference to FIG. 2A.

Figure 31A:
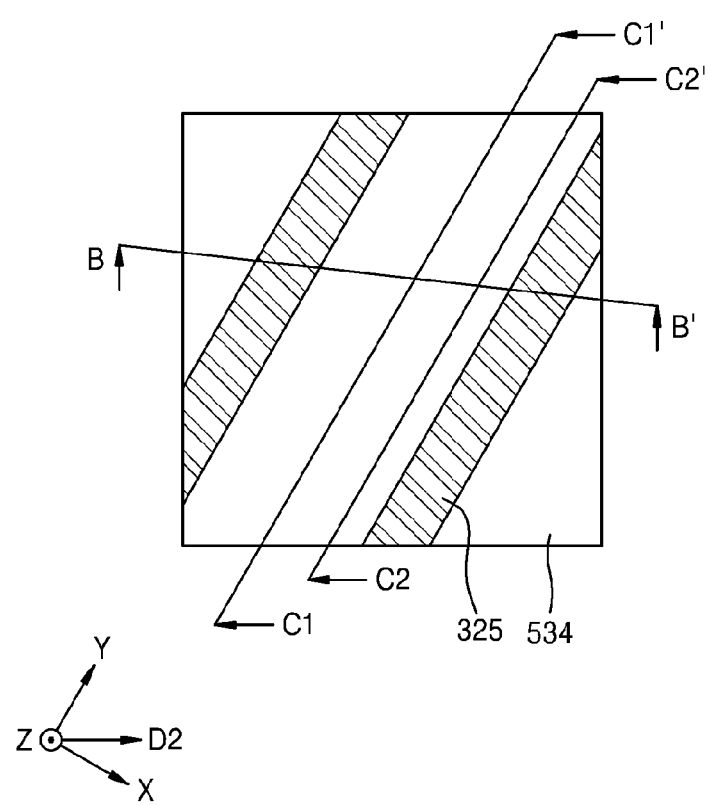
Figure 31B:
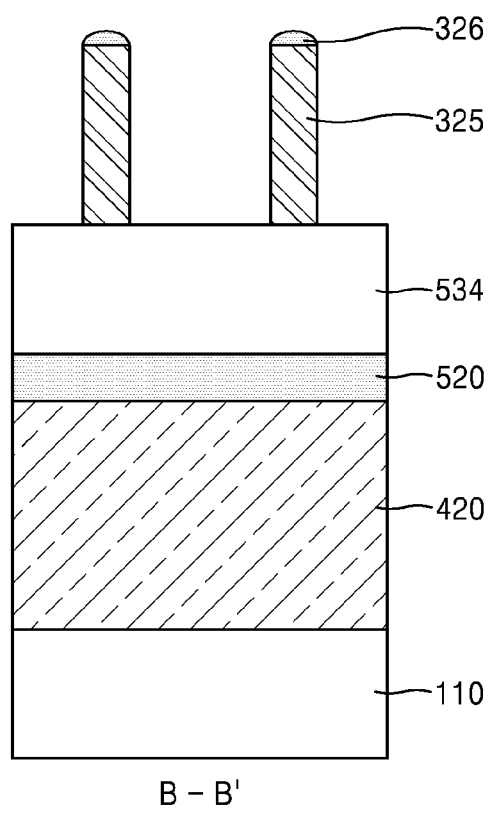
FIGS. 31B, 32B, . . . , and 46B are cross-sectional views taken along line B-B', line B1-B1', and line B2-B2' in FIGS. 31A, 32A, . . . , and 46A, respectively.
Figure 31C:
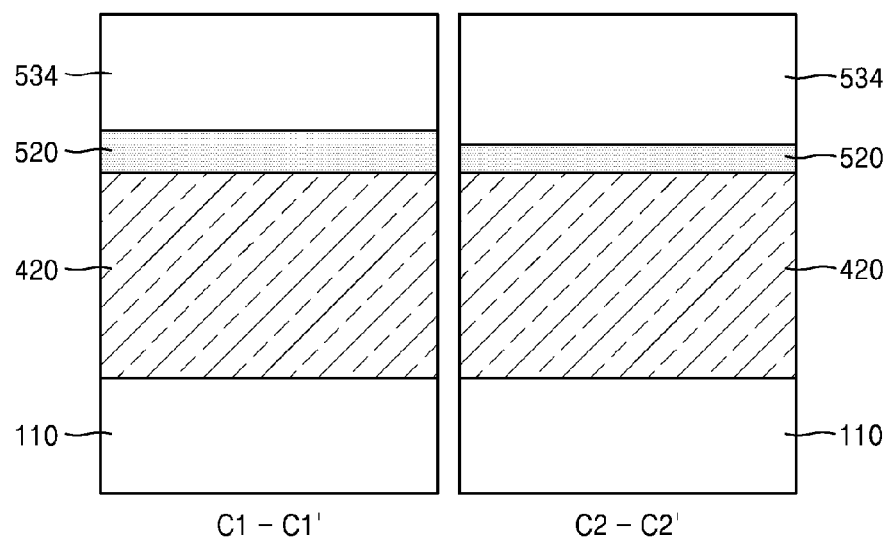
FIGS. 31C, 32C, . . . , and 46C are cross-sectional views taken along line C-C', line C1-C1', and line C2-C2' in FIGS. 31A, 32A, . . . , and 46A, respectively.

Referring to FIGS. 31A to 31C, the feature layer 420 may be formed on the substrate 110, and a lower mask layer 520 and a first space burying layer 534 may be formed on the feature layer 420. Next, a plurality of first reference line patterns 325 may be formed on the first space burying layer 534.

The plurality of first reference line patterns 325 may be formed using a plurality of reference mask patterns 326 as an etch mask. Although not shown in FIG. 31A, the plurality of reference mask patterns 326 remaining after the formation of the plurality of first reference line patterns 325 are shown in FIGS. 31B and 31C.

A detailed structure of the feature layer 420 may be the same as described above with reference to FIGS. 18A to 18C.

In some examples, the first space burying layer 534 may be formed of a silicon oxide material, the plurality of first reference line patterns 325 may be formed of an SOH material, and the plurality of reference mask patterns 326 may be formed of an SiON material.

Figure 32A:
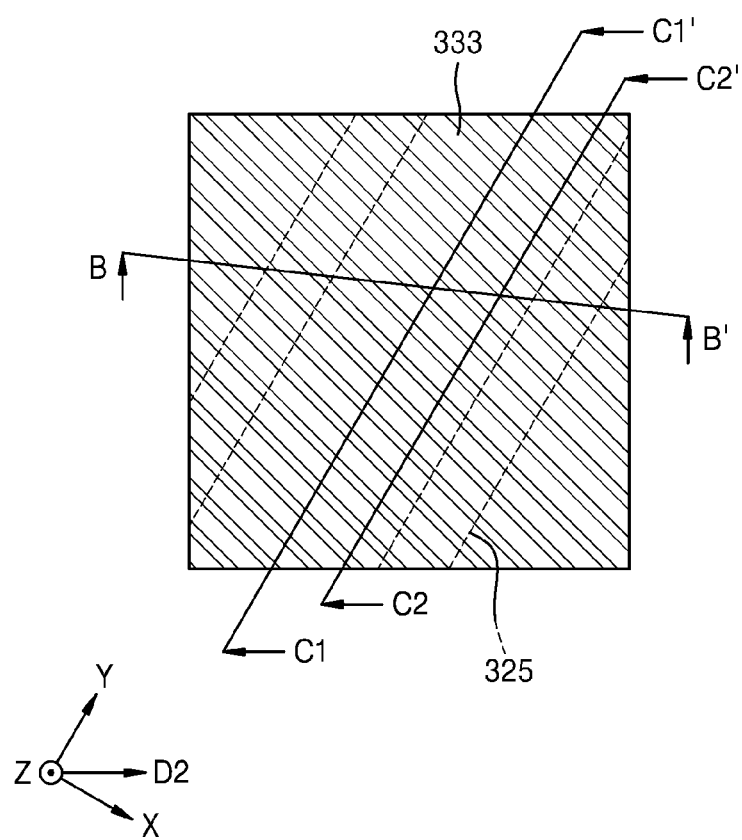
Figure 32B:
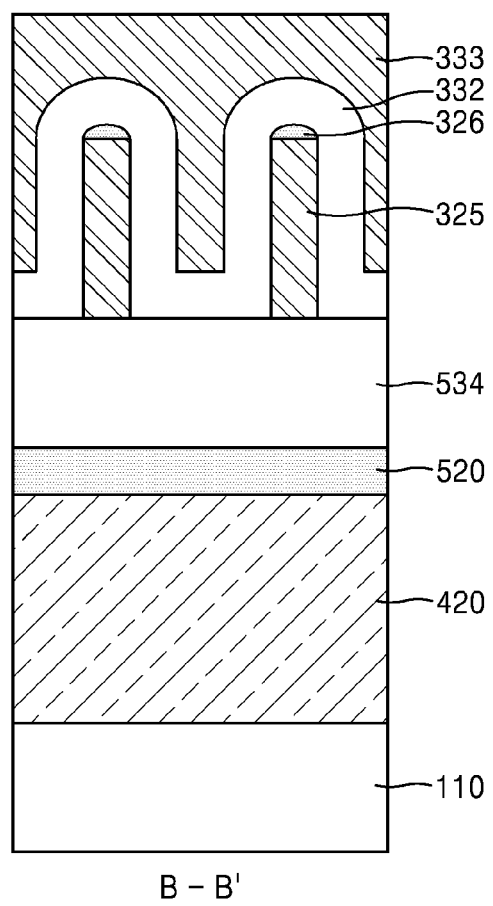
Figure 32C:
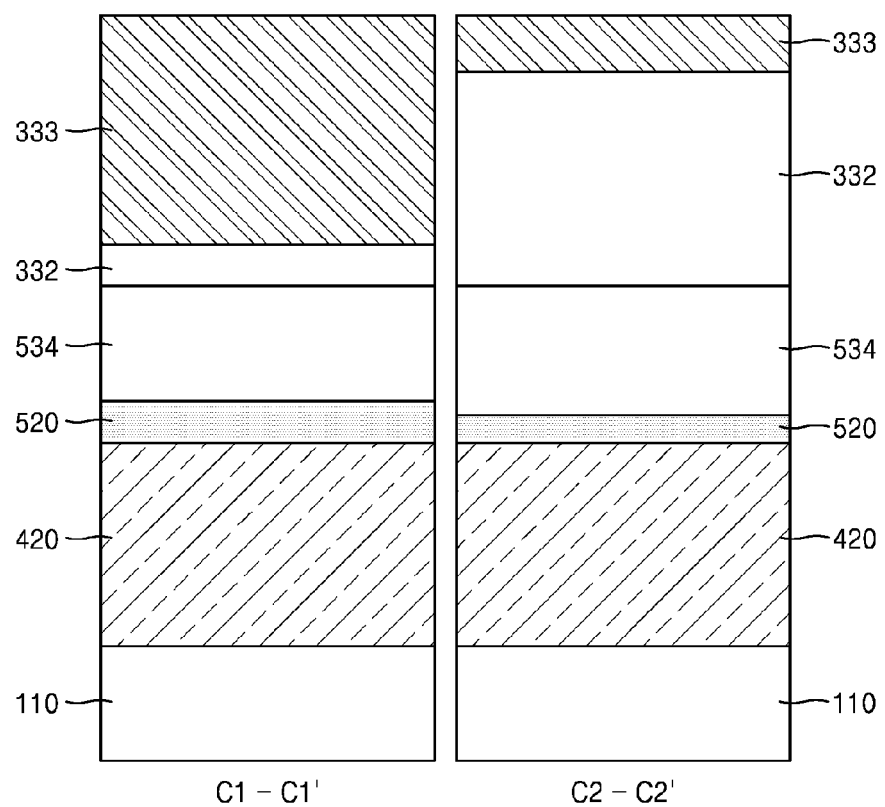

Referring to FIGS. 32A to 32C, a spacer layer 332 may be formed on the first space burying layer 534 to a uniform thickness and cover side surfaces and an upper surface of each of the plurality of first reference line patterns 325, in a similar manner as described with reference to FIGS. 6A to 6C.

Subsequently, a space burying layer 333 filling spaces in the plurality of first reference line patterns 325 may be formed on the spacer layer 332.

The space burying layer 333 may be formed of the same material as the material of the plurality of first reference line patterns 325. In some examples, the space burying layer 333 may be formed of an SOH material.

Figure 33A:
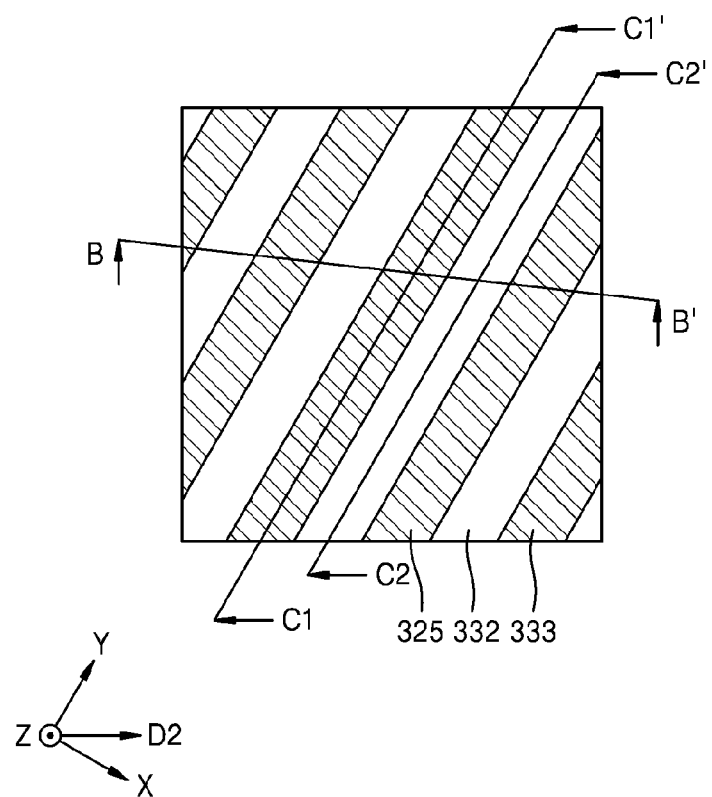
Figure 33B:
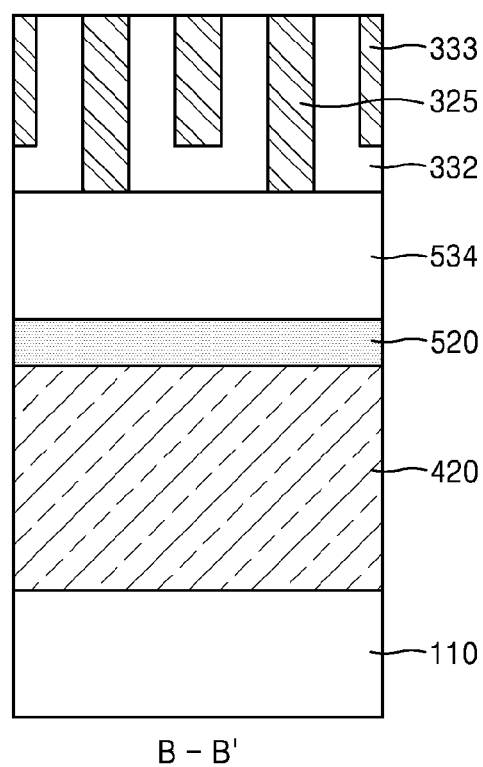
Figure 33C:
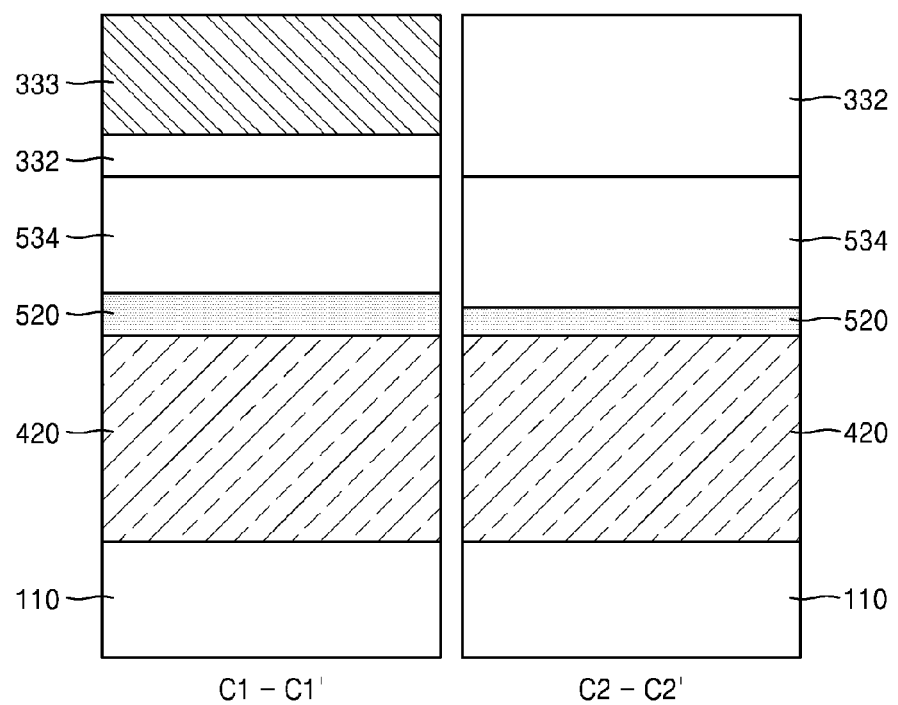

Referring to FIGS. 33A to 33C, the space burying layer 333 and the spacer layer 332 may be partially etched back from upper surfaces thereof to expose an upper surface of the plurality of first reference line patterns 325.

After the exposure of the plurality of first reference line patterns 325, the upper surface of the plurality of first reference line patterns 325, the upper surface of the space burying layer 333, and the upper surface of the spacer layer 332 may be disposed at similar levels, i.e., may be substantially coplanar.

Figure 34A:
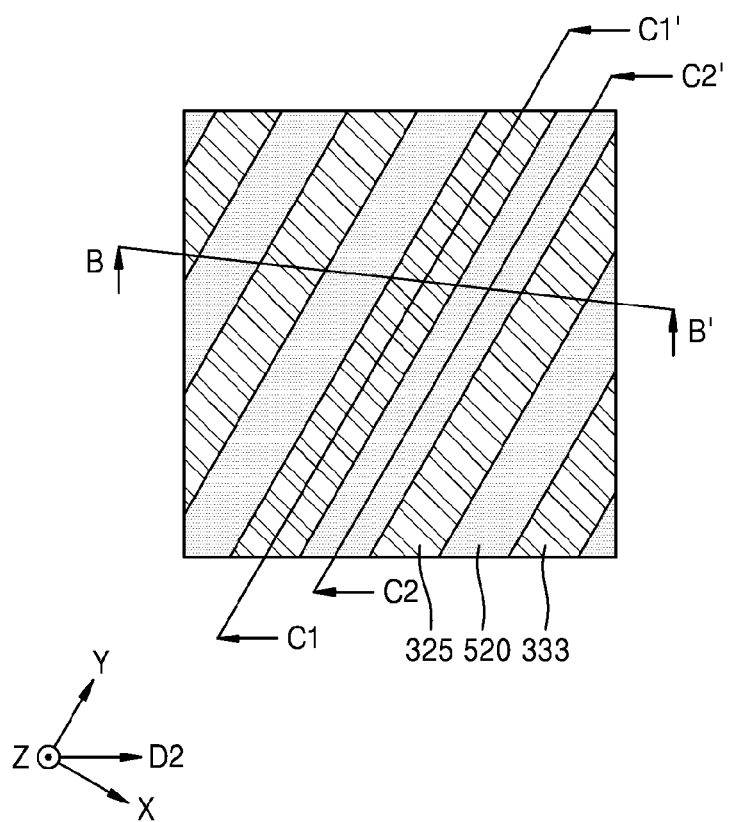
Figure 34B:
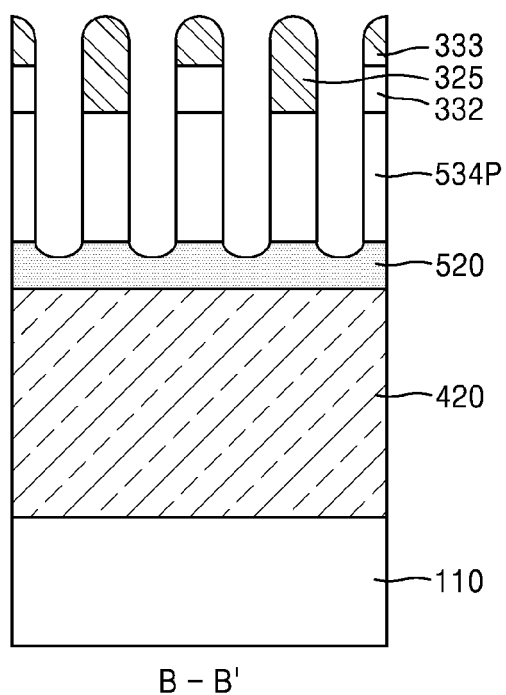
Figure 34C:
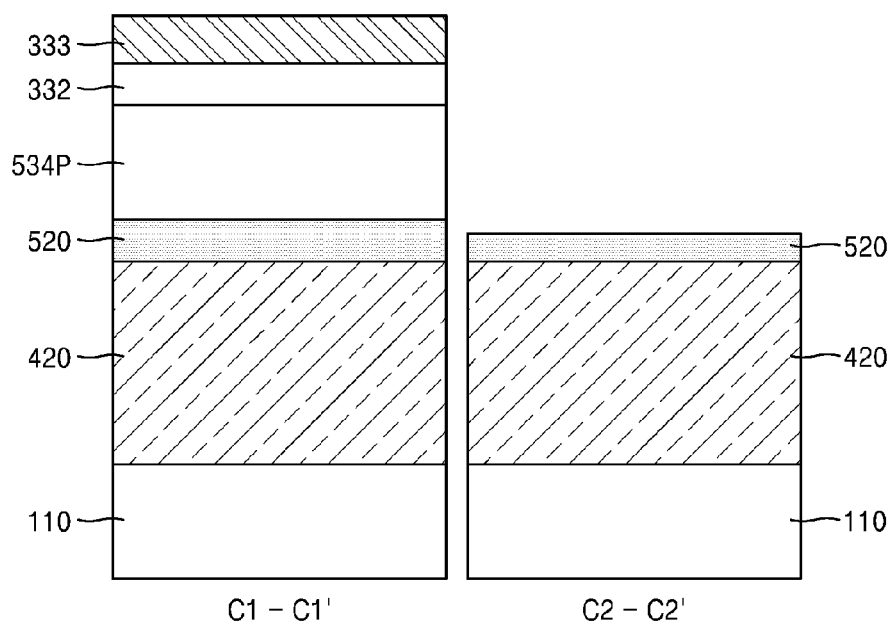

Referring to FIGS. 34A to 34C, the spacer layer 332 and the first space burying layer 534 may be etched using the remaining space burying layer 333 and the plurality of first reference line patterns 325 as an etch mask, to thereby form a plurality of first space burying patterns 534P extending parallel to one another in the first direction (Y direction).

After the formation of the plurality of first space burying patterns 534P, the lower mask layer 520 may be exposed through the spaces between the first space burying patterns 534P.

The etching process for forming the plurality of first space burying patterns 534P may be continuously performed, so that the lower mask layer 520 may also be partially etched away.

Figure 35A:
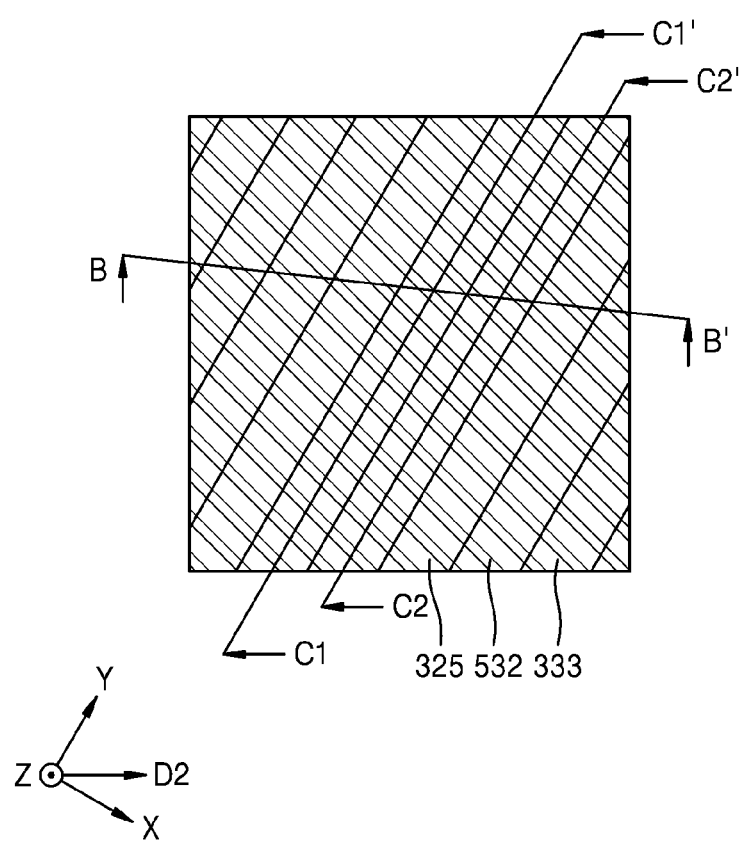
Figure 35B:
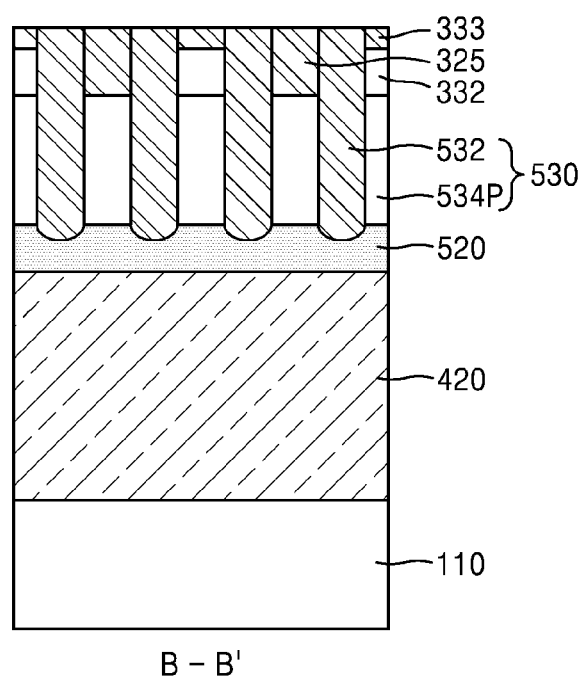
Figure 35C:
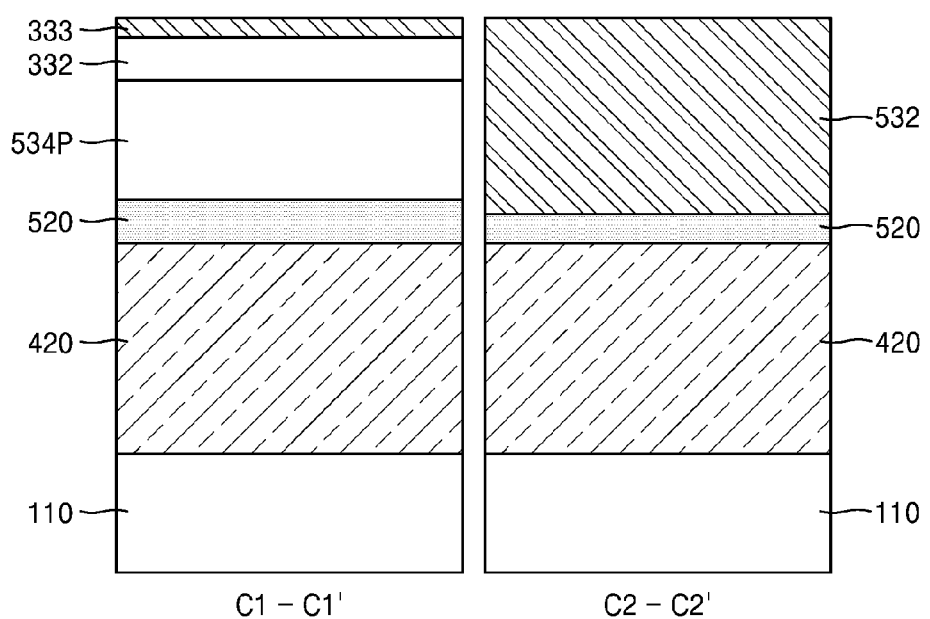

Referring to FIGS. 35A to 35C, a plurality of first line patterns 532 filling the spaces between the first space burying patterns 534P and extending parallel to one another in the first direction (Y direction) may be formed.

To form the plurality of first line patterns 532, after forming a first line layer (not shown) to a thickness that is sufficient enough to fill the spaces in the plurality of first space burying patterns 534P, upper surfaces of the first line layer, the remaining space burying layer 333, and the plurality of first reference line patterns 325 may be planarized using a CMP or etchback process. Accordingly, the upper surface of the plurality of first line patterns 532 may be higher than that of the plurality of first space burying patterns 534P.

The plurality of first line patterns 532 may be formed of an SOH material.

The plurality of first line patterns 532 and the plurality of first space burying patterns 534P may constitute the first level pattern layer 530. The first level pattern layer 530 may correspond to the first level pattern layer 130 illustrated in FIG. 2A.

FIGS. 36A to 41C are views for illustrating a process of forming a plurality of second direction pattern spaces 534H1 intermittently extending in the second direction (D2 direction) in the first level pattern layer 530, according to process P30 of FIG. 1 in a similar manner as described above with reference to FIG. 2B.

Figure 36A:
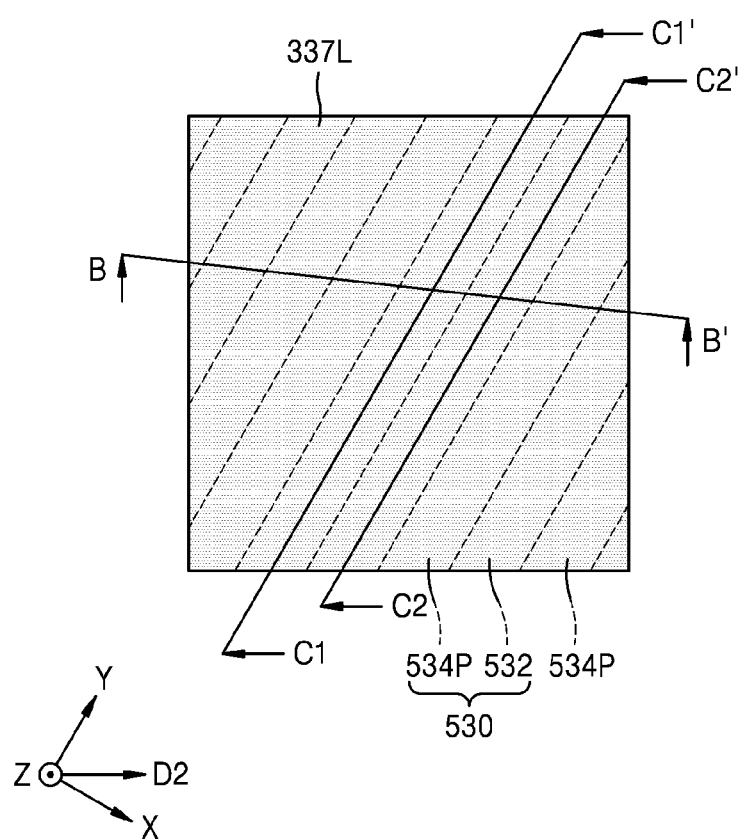
Figure 36B:
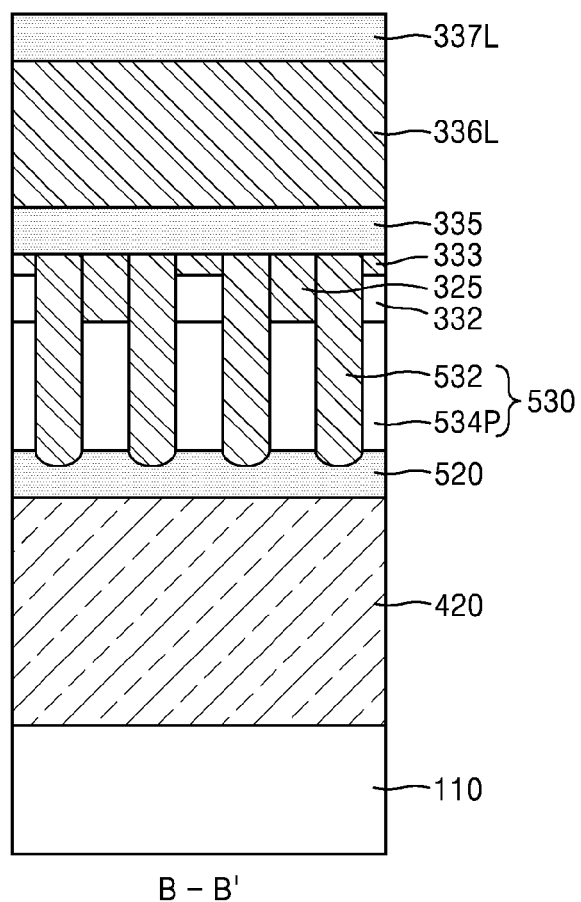
Figure 36C:
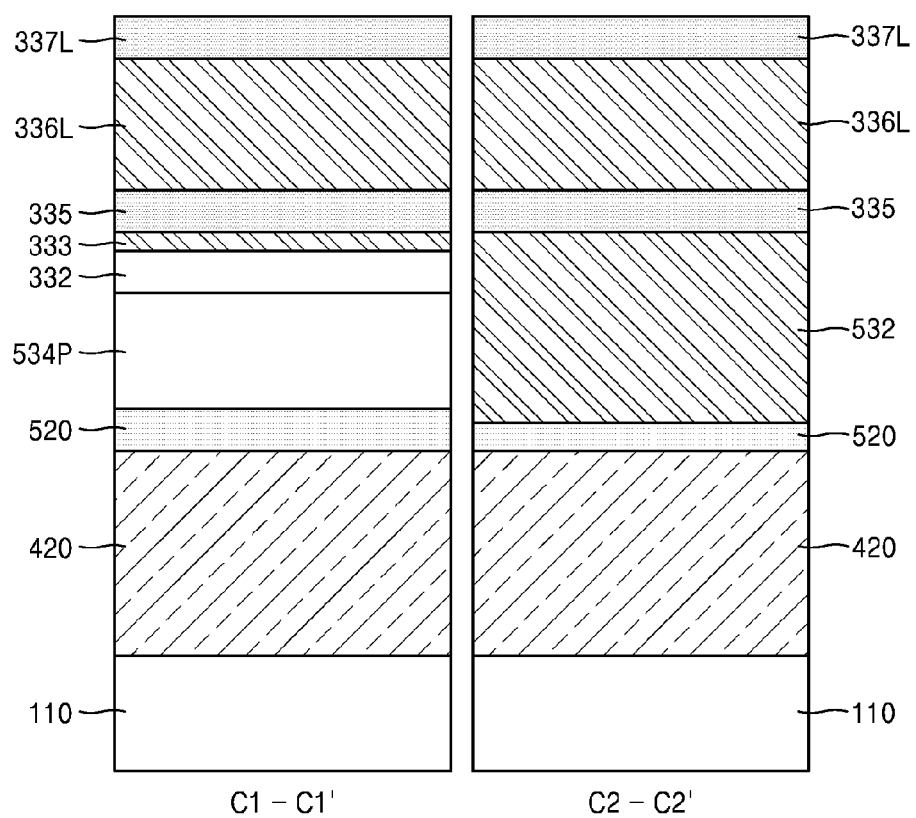

Referring to FIGS. 36A to 36C, an upper mask layer 335, a second reference line layer 336L, and a reference mask layer 337L may be sequentially formed on the first level pattern layer 530.

In some examples, the upper mask layer 335 may be formed of an SiON material, the second reference line layer 336L may be formed of an SOH material, and the reference mask layer 337L may be formed of an SiON material.

Figure 37A:
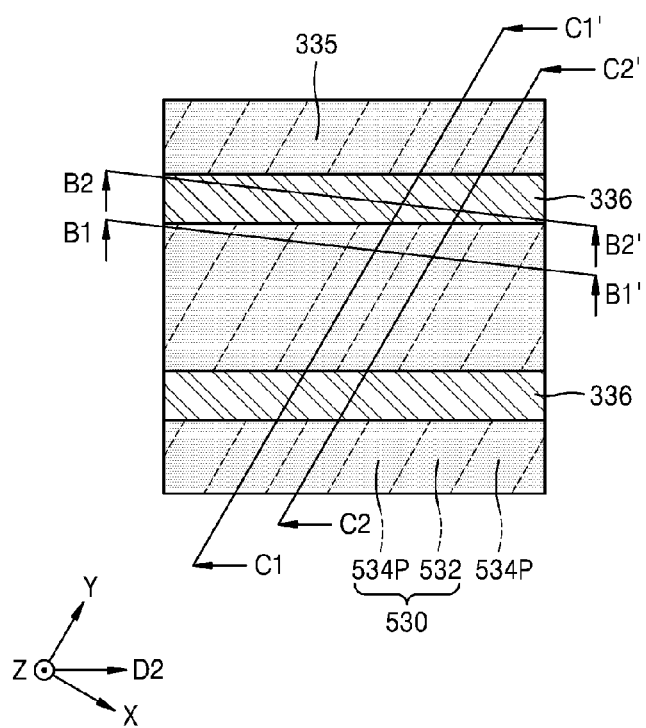
Figure 37B:
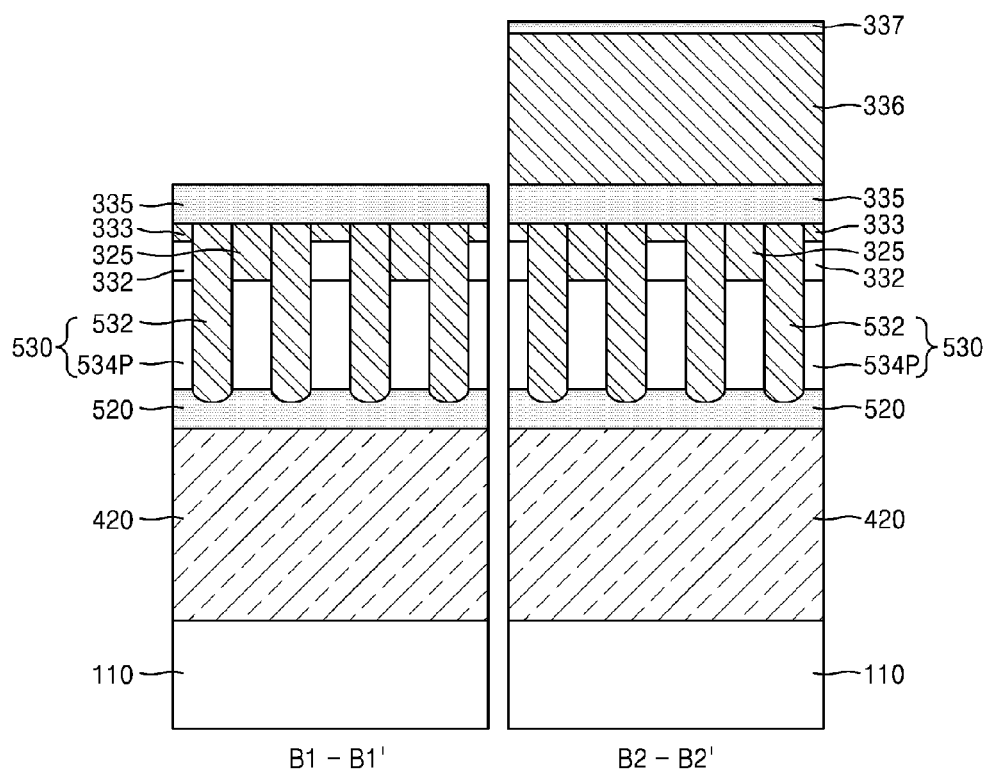
Figure 37C:
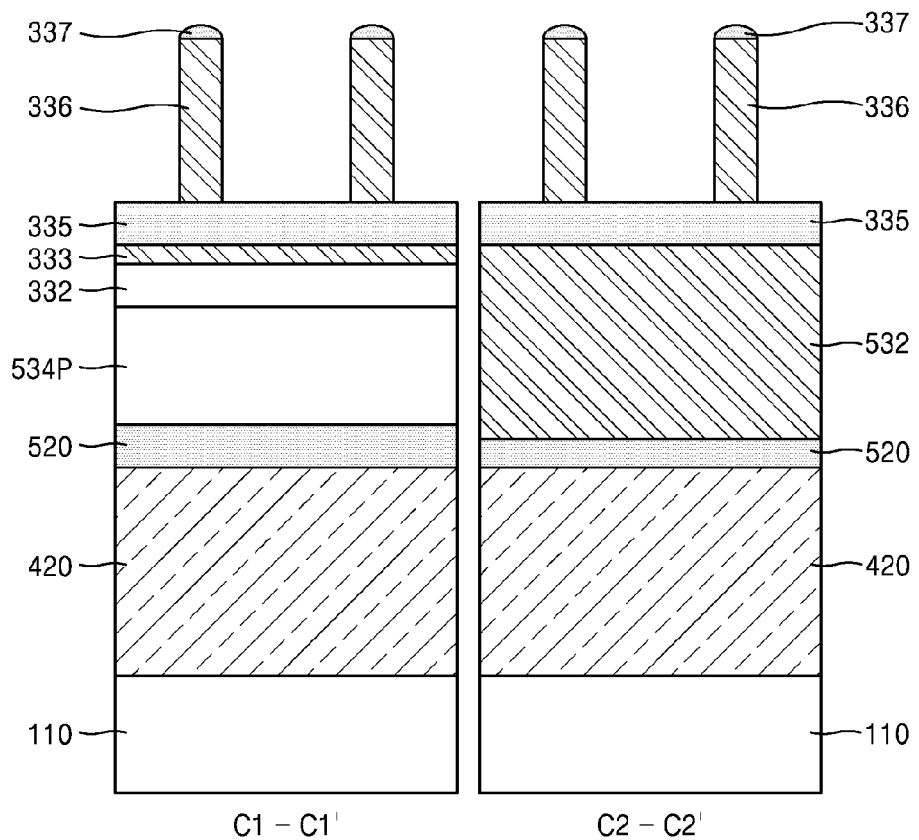

Referring to FIGS. 37A to 37C, after forming a plurality of reference mask patterns 337 by patterning the reference mask layer 337L, the second reference line layer 336L may be etched using the plurality of reference mask patterns 337 as an etch mask, to thereby form a plurality of second reference line patterns 336 extending parallel to one another in the second direction (D2 direction).

Although not shown in FIG. 37A, the plurality of reference mask patterns 337 remaining after the formation of the plurality of second reference line patterns 336 are shown in FIGS. 37B and 37C.

Figure 38A:
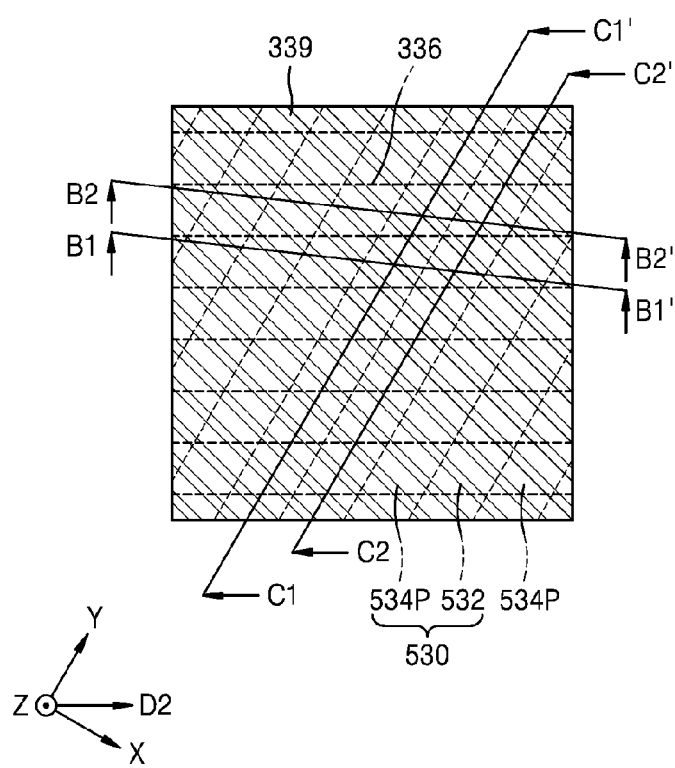
Figure 38B:
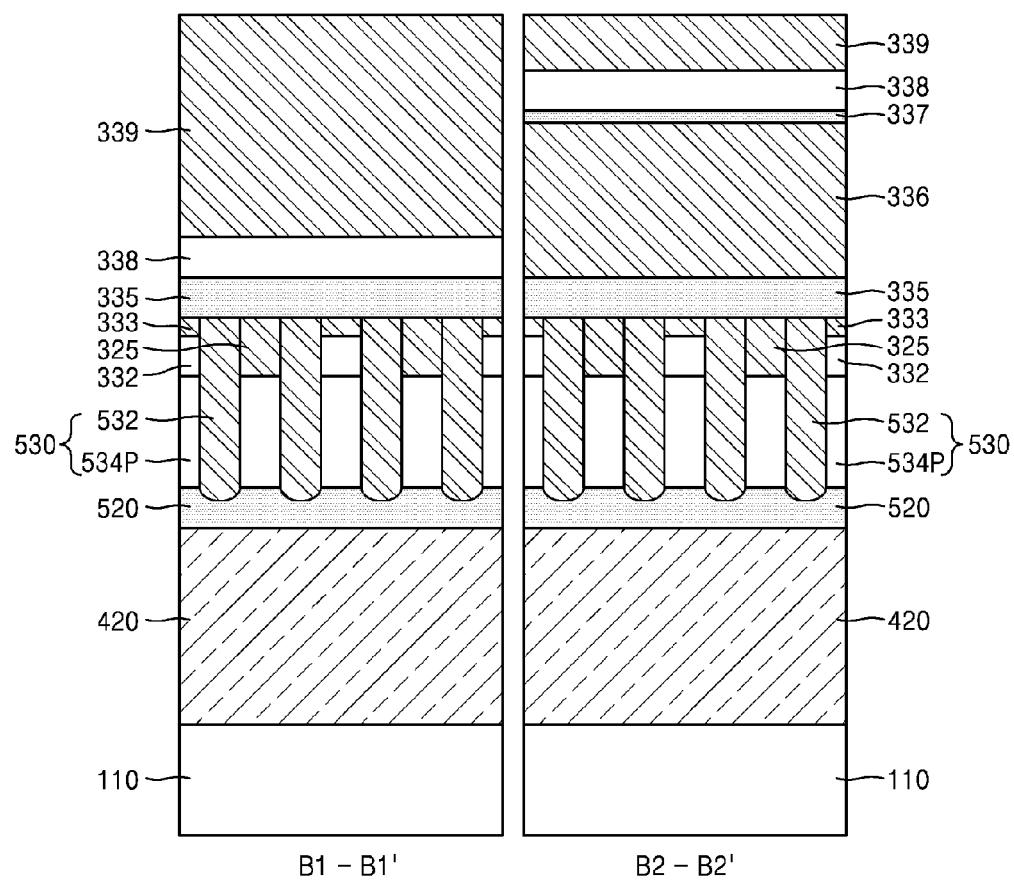
Figure 38C:
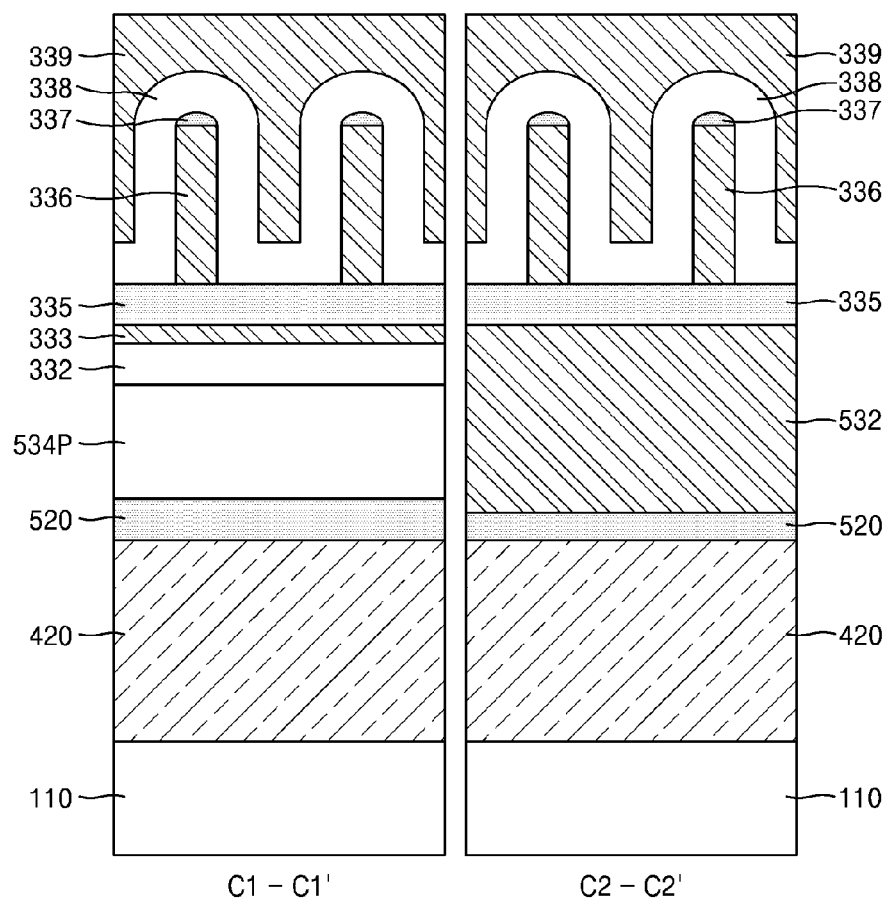

Referring to FIGS. 38A to 38C, a spacer layer 338 may be formed on the upper mask layer 335 to a uniform thickness and cover side surfaces and an upper surface of each of the plurality of second reference line patterns 336, in a similar manner as described above with reference to FIGS. 10A to 10C.

Next, a doubling layer 339 filling the spaces in the plurality of second reference line patterns 336 may be formed on a resultant structure with the spacer layer 338 formed thereon.

Figure 39A:
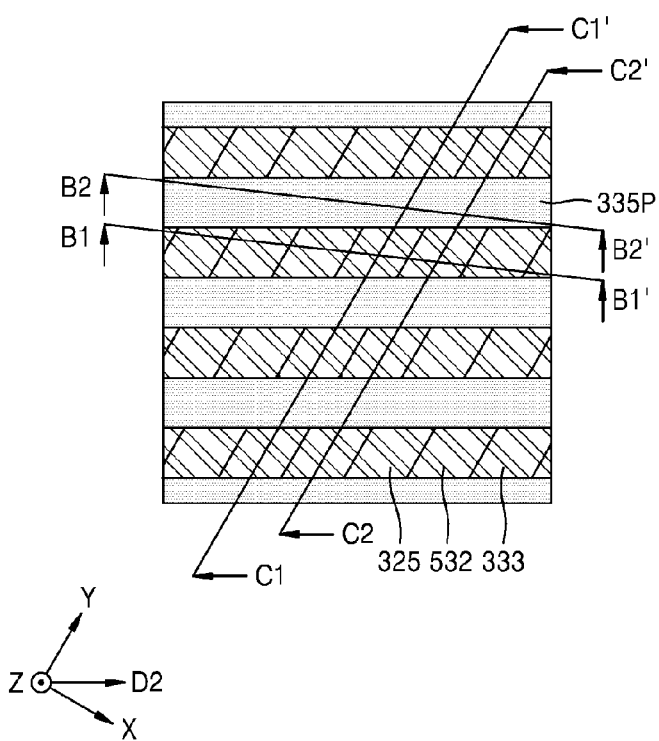
Figure 39B:
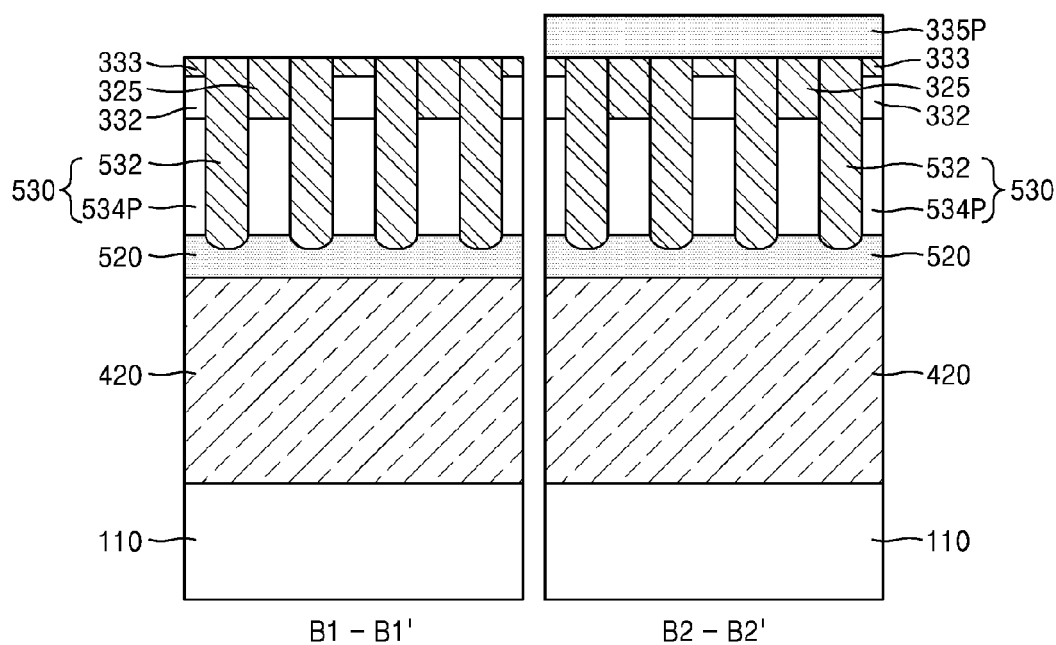
Figure 39C:
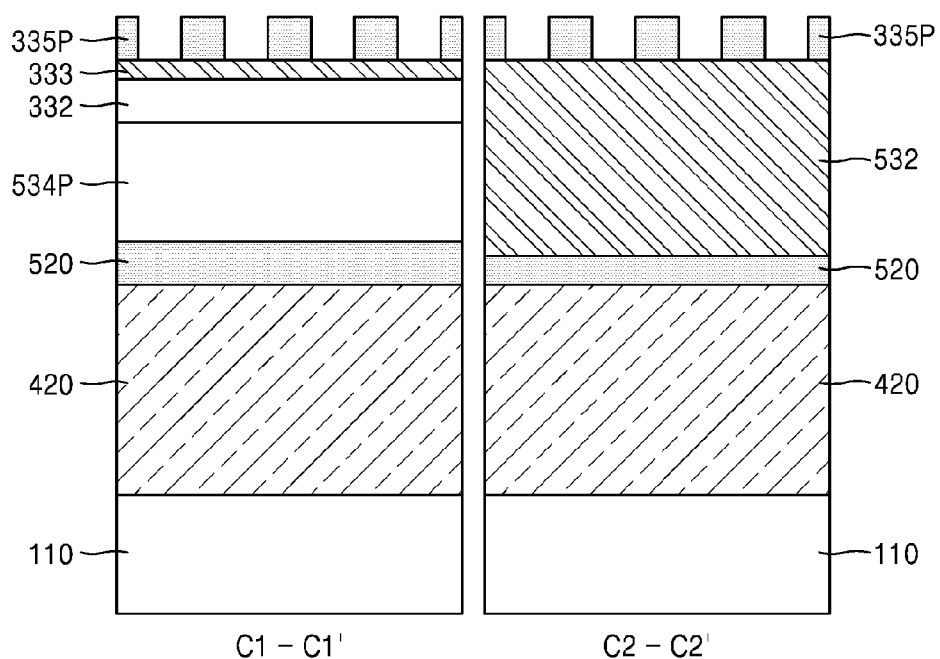

Referring to FIGS. 39A to 39C, the doubling layer 339 (see FIGS. 38A to 38C) may be etched back to form a plurality of doubling patterns (not shown) that may be alternately arranged with the plurality of second reference line patterns 336 in a similar manner as described with reference to FIGS. 11A to 11C. The upper mask layer 335 may then be etched using the plurality of doubling patterns and the plurality of second reference line patterns 336 as an etch mask, to thereby form a plurality of upper mask patterns 335P extending parallel to one another in the second direction (D2 direction).

The upper surfaces of the plurality of first reference line patterns 325, the space burying layer 333, and the plurality of first line patterns 532 may be exposed through the plurality of upper mask patterns 335P.

Figure 40A:
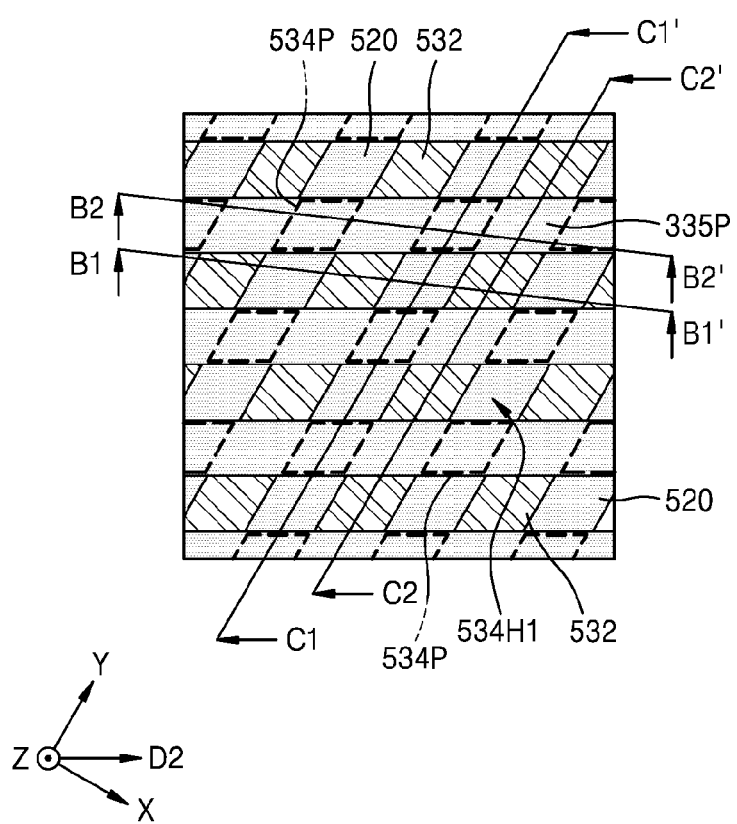
Figure 40B:
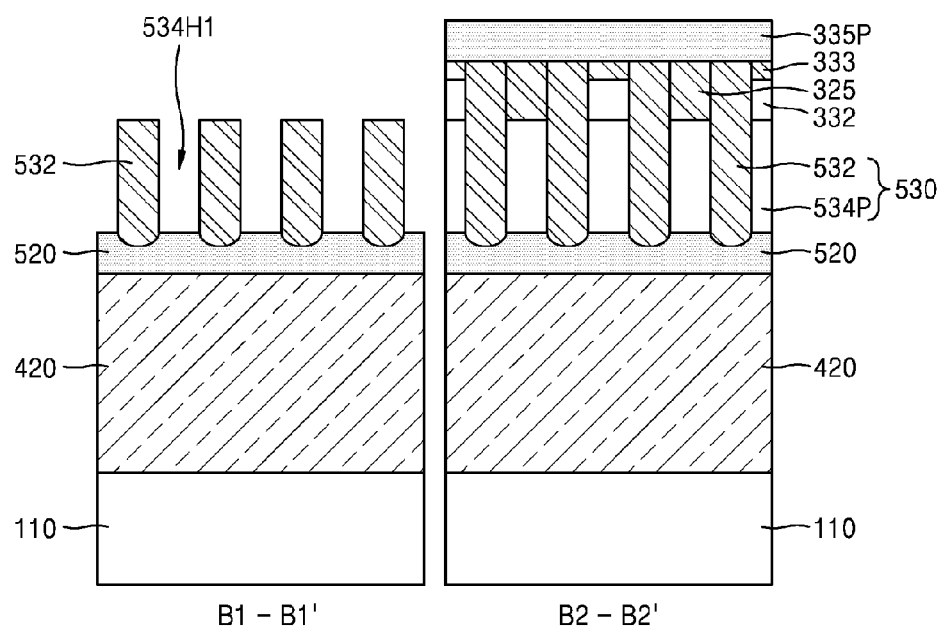
Figure 40C:
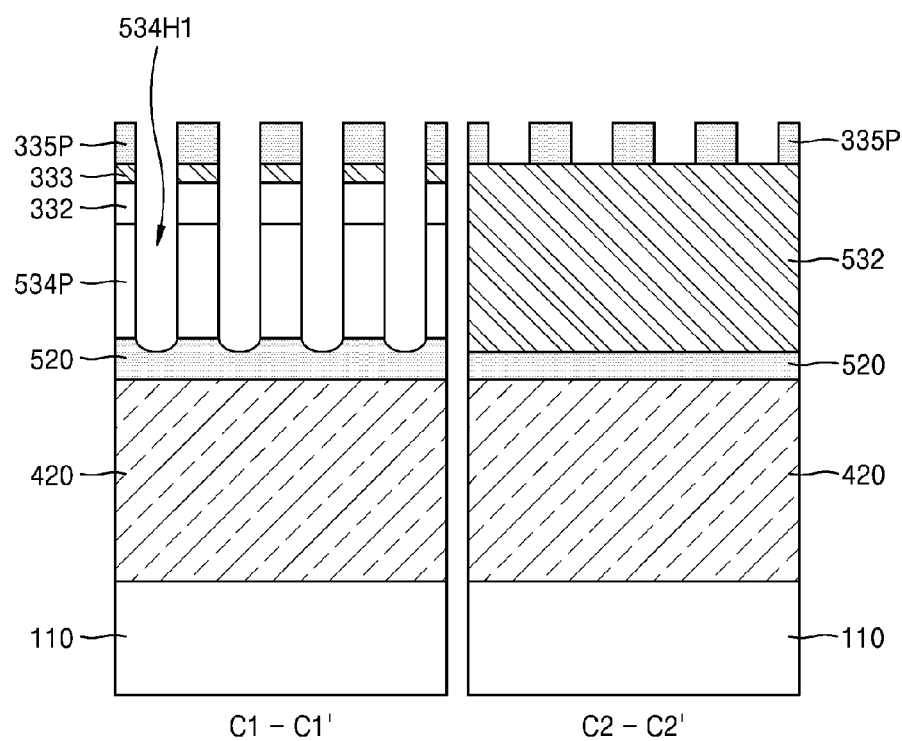

Referring to FIGS. 40A to 40C, the plurality of first reference line patterns 325 and the space burying layer 333 may be removed using the plurality of upper mask patterns 335P as an etch mask, to thereby expose the spacer layer 332 and the plurality of first space burying patterns 534P. Next, portions of the spacer layer 332 and the plurality of first space burying patterns 534P exposed through the plurality of upper mask patterns 335P may be etched to form a plurality of second direction pattern spaces 534H1 intermittently extending in the second direction (D2 direction) in the first level pattern layer 530.

The lower mask layer 520 may be exposed through the plurality of second direction pattern spaces 534H1 in the plurality of upper mask patterns 335P.

The plurality of second direction pattern spaces 534H1 may correspond to the plurality of second direction pattern spaces 134H1 illustrated in FIG. 2B.

While removing the plurality of first reference line patterns 325 and the space burying layer 333 with the plurality of upper mask patterns 335P as an etch mask, an upper portion of the plurality of first line patterns 532 may also be etched away, so that the plurality of first line patterns 532 may have a reduced height.

The etching process for removing the portions of the spacer layer 332 and the plurality of first space burying patterns 534P exposed through the plurality of upper mask patterns 335P may be continuously performed, so that the lower mask layer 520 may also be partially etched.

Figure 41A:
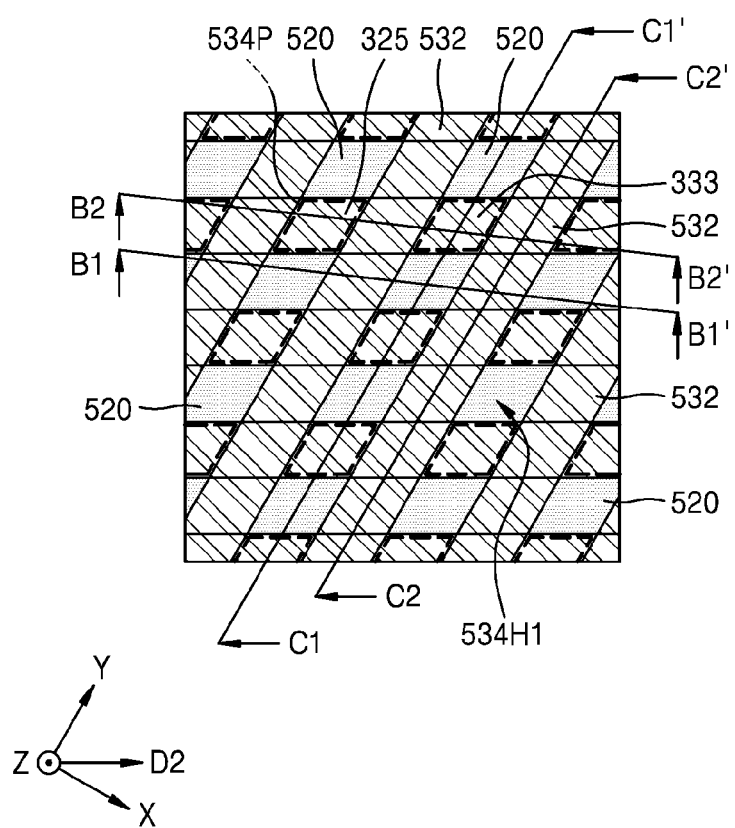
Figure 41B:
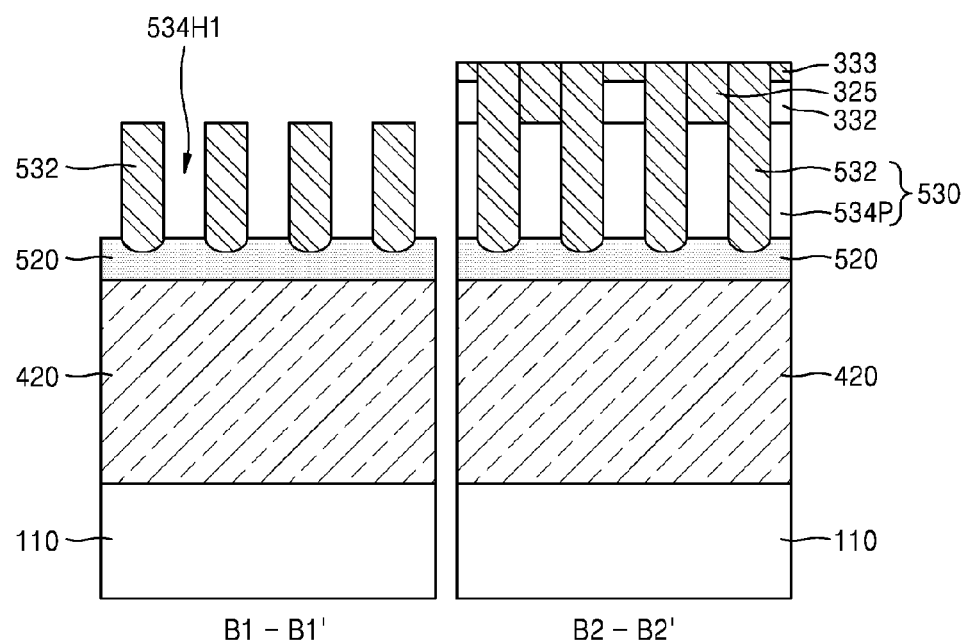
Figure 41C:
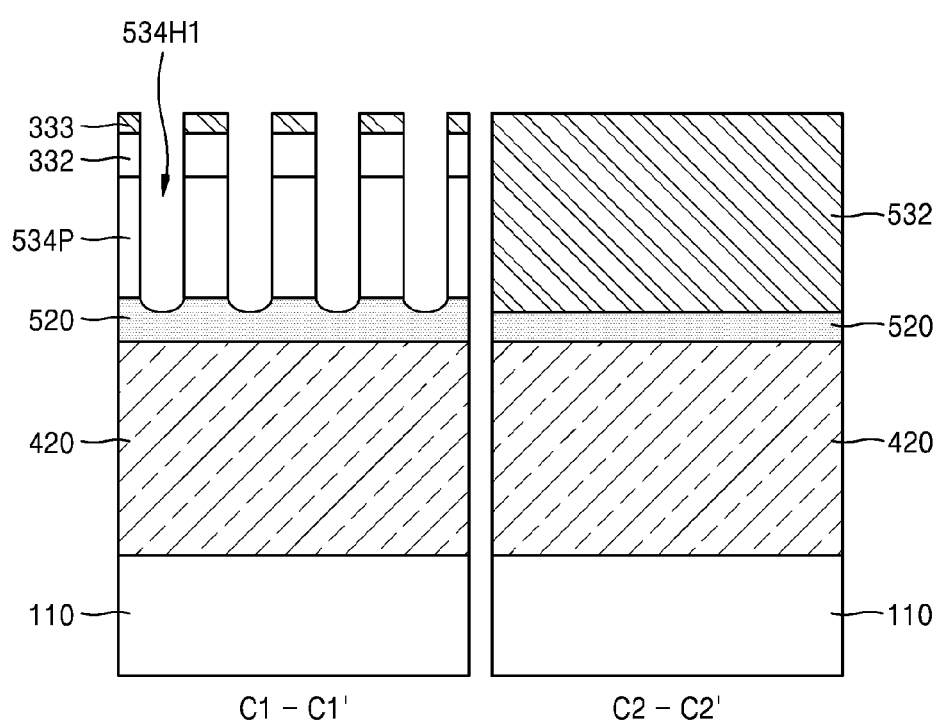

Referring to FIGS. 41A to 41C, the plurality of upper mask patterns 335P may be removed to expose an upper surface of the remaining portions of the plurality of first reference line patterns 325, an upper surface of the remaining portions of the space burying layer 333, and an upper surface of the plurality of first line patterns 532.

FIGS. 42A to 42C are views for illustrating a process of forming a second burying film 540, according to process P40 of FIG. 1, wherein the second burying film 540 may correspond to the second burying film 140 as described above with reference to FIGS. 42A to 42C.

Figure 42A:
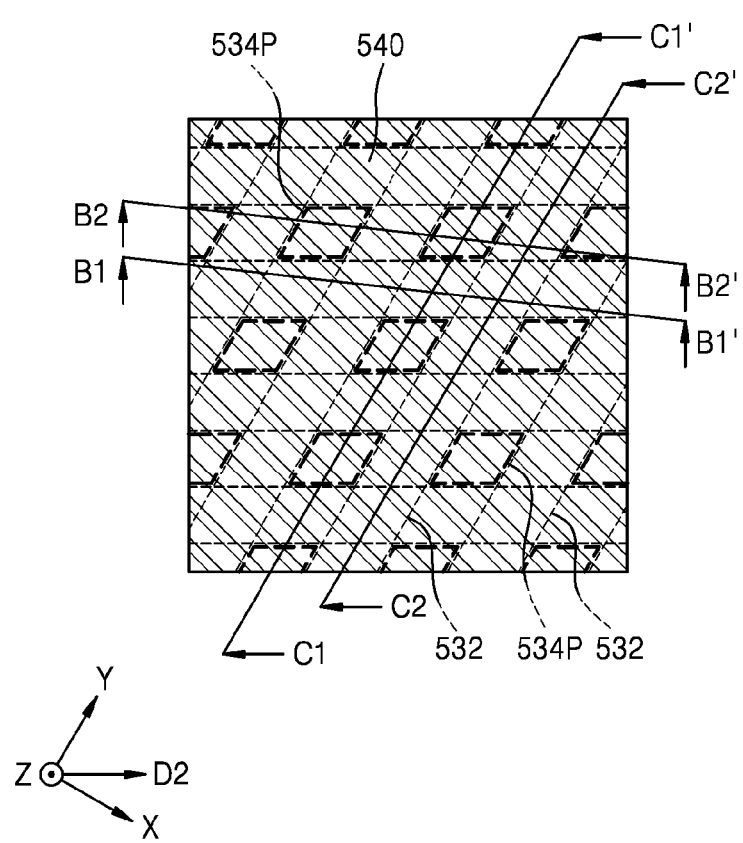
Figure 42B:
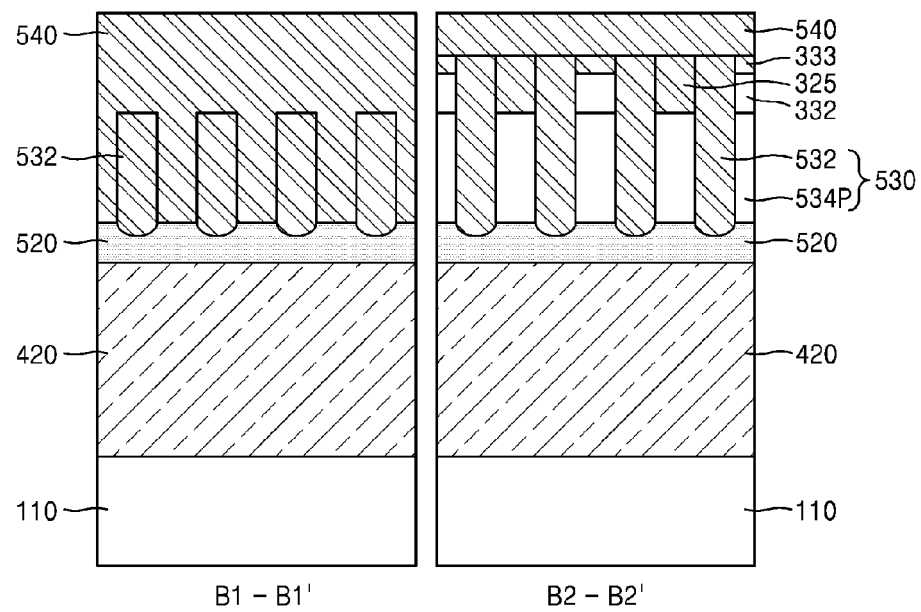
Figure 42C:
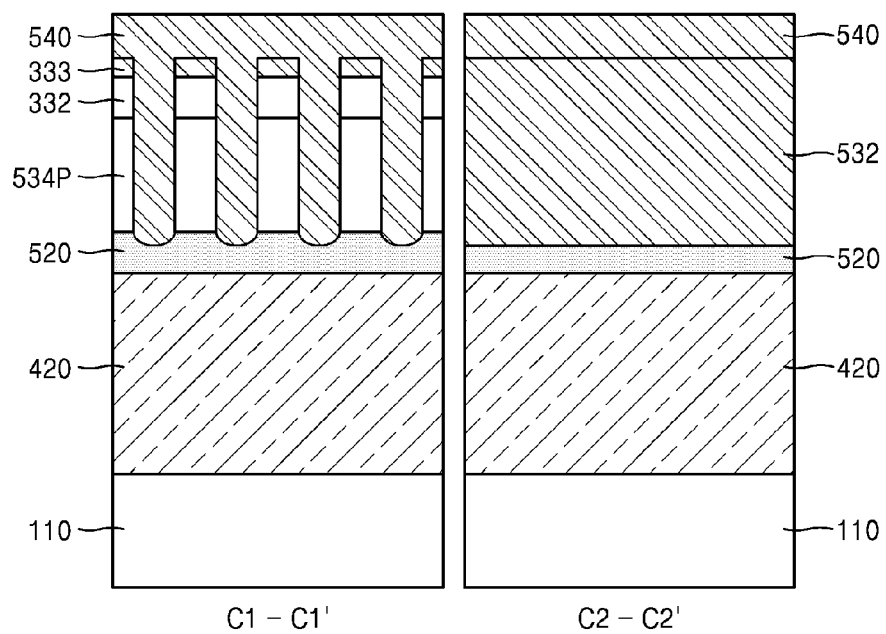

Referring to FIGS. 42A to 42C, a second burying film 540 filling the plurality of second direction pattern spaces 534H1 (see FIGS. 41B and 41C) and covering the plurality of first line patterns 532 may be formed. In some examples, the second burying film 540 may be formed of an SOH material.

Figure 43A:
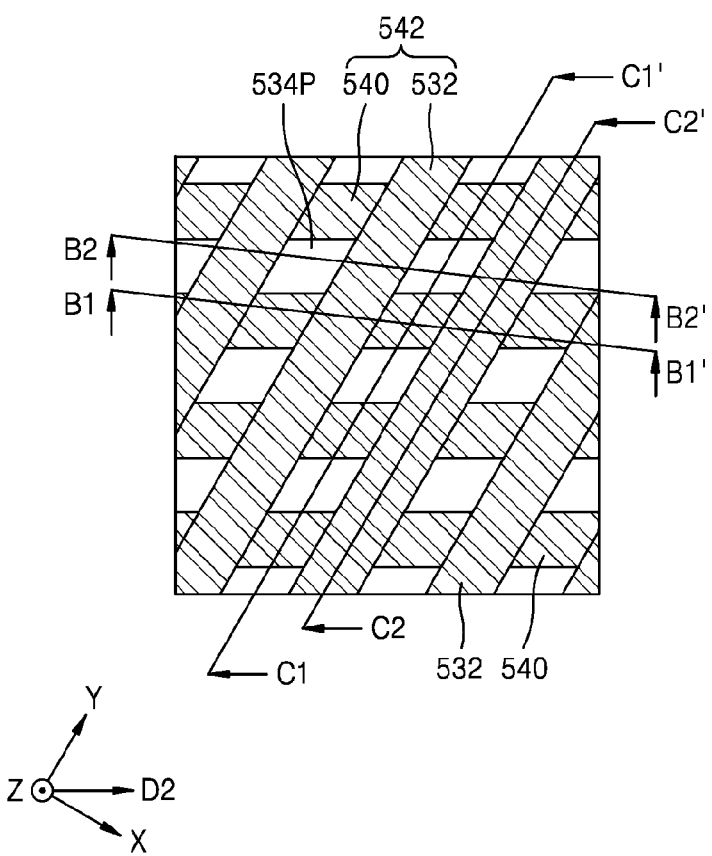
Figure 43B:
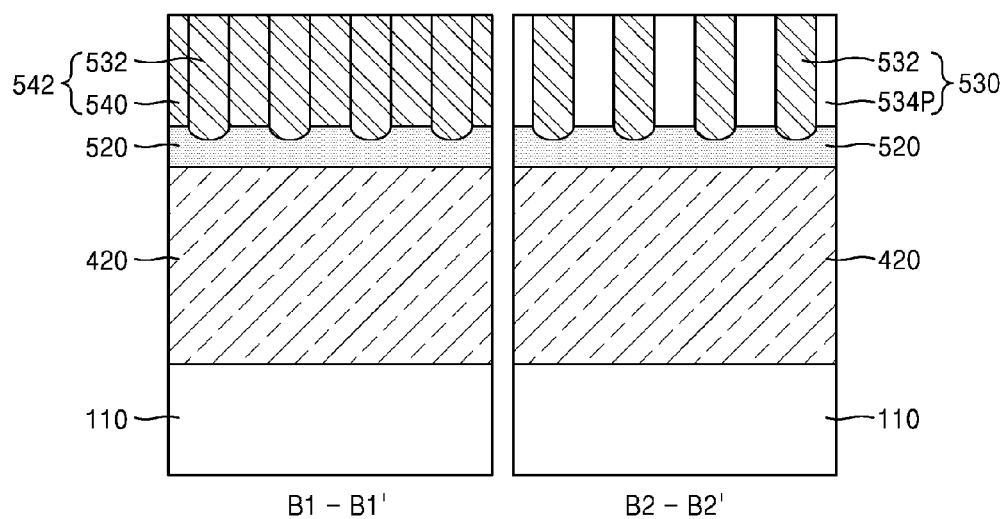
Figure 43C:
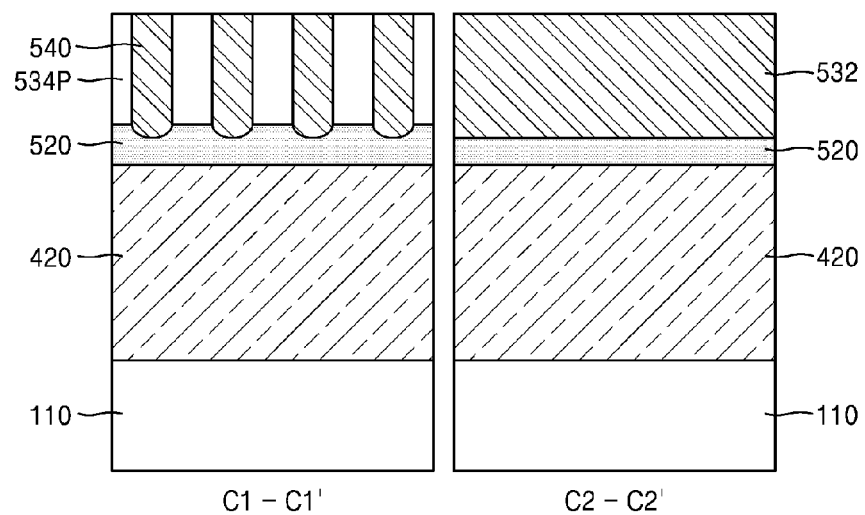

FIGS. 43A to 43C are views for illustrating a process of forming a network structure pattern 542 as a combined structure of the plurality of first line patterns 532 and the planarized second burying film 540 by planarizing an upper surface of the second burying film 540, according to process P50 of FIG. 1 in a similar manner as described with reference to FIGS. 43A to 43C.

Referring to FIGS. 43A to 43C, the resultant structure of FIGS. 42A to 42C may be planarized by a CMP process or an etchback process so that the upper surfaces of the plurality of first line patterns 532 are exposed, and thus, the planarized second burying film 540 may remain with the plurality of first space burying patterns 534P arranged alternately with the plurality of first space burying patterns 534P.

As a result, the network structure pattern 542 as a combined structure of the plurality of first line patterns 532 and the planarized second burying film 540 may be obtained. The upper surface of the first space burying patterns 534P may be exposed through the network structure pattern 542.

Figure 44A:
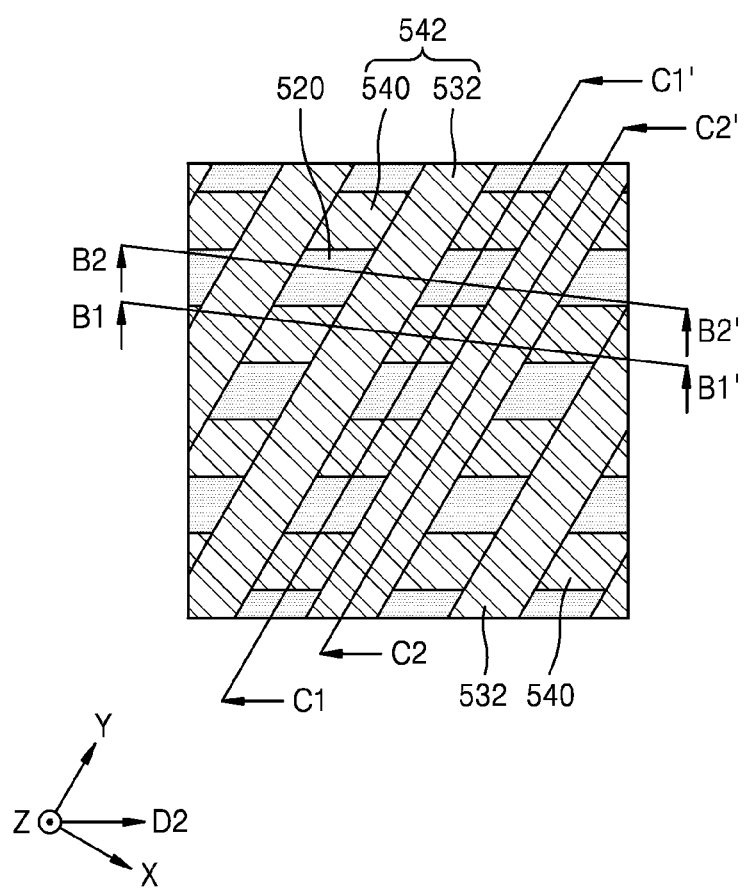
Figure 44B:
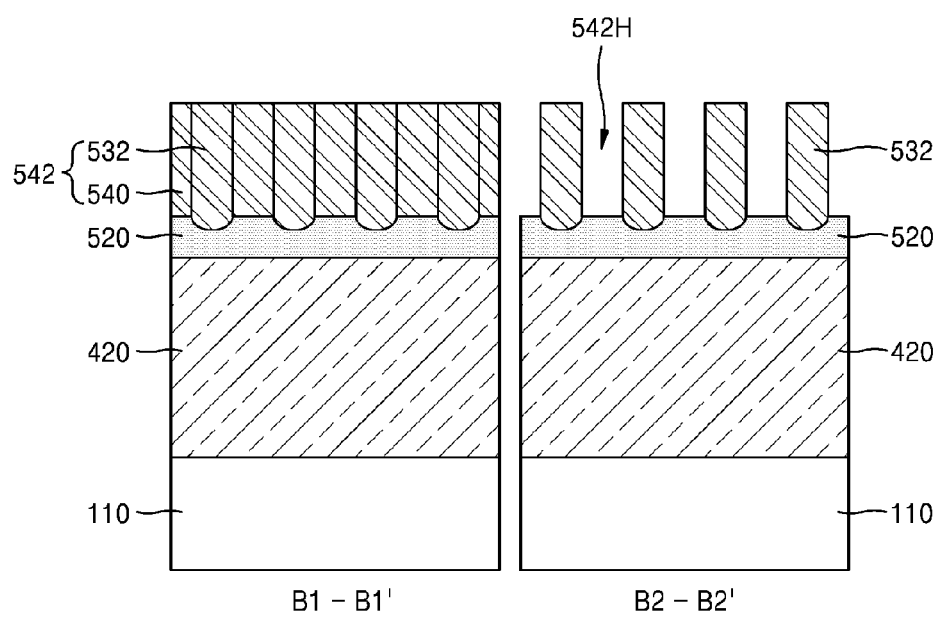
Figure 44C:
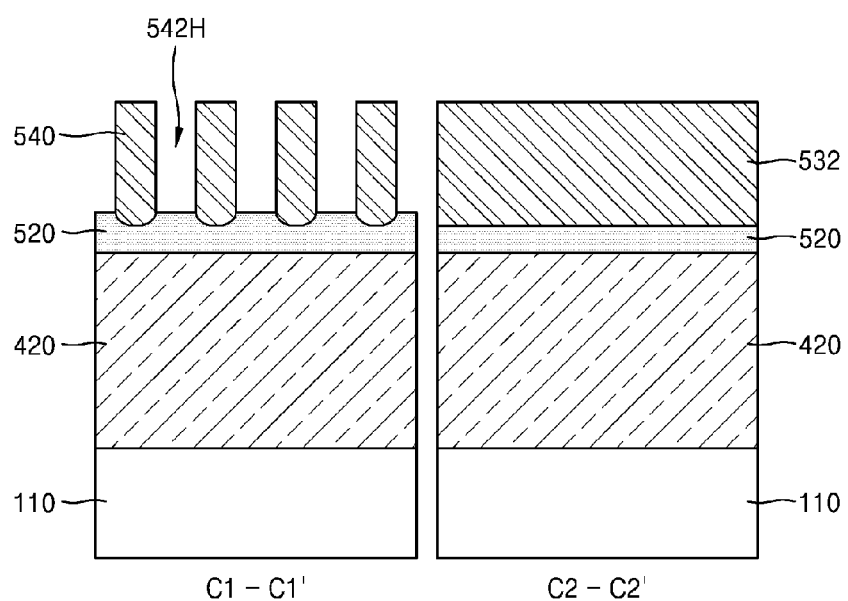

FIGS. 44A to 44C are views for illustrating a process of forming a plurality of etch holes 542H passing through the network structure pattern 542 by removing the plurality of first space burying patterns 534P (see FIG. 43A) exposed through the network structure pattern 542, according to process P60 of FIG. 1 in a similar manner as described above with reference to FIG. 2E.

The plurality of first space burying patterns 534P may be removed using a wet etching process or a dry etching process based on a difference in etch selectivity between the plurality of first space burying patterns 534P and the network structure pattern 542.

FIGS. 45A to 46C are views for illustrating a process of forming a feature pattern 420P having a plurality of holes 520H by etching portions of the feature layer 420 exposed through the plurality of etch holes 542H (see FIG. 44A) with the network structure pattern 542 as an etch mask, according to process P70 of FIG. 1 in a similar manner as described above with reference to FIG. 2F.

Figure 45A:
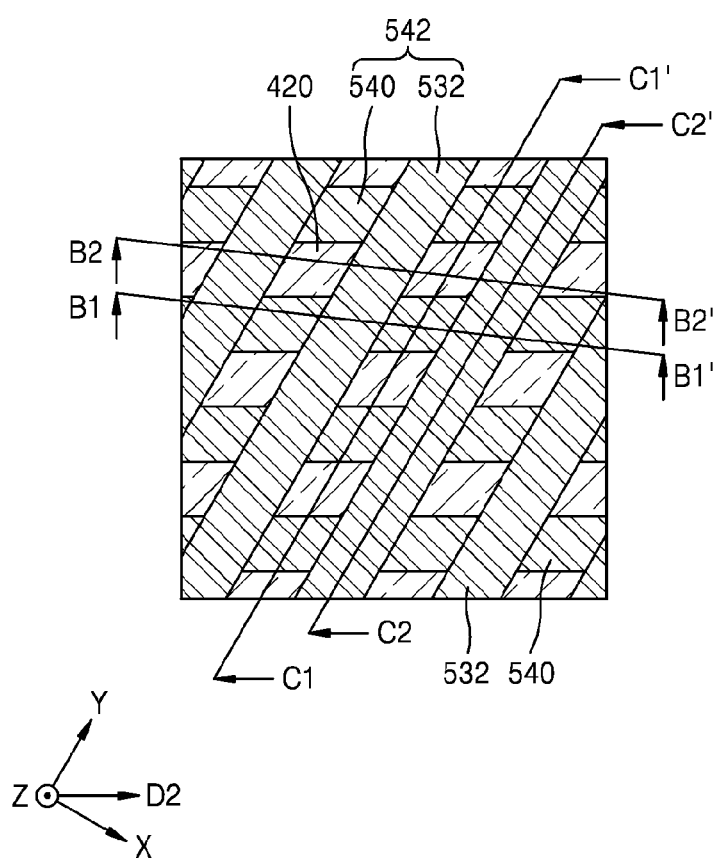
Figure 45B:
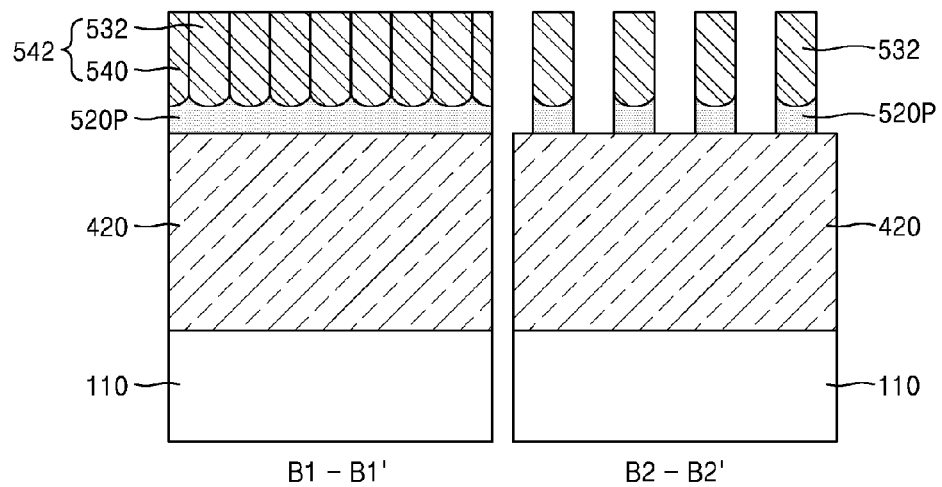
Figure 45C:
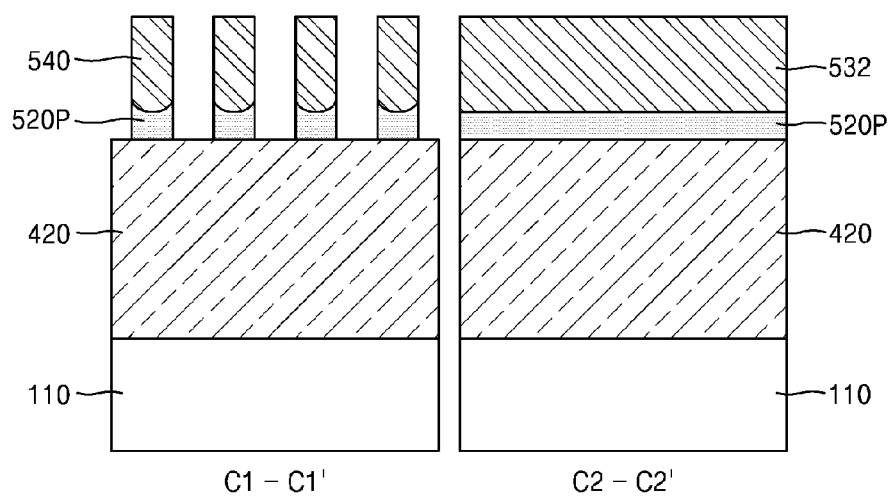

Referring to FIGS. 45A to 45C, the lower mask layer 520 (see FIGS. 44A to 44C) may be etched using the network structure pattern 542 as an etch mask, to thereby form a lower mask pattern 520P exposing the feature layer 420.

Figure 46A:
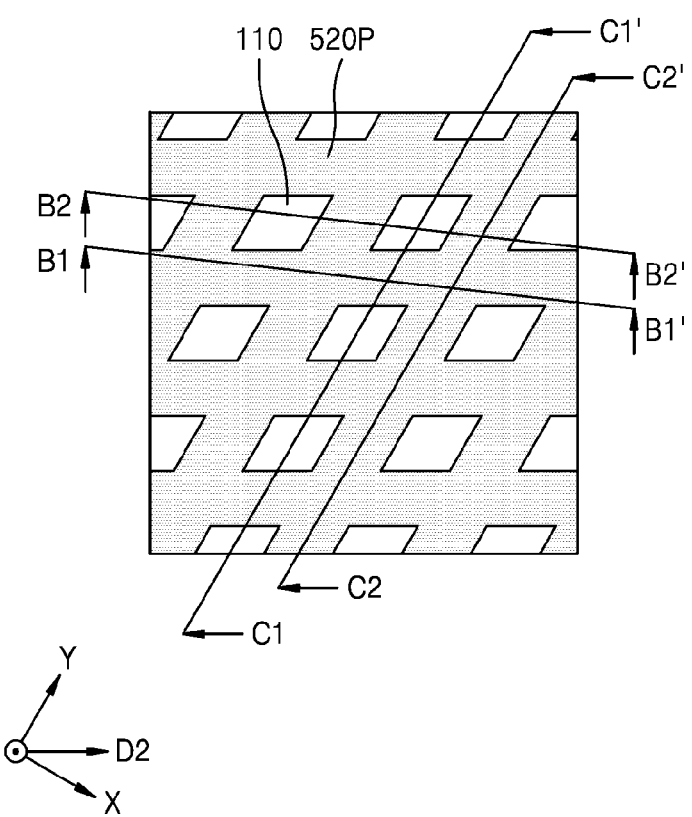
Figure 46B:
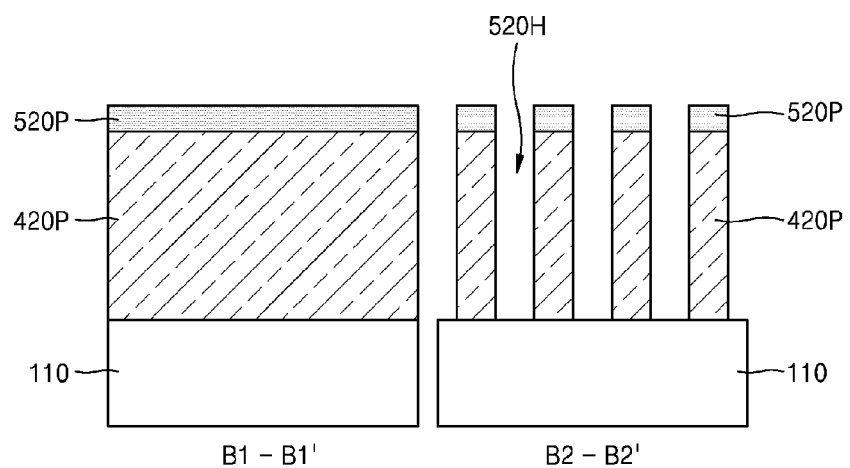
Figure 46C:
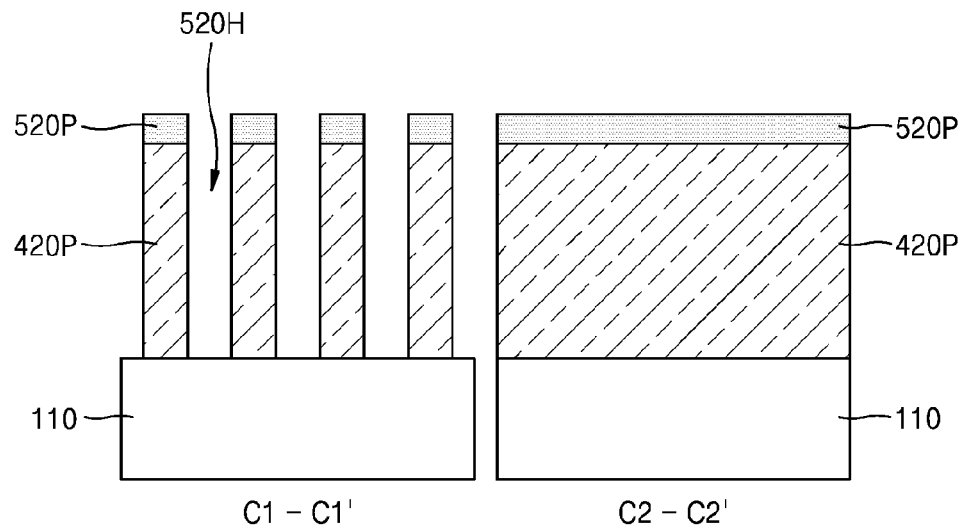

Referring to FIGS. 46A to 46C, the feature layer 420 (see FIGS. 45B and 45C) may be etched using the lower mask pattern 520P as an etch mask, to thereby form a feature pattern 420P having a plurality of etch holes 520H arranged as a hexagonal array on the X-Y plane.

The feature pattern 420P may correspond to the feature pattern 120P1 illustrated in FIG. 3 or the feature pattern 120P2 illustrated in FIG. 4F.

Figure 47:
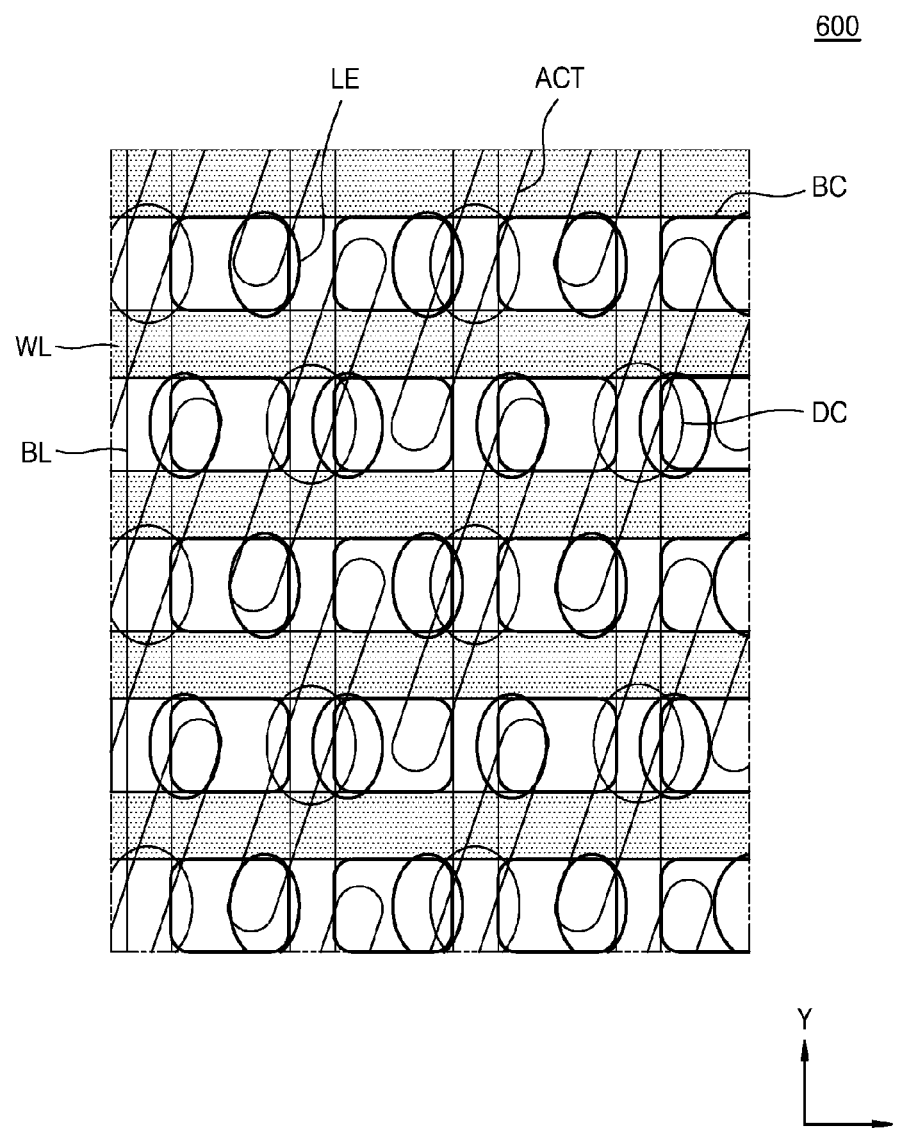
FIG. 47 illustrates a plan layout of main elements of a cell array region of an integrated circuit device that may be implemented by using an integrated circuit device manufacturing method according to an example of the inventive concept.

FIG. 47 illustrates a plan layout of main elements of a cell array region of an integrated circuit device 600 that may be fabricated using an integrated circuit device manufacturing method according to the inventive concept.

Referring to FIG. 47, the integrated circuit device 600 may include a plurality of active regions ACT. The plurality of active regions ACT may be arranged in a diagonal direction with respect to an X direction and a Y direction of a Cartesian coordinate system.

A plurality of word lines WL may extend parallel to one another in the X direction across the plurality of active regions ACT. A plurality of bit lines BL may extend parallel to one another on the plurality of word lines WL in the Y direction that is perpendicular to the X direction.

The plurality of bit lines BL may be connected to the plurality of active regions ACT via a plurality of direct contacts DC.

In some examples, a plurality of buried contacts BC may be formed between adjacent ones of the bit lines BL. Each of the plurality of buried contacts BC may extend up to an upper portion of any one of the two adjacent bit lines BL. In some examples, the plurality of buried contacts BC may be arranged in lines, i.e., in rows and columns, in the X direction and the Y direction.

A plurality of lower electrodes LE may be formed on the plurality of buried contacts BC. The plurality of lower electrodes LE may be connected to the active regions ACT via the plurality of buried contacts BC.

FIGS. 48A to 48G sequentially illustrate cross-sectional views of a method of forming the plurality of lower electrodes LE of the integrated circuit device 600 shown in FIG. 47, according to an example of the inventive concept.

Figure 48A:
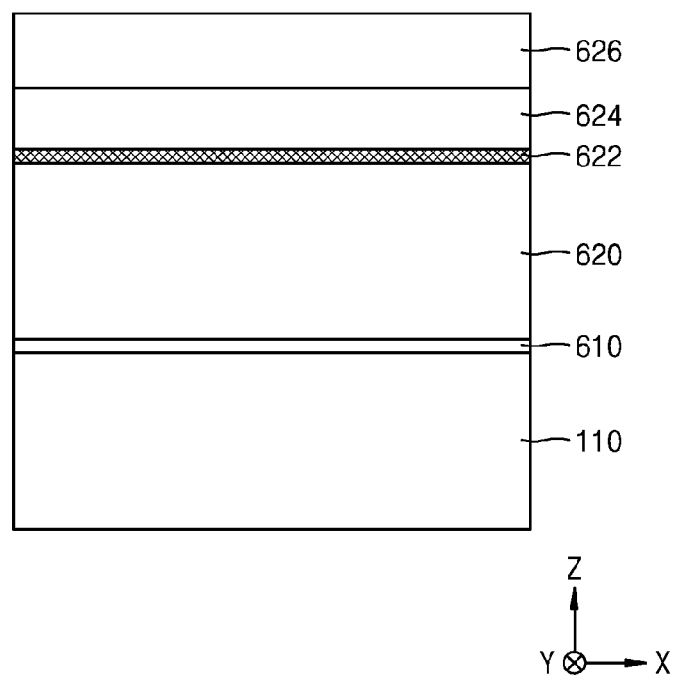
FIGS. 48A to 48G sequentially illustrate cross-sectional views of a method of forming a plurality of lower electrodes of the integrated circuit device according to an integrated circuit device manufacturing method according to an example of the inventive concept.

Referring to FIG. 48A, an etch stop layer 610, a mold layer 620, a supporting layer 622, and a sacrificial layer 624 may sequentially be formed on a substrate 110 including in a cell array region and a peripheral circuit region, and a mask layer 626 may be formed on the sacrificial layer 624.

In the cell array region, a plurality of active regions ACT (see FIG. 47) and a plurality of conductive regions may be formed in the substrate 110.

In some examples, the etch stop layer 610 may include silicon nitride, silicon oxynitride, or a combination thereof. The mold layer 620 may include silicon oxide. The supporting layer 622 may include silicon nitride, silicon carbonitride, tantalum oxide, titanium oxide, or a combination thereof. The sacrificial layer 624 may include borophosphosilicate glass (BPSG), phosphosilicate glass (PSG), undoped silicate glass (USG), spin on dielectric (SOD), or an oxide film such as a high density plasma (HDP) oxide film. The above-stated constituent materials of the layers, namely, the etch stop layer 610, the mold layer 620, the supporting layer 622, and the sacrificial layer 624, are only examples, i.e., the inventive concept is not limited thereto. In the current example, one supporting layer 622 may be disposed on the mold layer 620. In an example, at least one supporting layer may be interposed between the mold layer 620 and the supporting layer 622.

The mask layer 626 may include at least one layer that may be used as an etch mask for patterning the etch stop layer 610, the mold layer 620, the supporting layer 622, and the sacrificial layer 624. For example, the mask layer 626 may include a polysilicon film, a silicon oxide film, a SiCN film, a carbon-containing film including an SOH material, or a combination thereof. The carbon-containing film including the SOH material may include an organic compound having a relatively high carbon content of about 85 wt % to about 99 wt % based on the total weight thereof. The organic compound may include a hydrocarbon compound including an aromatic ring, such as phenyl, benzene, or naphthalene, or a derivative of the hydrocarbon compound.

Figure 48B:
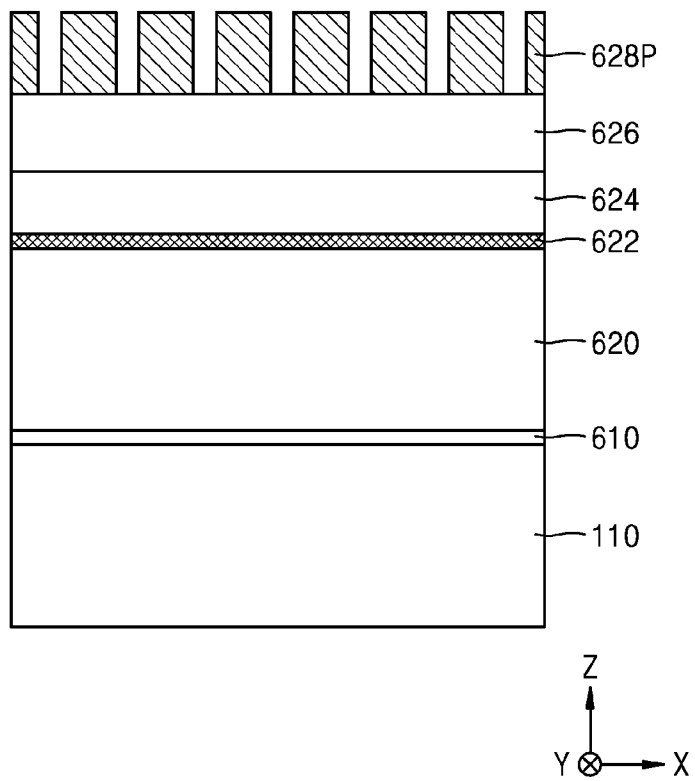

Referring to FIG. 48B, a feature pattern 628P may be formed on the mask layer 626.

In some examples, the feature pattern 628P may correspond to the feature pattern 322P formed by the pattern forming method described with reference to FIGS. 5A to 17C, the feature pattern 420P formed by the pattern forming method described with reference to FIGS. 18A to 30C, or the feature pattern 420P formed by the pattern forming method described with reference to FIGS. 31A to 46C. The feature pattern 628P may be formed of a material different from the material of the mask layer 626.

Figure 48C:
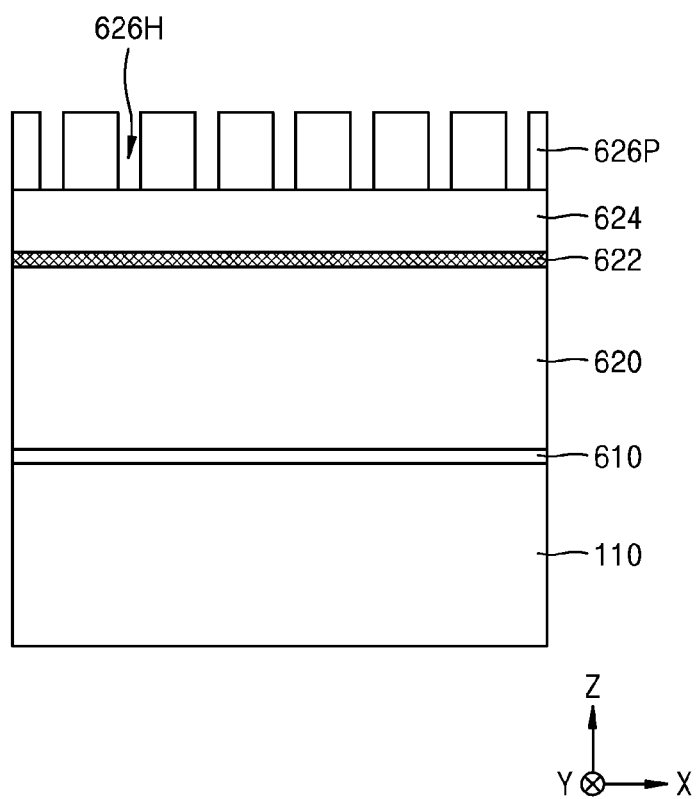

Referring to FIG. 48C, the mask layer 626 (see FIG. 48B) may be etched using the feature pattern 628P as an etch mask to form a mask pattern 626P having a plurality of holes 626H.

Next, unnecessary materials remaining on the mask pattern 626P may be removed.

Figure 48D:
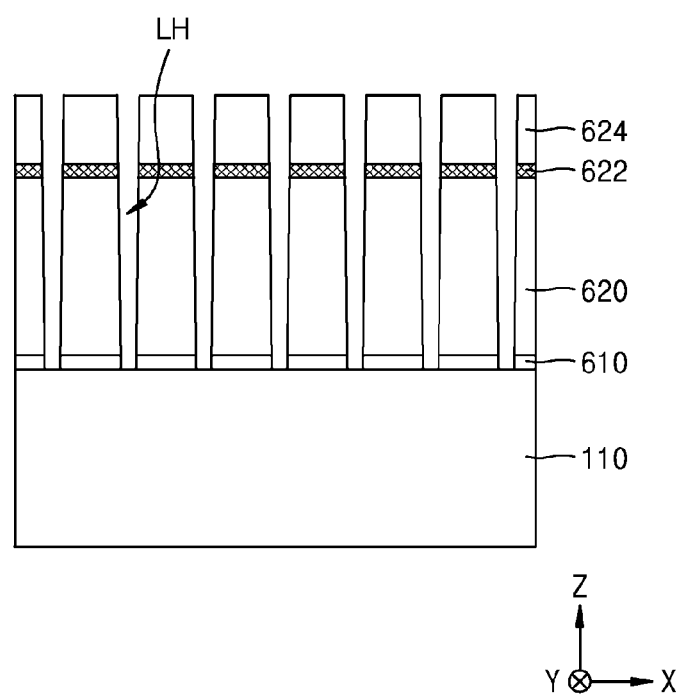

Referring to FIG. 48D, the sacrificial layer 624, the supporting layer 622, and the mold layer 620 may sequentially be etched by using the mask pattern 626P (see FIG. 48C) as an etch mask and using the etch stop layer 610 as an etching end point, and may continuously be etched up to the etch stop layer 610, and a plurality of lower electrode holes LH that expose a plurality of conductive regions (not shown) formed in the substrate 110 may be formed.

After the plurality of lower electrode holes LH are formed, the mask pattern 626P may be consumed or removed, and the upper surface of the sacrificial layer 624 may be exposed.

Figure 48E:
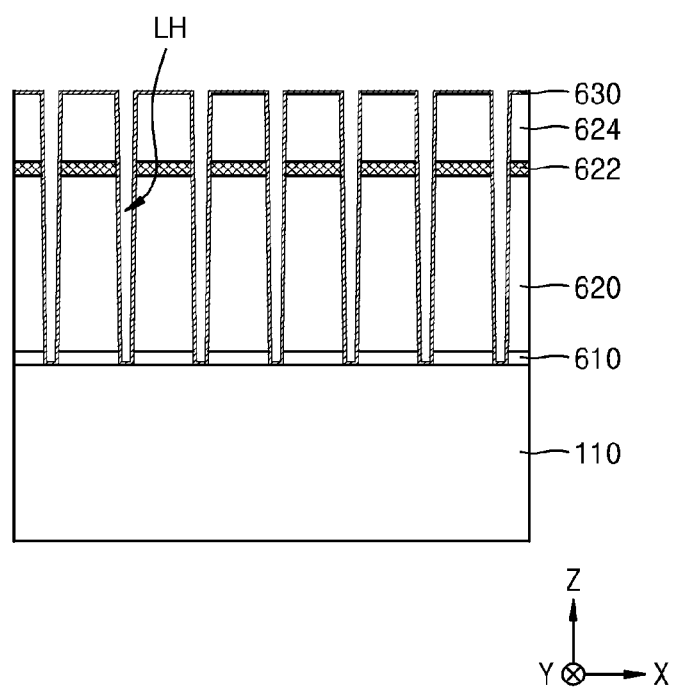

Referring to FIG. 48E, a conductive film 630 for lower electrode formation may cover surfaces which delimit the lower electrode holes LH, and the upper surface of the sacrificial layer 624.

The conductive film 630 for lower electrode formation may conformally cover the plurality of surfaces delimiting the lower electrode holes LH.

In some examples, the conductive film 630 for lower electrode formation may include doped semiconductor, conductive metal nitride, metal, metal silicide, conductive oxide, or a combination thereof. For example, the conductive film 630 for lower electrode formation may include, for example, TiN, TiAlN, TaN, TaAlN, W, WN, Ru, $RuO_2$, $SrRuO_3$, Ir, $IrO_2$, Pt, PtO, $SrRuO_3$ (SRO), $(Ba,Sr)RuO_3$ (BSRO), $CaRuO_3$ (CRO), $(La,Sr)CoO_3$ (LSCo), or a combination thereof. However, the inventive concept is not limited thereto.

A CVD process, a metal organic CVD (MOCVD) process, or an ALD process may be used to form the conductive film 630 for lower electrode formation.

Figure 48F:
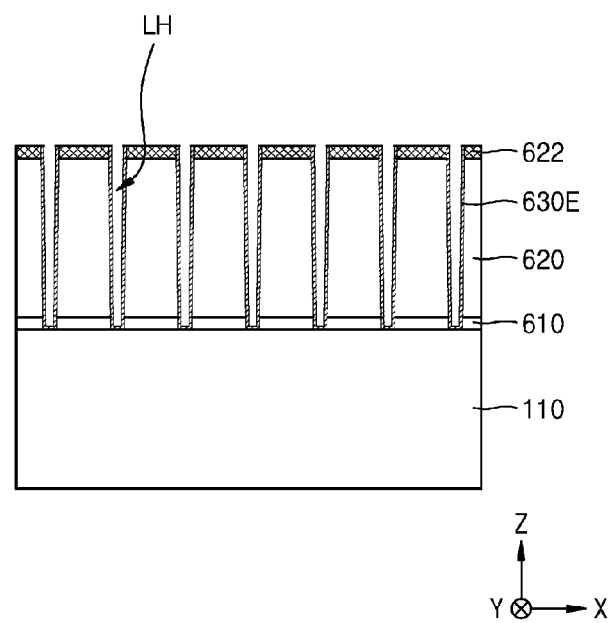

Referring to FIG. 48F, an upper portion of the conductive film 630 for lower electrode formation is partially removed to divide the conductive film 630 into a plurality of lower electrodes 630E.

In order to form the plurality of lower electrodes 630E, an upper portion of the conductive film 630 for lower electrode formation and the sacrificial layer 624 (see FIG. 48E) may be removed by using an etch-back process or a CMP process so that the upper surface of the supporting layer 622 is exposed.

The plurality of lower electrodes 630E may correspond to the lower electrodes LE of the integrated circuit device 600 shown in FIG. 47.

In the current example, each of the plurality of lower electrodes 630E may have, for example, a cylindrical shape. However, the inventive concept is not limited thereto. In an example, the plurality of lower electrode holes LH may be filled with the conductive film 630 for lower electrode formation so that an internal space of each of the plurality of lower electrode holes LH does not remain during the process of forming the conductive film 630 for lower electrode formation, described with reference to FIG. 48E. After the conductive film 630 for lower electrode formation is divided into the plurality of lower electrodes 630E, as described with reference to FIG. 48F, the plurality of lower electrodes 630E will each have the shape of a pillar.

Figure 48G:
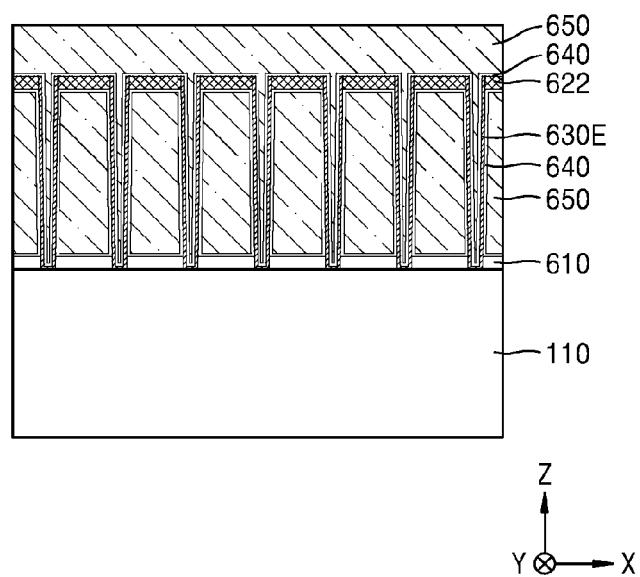

Referring to FIG. 48G, the mold layer 620 (see FIG. 48F) may be removed to expose outer surfaces of the plurality of lower electrode electrodes 630E in the cell array region.

A wet etching process may be used to remove the mold layer 620. For example, the mold layer 620 may be removed by a lift-off process using a solution including ammonium fluoride ($NH_4F$), hydrofluoric acid (HF) and water or hydrofluoric acid.

After the mold layer 620 is removed, the plurality of lower electrodes 630E in the cell array region may be supported by the supporting layer 622.

A dielectric film 640 may be formed on the plurality of lower electrodes 630E in the cell array region, and an upper electrode 650 may be formed on the dielectric film 640.

The dielectric film 640 may conformally cover some areas (inner surfaces and outer surfaces) of the plurality of lower electrodes 630E, the surface of the supporting layer 622, and the surface of the etch stop layer 610.

The dielectric film 640 may include nitride, oxide, metal oxide, or a combination thereof. For example, the dielectric film 640 may be a single layer of material selected from the group consisting of silicon nitride, silicon oxide, metal oxide, such as $HfO_2$, $ZrO_2$, $Al_2O_3$, $La_2O_3$, $Ta_2O_3$, or $TiO_2$, a perovskite-structured dielectric material, such as STO ($SrTiO_3$), BST (($Ba,Sr$)$TiO_3$), $BaTiO_3$, PZT, or PLZT, or may have a multi-layered structure of a combination of layers of such materials. The dielectric film 640 may be formed by using a CVD, PVD, or ALD process.

The upper electrode 650 may include doped semiconductor, conductive metal nitride, metal, metal silicide, conductive oxide, or a combination thereof. For example, the upper electrode 650 may include, for example, TiN, TiAlN, TaN, TaAlN, W, WN, Ru, $RuO_2$, $SrRuO_3$, Ir, $IrO_2$, Pt, PtO, $SrRuO_3$ (SRO), ($Ba,Sr$)$RuO_3$ (BSRO), $CaRuO_3$ (CRO), ($La,Sr$)$CoO_3$ (LSCo), or a combination thereof. However, the inventive concept is not limited thereto.

A capacitor may be formed by the lower electrode 630E, the dielectric film 640, and the upper electrode 650.

An integrated circuit device manufacturing method according to the inventive concept, as illustrated in FIGS. 48A to 48G, has been described as being applied to the forming of the plurality of lower electrodes LE of the integrated circuit device 600 shown in FIG. 47. However, the inventive concept is not limited thereto. In an example, the integrated circuit device manufacturing method according to the inventive concept may be advantageously applied to the forming of the plurality of active regions ACT of the integrated circuit device 600 shown in FIG. 47 (specifically, in connection with a trimming process used to form the active regions (ACT), the forming of the plurality of direct contacts DC, and/or the forming the plurality of buried contacts BC.

Figure 49:
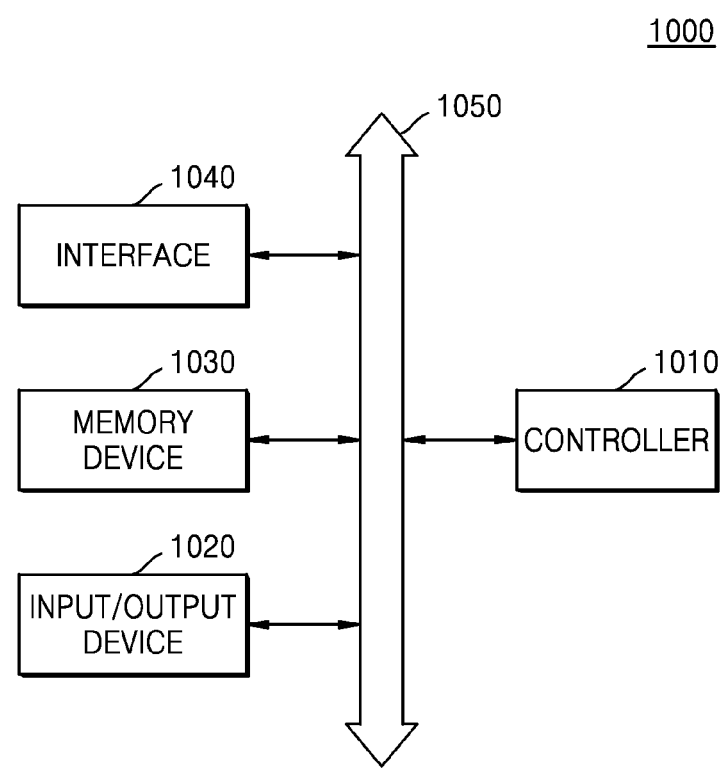
FIG. 49 illustrates a block diagram of a system including an integrated circuit device, according to an example of the inventive concept.

FIG. 49 illustrates a block diagram of a system 1000 including an integrated circuit device, which may be fabricated using a method according to the inventive concept.

The system 1000 may include a controller 1010, an input/output device 1100, a memory device 1030, and an interface 1040. The system 1000 may be a mobile system or any type of system that transmits or receives information. Some examples of the mobile system include a personal digital assistant (PDA), a portable computer, a web tablet, a wireless phone, a mobile phone, a digital music player, and a memory card. The controller 1010 for controlling a program executed in the system 1000 may include, for example, a microprocessor, a digital signal processor, or a microcontroller. The input/output device 1100 may be used to input or output data of the system 1000. The system 1000 may be connected to an external device such as a personal computer or a network by using the input/output device 1100, and may exchange data with the external device. The input/output device 1100 may be, for example, a keypad, a keyboard, or a display device.

The memory device 1030 may store code and/or data for operating the controller 1010, or may store data processed by the controller 1010. The memory device 1030 may include at least one integrated circuit formed using a method of forming a pattern or a method of manufacturing an integrated circuit device, according to the inventive concept. For example, the memory device 1030 may include at least one integrated circuit device formed using any one of the methods described with reference to FIGS. 1A to 46C, the integrated circuit device manufacturing methods described with reference to FIGS. 48A to 48G, or other methods within the scope of the inventive concept.

The interface 1040 may be a transmission path through which data is transmitted between the system 1000 and the external device. The controller 1010, the input/output device 1100, the memory device 1030, and the interface 1040 may communicate with one another via a bus 1050. The system 1000 may be employed by a mobile phone, an MP3 player, a navigation system, a portable multimedia player (PMP), a solid-state disc (SSD), or a household appliance.

Figure 50:
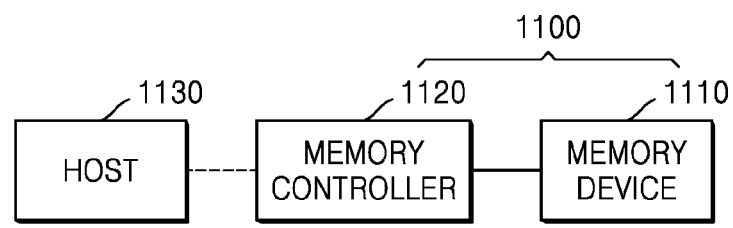
FIG. 50 illustrates a block diagram of a memory card including an integrated circuit device, according to an example of the inventive concept.

FIG. 50 illustrates a block diagram of a memory card 1100 including an integrated circuit device that can be formed according to the inventive concept.

The memory card 1100 may include a memory device 1110 and a memory controller 1120.

The memory device 1110 may store data. In some exemplary, the memory device 1110 is a nonvolatile, and the memory device 1110 may thus retain stored data even when powered off. The memory device 1110 may include at least one integrated circuit device formed by a method according to the inventive concept. That is, the memory device 1110 may include at least one integrated circuit device formed by any one of the pattern forming methods described with reference to FIGS. 1A to 46C, the integrated circuit device manufacturing methods described with reference to FIGS. 48A to 48G, or other methods within the scope of the inventive concept.

The memory controller 1120 may read data stored in the memory device 1110 or may store data in the memory device 1110 in response to a read/write request of a host 1130. The memory controller 1120 may include at least one integrated circuit device formed according to the inventive concept. That is, the memory controller 1120 may include at least one integrated circuit device formed by any one of the pattern forming methods described with reference to FIGS. 1A to 46C, the integrated circuit device manufacturing methods described with reference to FIGS. 48A to 48G, or other methods within the scope of the inventive concept.

As described above, according to an aspect of the inventive concept, a method of forming a pattern uses a 1-level etch mask having a matrix of openings. Therefore, the practicing the inventive concept may prevent a pattern asymmetry problem from occurring when forming a plurality of holes in a feature layer, and consequently, may minimize any deviation in the CD of the pattern from a desired CD. As will be clear to those skilled in the art, such a deviation may refer to a deviation in the uniformity or distribution of CDs of features of the pattern from a design tolerance for CD uniformity. Therefore, a fine pattern of holes regularly arranged at a high density with relatively narrow widths and at a relatively small pitch, and with minimal deviations in the CDs (width and pitch) from the desired CDs, may be easily formed using conventional photolithography processes. An integrated circuit (IC) device having one or more of its patterns of features formed in accordance with the inventive concept, may thus have improved reliability.

Although several examples of the inventive concept have been described with reference to the figures, it will be understood by those of ordinary skill in the art that various changes in form and details may be made to such examples without departing from the spirit and scope of the inventive concept as defined by the following claims.

What is claimed is:
1. A method of forming a pattern, the method comprising:
    forming a first level pattern layer on a feature layer on a substrate, wherein the first level pattern layer has a plurality of first line patterns extending parallel to one another in a first direction and a plurality of first space burying patterns extending parallel to one another in the first direction, the first line patterns arranged alternately with the first space burying patterns;
    forming a second direction pattern space extending intermittently or continuously along a second direction intersecting the first direction in the first level pattern layer by removing a portion of the plurality of first space burying patterns from a second line pattern region extending along the second direction;
    forming a second burying film filling the second direction pattern space to thereby form a network structure pattern as a combination of the plurality of first line patterns and the second burying film;
    removing a remaining portion of the plurality of first space burying patterns to expose a portion of the feature layer through the network structure pattern; and
    etching the feature layer with the network structure pattern as an etch mask to thereby form a feature pattern having a plurality of holes.

2. The method of claim 1, wherein the forming of the network structure pattern comprises:
    forming a second burying film that fills the second direction pattern space and covers the first level pattern layer; and
    planarizing an upper surface of the second burying film to expose the plurality of first space burying patterns.

3. The method of claim 1, wherein, in the forming of the first level pattern layer, the plurality of first space burying patterns are formed after the plurality of first line patterns has been formed.

4. The method of claim 1, wherein, in the forming of the first level pattern layer, the plurality of first line patterns are formed after the plurality of first space burying patterns has been formed.

5. The method of claim 1, wherein, in the forming of the first level pattern layer, a height of the plurality of first line patterns differs from a height of the plurality of first space burying patterns.

6. The method of claim 5, wherein the forming of the first level pattern layer comprises:
    forming the plurality of first line patterns on the feature layer; and
    forming a first level pattern on the plurality of first line patterns, the first level pattern including the plurality of first space burying patterns,
    wherein the first level pattern is formed to have a height greater than the height of the plurality of first line patterns.

7. The method of claim 5, wherein the forming of the first level pattern layer comprises:
    forming the plurality of first space burying patterns on the feature layer; and
    forming a first level pattern on the plurality of first space burying patterns, the first level pattern including the plurality of first line patterns,
    wherein the first level pattern is formed to have a height greater than the height of the plurality of first space burying patterns.

8. The method of claim 1, wherein, in the forming of the first level pattern layer, the first level pattern layer is formed such that an upper surface of the plurality of first line patterns is coplanar with an upper surface of the plurality of first space burying patterns.

9. The method of claim 1, wherein the plurality of first line patterns are formed of the same material as the second burying film.

10. The method of claim 1, wherein the second direction is a direction intersecting the first direction at an acute angle.

* * * * *